United States Patent [19]

Morrill, Jr. et al.

[11] 4,139,903

[45] Feb. 13, 1979

[54] LOGIC STATE ANALYZER

[75] Inventors: Justin S. Morrill, Jr., Cascade; William A. Farnbach; Charles T. Small, both of Colorado Springs, all of Colo.

[73] Assignee: Hewlett-Packard Company, Palo Alto, Calif.

[21] Appl. No.: 801,891

[22] Filed: May 31, 1977

Related U.S. Application Data

[62] Division of Ser. No. 672,226, Mar. 31, 1976, Pat. No. 4,040,025.

[51] Int. Cl.² ............... G06F 3/14; G01R 13/20; G06F 3/02; G06F 11/00
[52] U.S. Cl. ............... 364/900; 324/121 R; 364/521
[58] Field of Search ... 364/200 MS File, 900 MS File, 364/521, 520, 481, 483, 487; 340/324 A, 324 AD; 324/73 R, 73 AT, 121 R

[56] References Cited

U.S. PATENT DOCUMENTS

| 3,256,516 | 6/1966 | Melia | 340/324 A |
|---|---|---|---|
| 3,293,614 | 12/1966 | Fenimore | 364/900 |
| 3,329,948 | 7/1967 | Halsted | 340/324 A |
| 3,351,929 | 11/1967 | Wagner | 340/324 |
| 3,396,377 | 8/1968 | Strout | 364/900 |
| 3,430,207 | 2/1969 | Davis | 364/900 |
| 3,453,384 | 7/1969 | Dunner | 364/900 |
| 3,497,613 | 2/1970 | Botjer | 364/900 |
| 3,501,746 | 3/1970 | Vosbury | 364/900 |
| 3,534,338 | 10/1970 | Christensen | 364/900 |
| 3,621,214 | 11/1971 | Romney | 364/521 |
| 3,631,457 | 12/1971 | Hamada | 364/900 |
| 3,634,828 | 1/1972 | Myers | 364/206 |
| 3,637,997 | 1/1972 | Petersen | 340/324 |
| 3,648,245 | 3/1972 | Dodds, Jr. | 364/200 |
| 3,648,250 | 3/1972 | Low | 364/900 |
| 3,768,092 | 10/1973 | Dodds, Jr. | 340/324 A |
| 3,786,476 | 1/1974 | Graves | 340/324 A |
| 3,794,831 | 2/1974 | Frankeny | 364/900 |
| 3,899,662 | 8/1975 | Kreeger | 340/324 A |
| 3,909,792 | 9/1975 | Harris | 364/900 |

OTHER PUBLICATIONS

"Generation of Double Size Characters," *IBM Technical Disclosure Bulletin*, C. J. Holderness, vol. 13, No. 9, Feb. 1971, pp. 2792-2793.

*Primary Examiner*—James D. Thomas
*Attorney, Agent, or Firm*—David A. Boone

[57] ABSTRACT

Clock signals, data words and qualifier signals are received via monitor probes during a data acquisition mode, selected data words being stored in a memory in response to the clock and qualifier signals. The stored data words may then be displayed in a tabular or a map format on a cathode ray tube screen. Data words may be acquired randomly, i.e., in a free-running sampling mode, or acquired selectively by using pattern recognition and delay trigger circuits. Using the tabular display format, data words are displayed as ones and zeroes. Using the map display format, each data word thus acquired is displayed on the CRT screen as a dot during a subsequent display mode. The position of each dot on the CRT screen uniquely identifies its address or state value. The most significant bits determine the vertical position on the CRT screen and the least significant bits determine the horizontal position of the dot. The intensity of the dot indicates the relative frequency of occurrence of that logic state. A trace between dots is utilized as a vector to indicate the sequence in which the data words are acquired, the brightened or intensified end of the vector indicating the direction. The vectors are non-linear so that when logic flow occurs in opposite directions between logic states, the vectors will not overlap and obscure useful information. A cursor is provided to select a map area to be displayed in an expanded map mode, wherein a portion of the map may be displayed on a larger scale. Also, a comparator mode is provided to allow comparison of acquired input data with that stored in an auxiliary memory.

7 Claims, 85 Drawing Figures

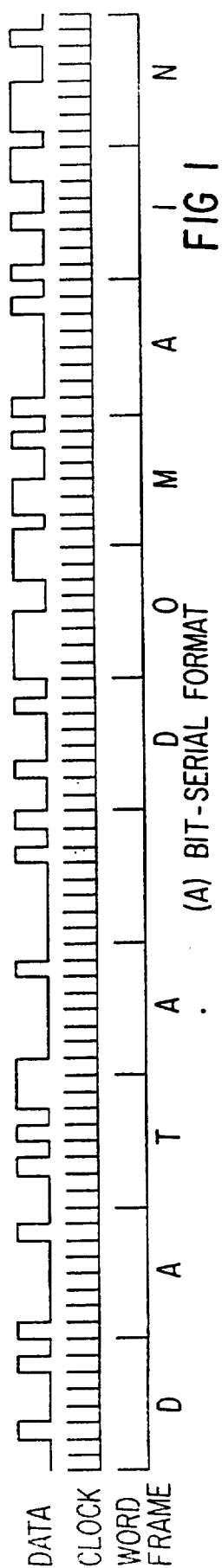
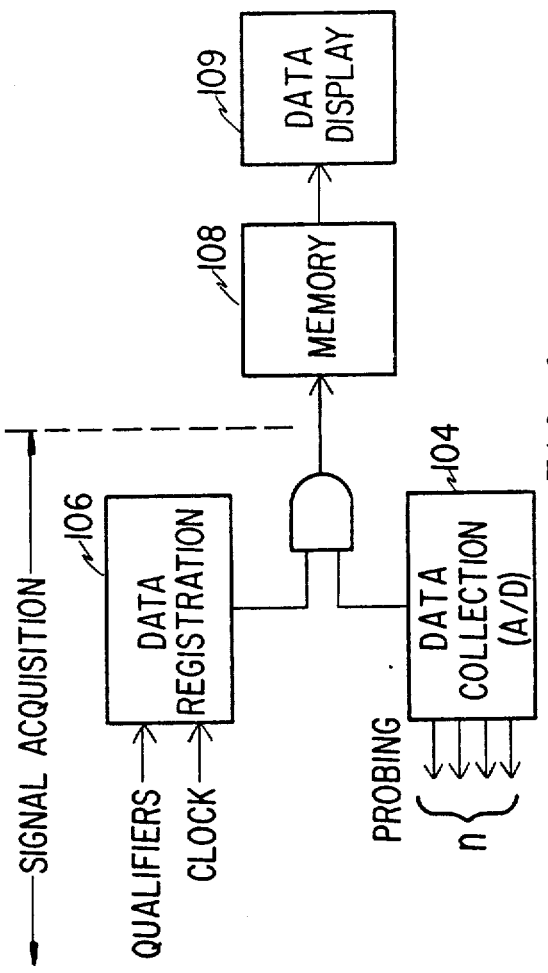
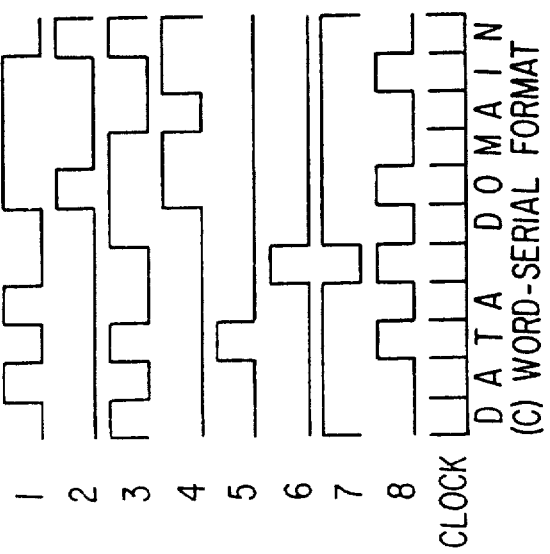
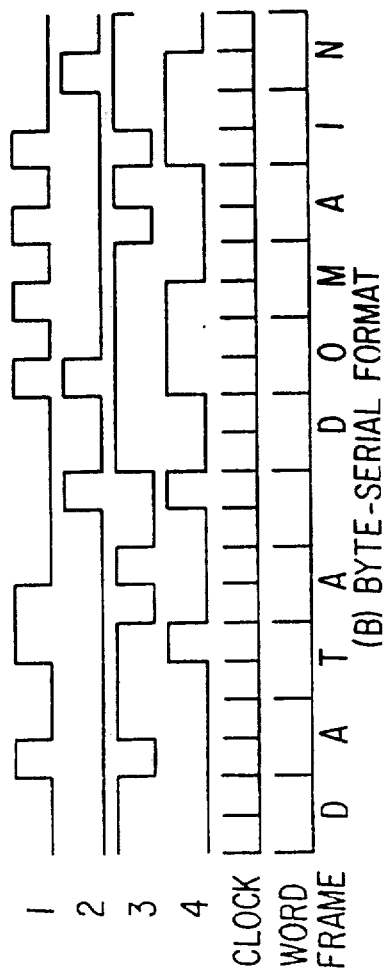

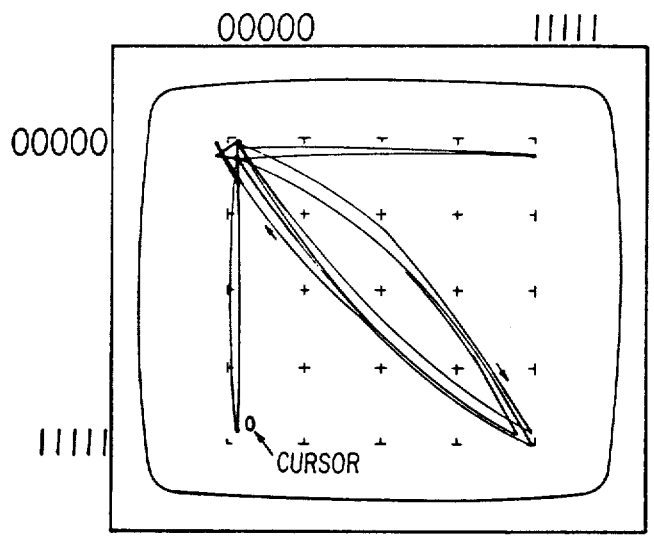
FIG 7
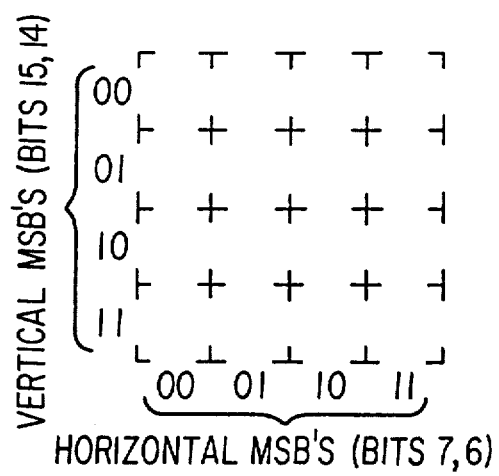
FIG 8
```
0000 0000 0000      000 000 000 000
0000 0001 0000      000 000 010 000
0000 0010 0000      000 000 100 000
0000 0011 0000      000 000 110 000
0000 0100 0000      000 001 000 000
0000 0101 0000      000 001 010 000
0000 0110 0000      000 001 100 000
0000 0111 0000      000 001 110 000
0000 1000 0000      000 010 000 000
0000 1001 0000      000 010 010 000
0000 0000 0000      000 000 000 000
0000 0001 0000      000 000 010 000
0000 0010 0000      000 000 100 000
0000 0011 0000      000 000 110 000
0000 0100 0000      000 001 000 000
0000 0101 0000      000 001 010 000
```
⎵⎵⎵⎵⎵⎵⎵⎵⎵⎵⎵    ⎵⎵⎵⎵⎵⎵⎵⎵⎵⎵⎵
HEXADECIMAL           OCTAL
FIG 9

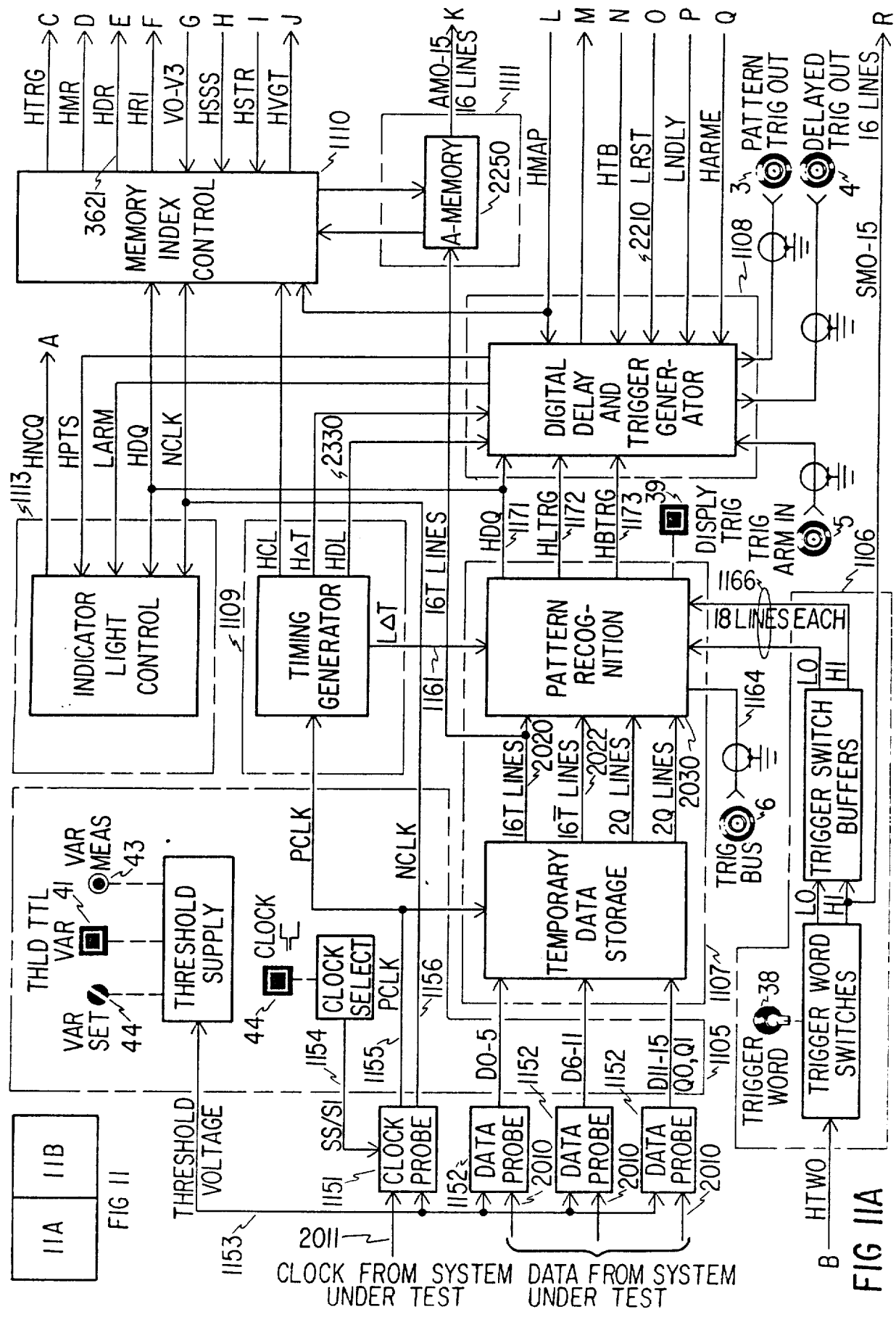

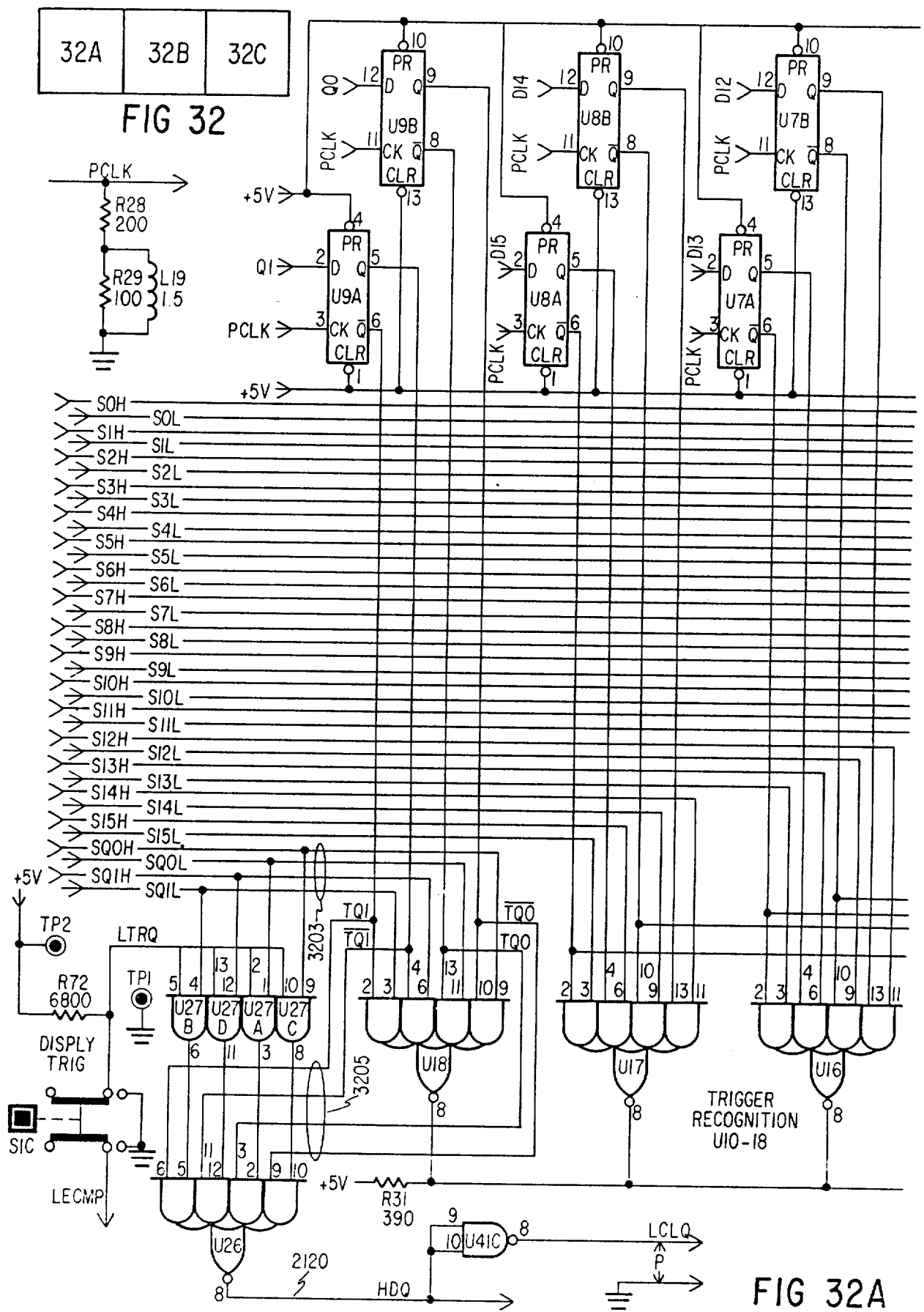

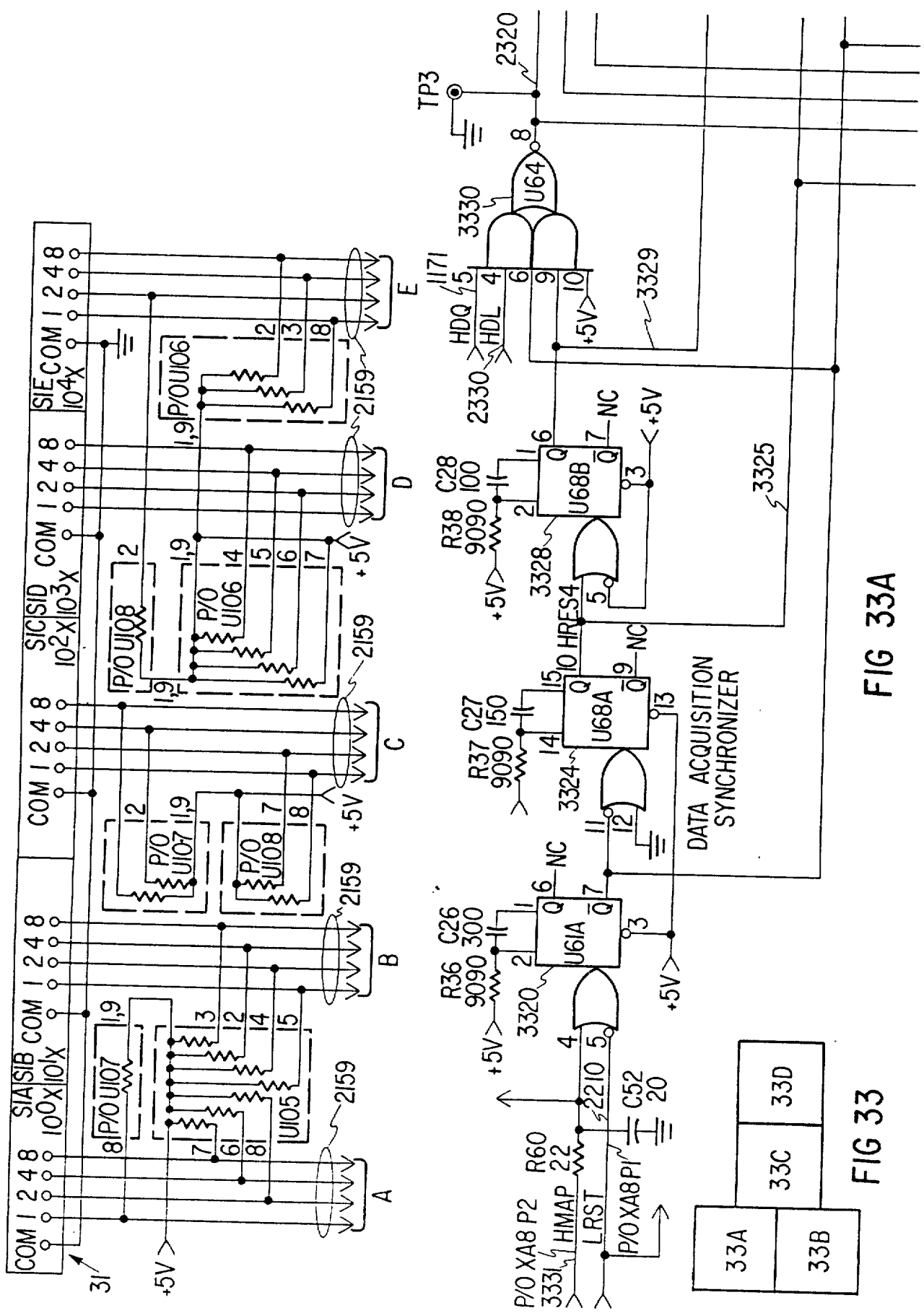

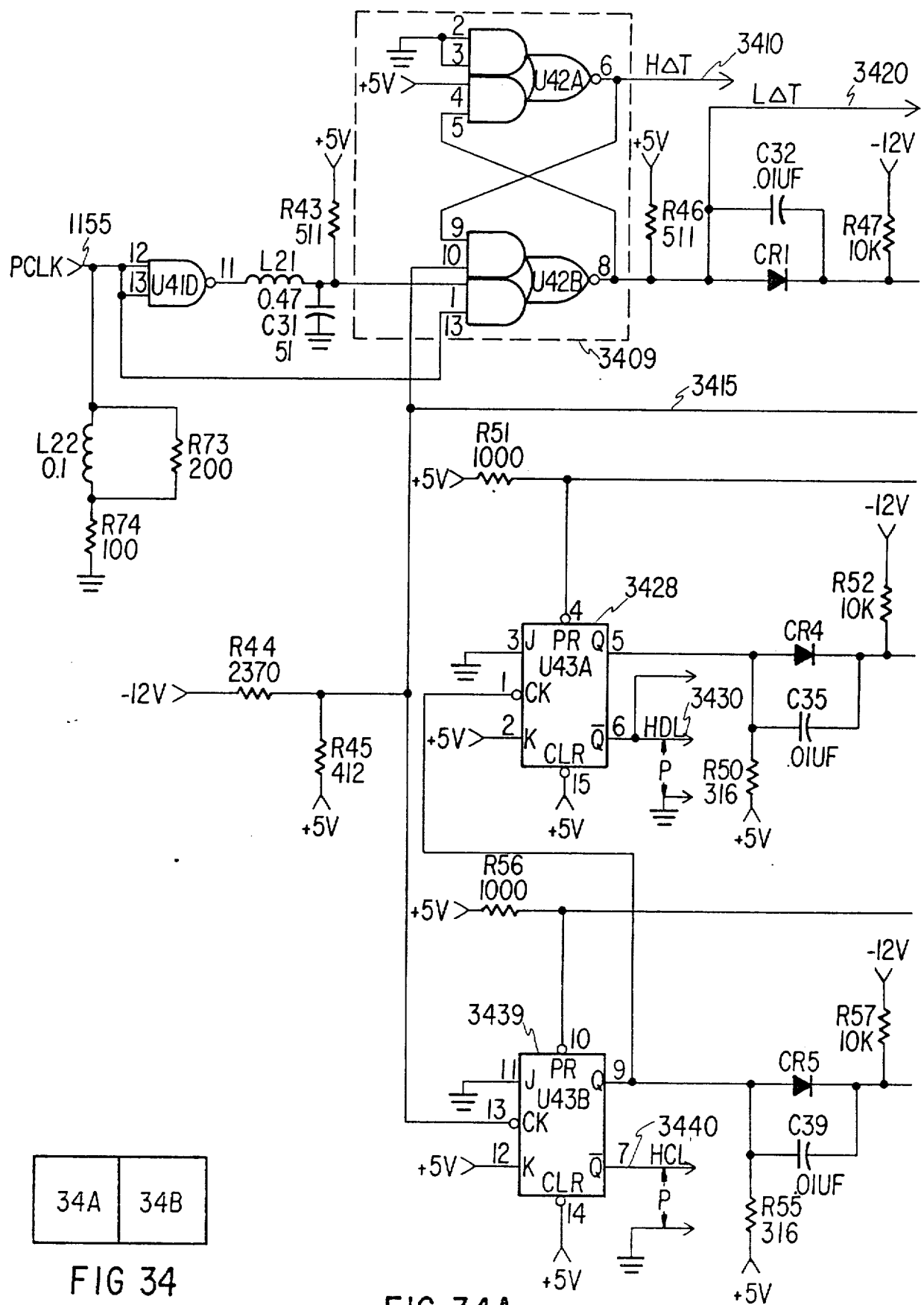

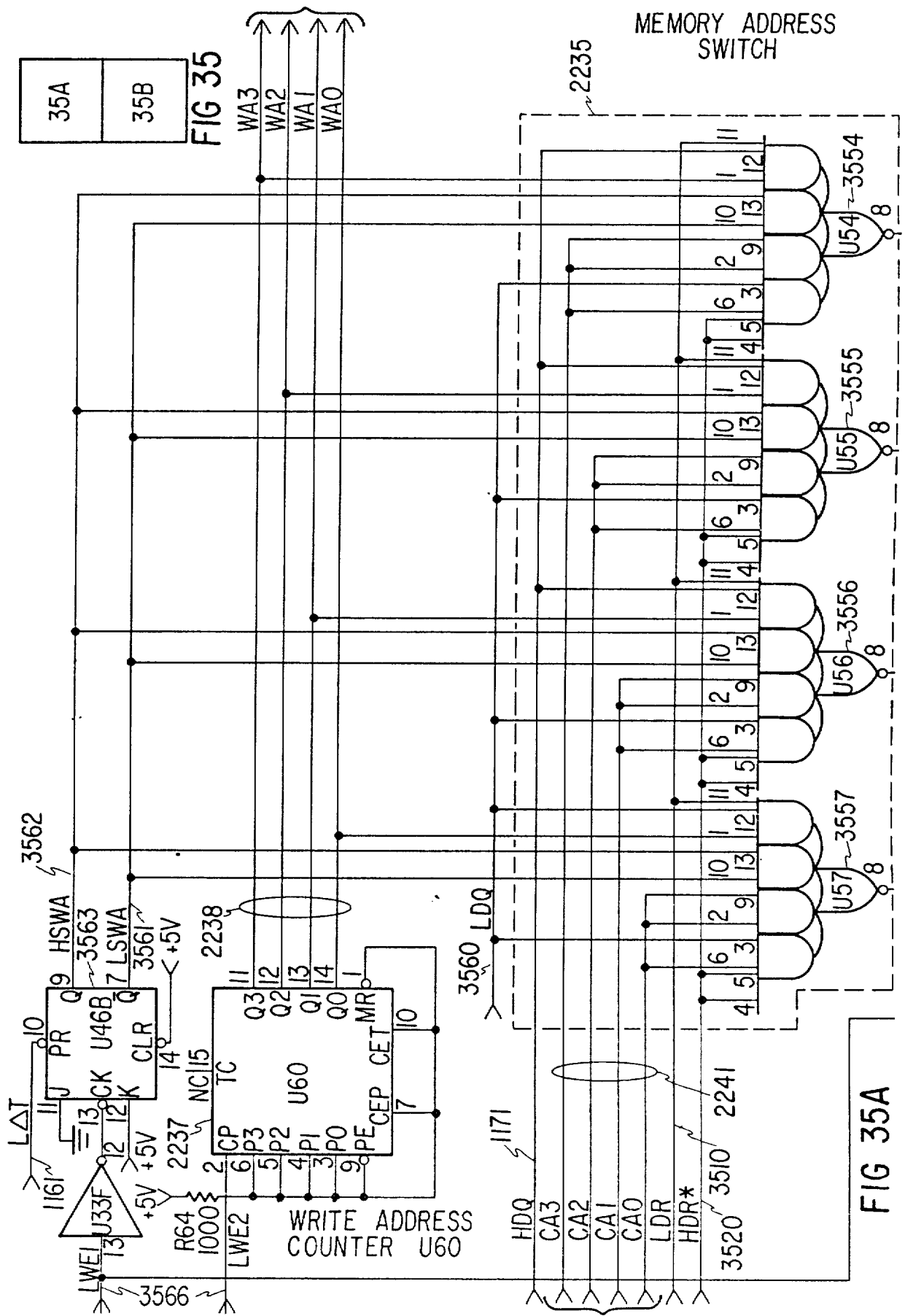

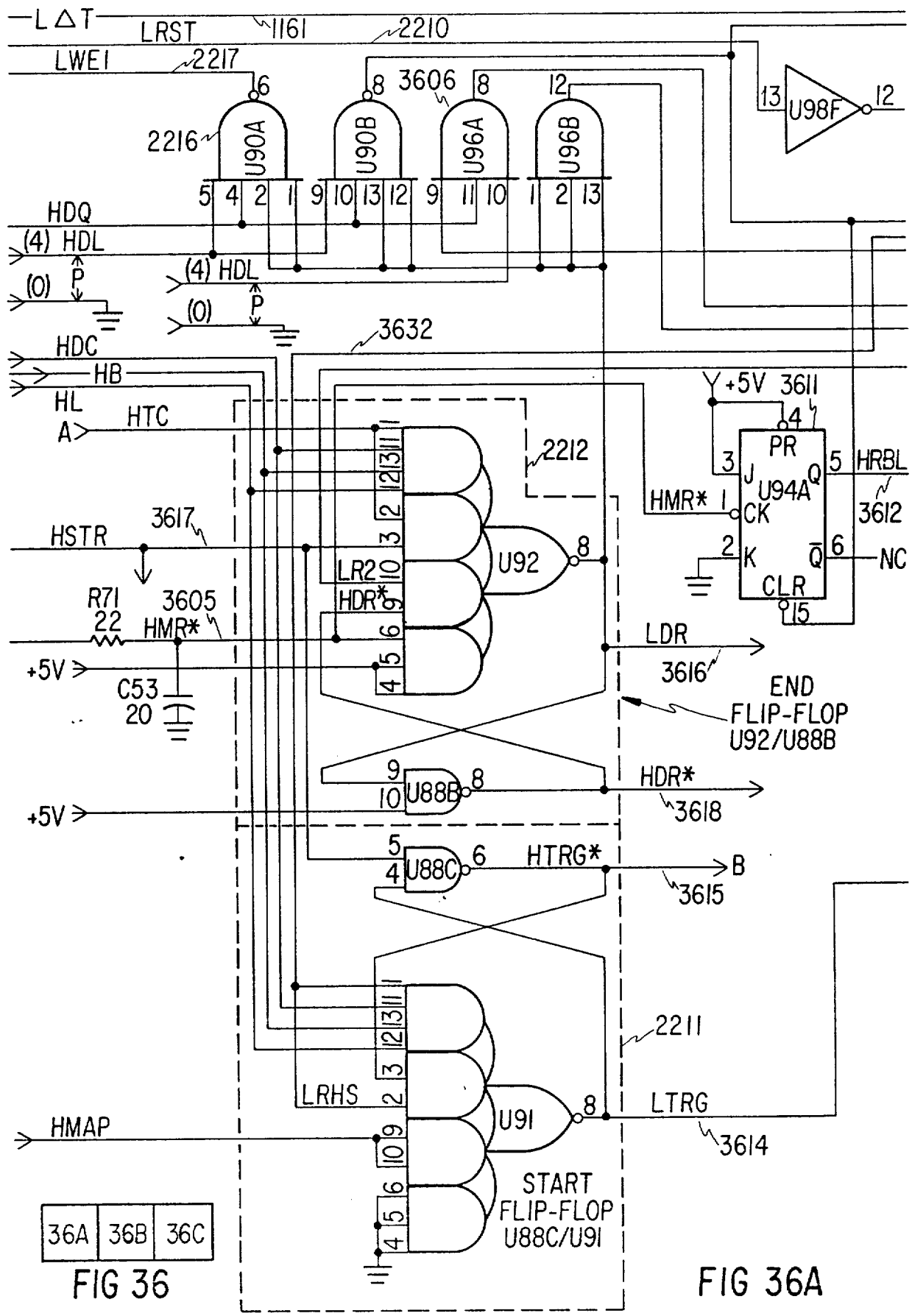

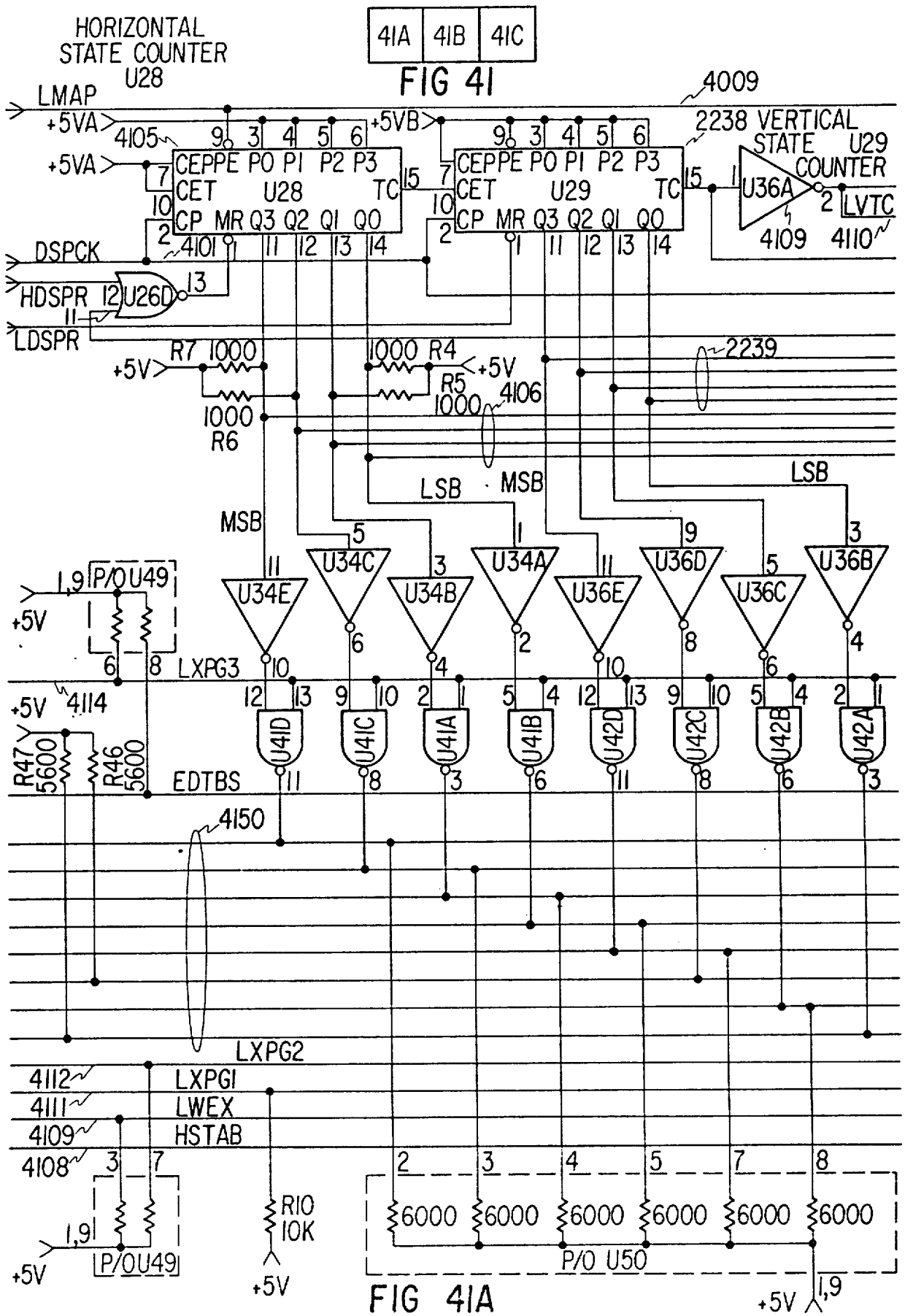

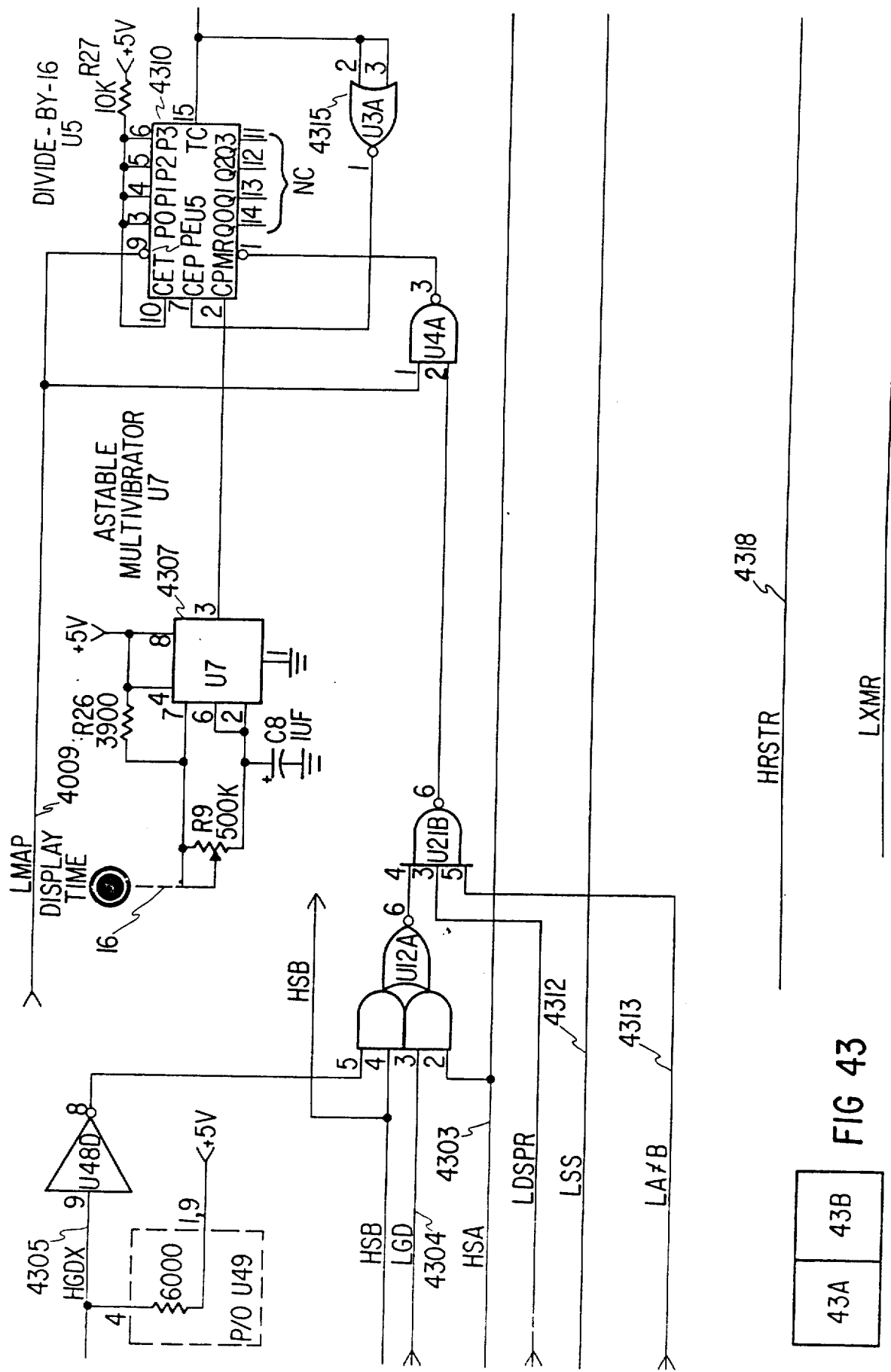

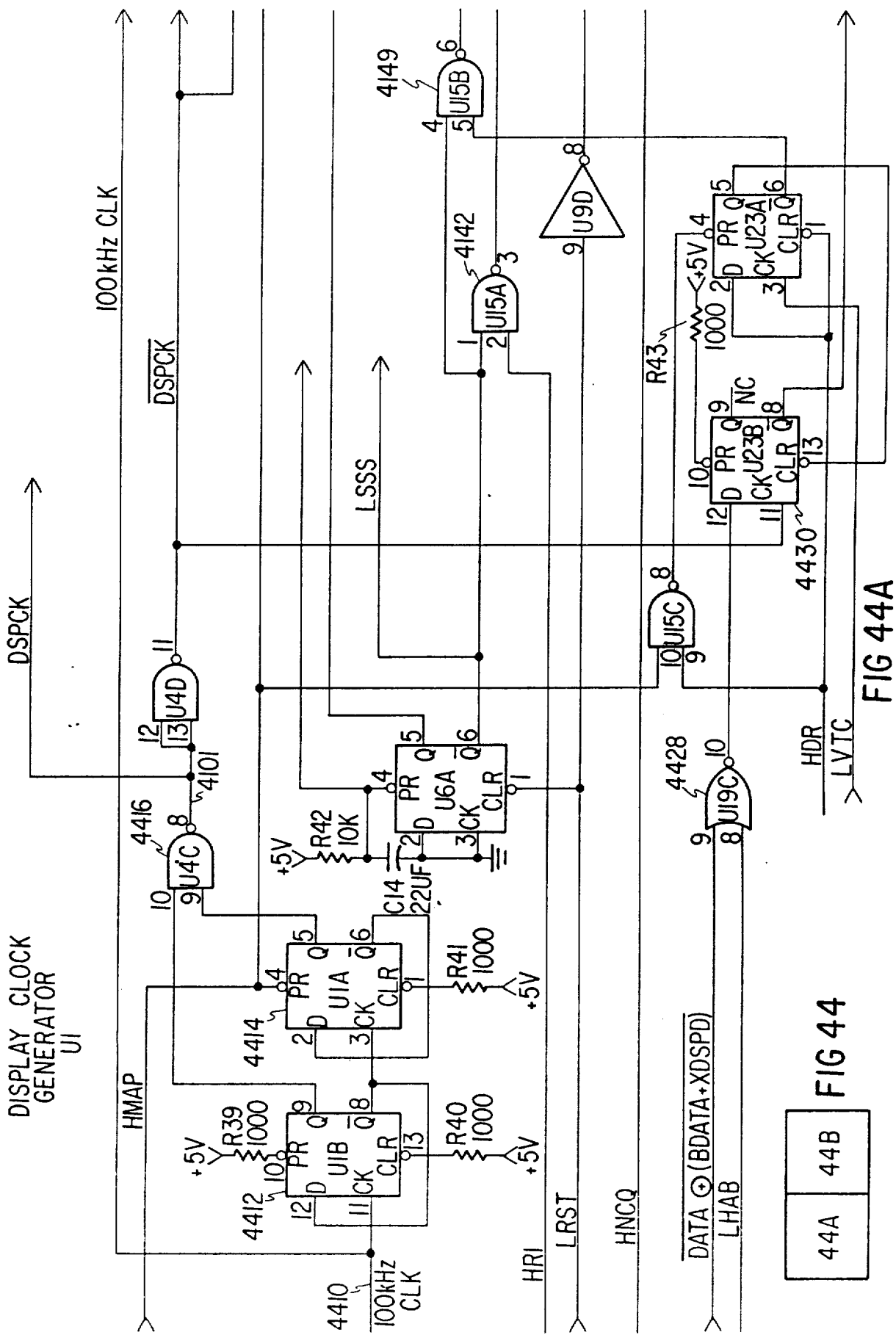

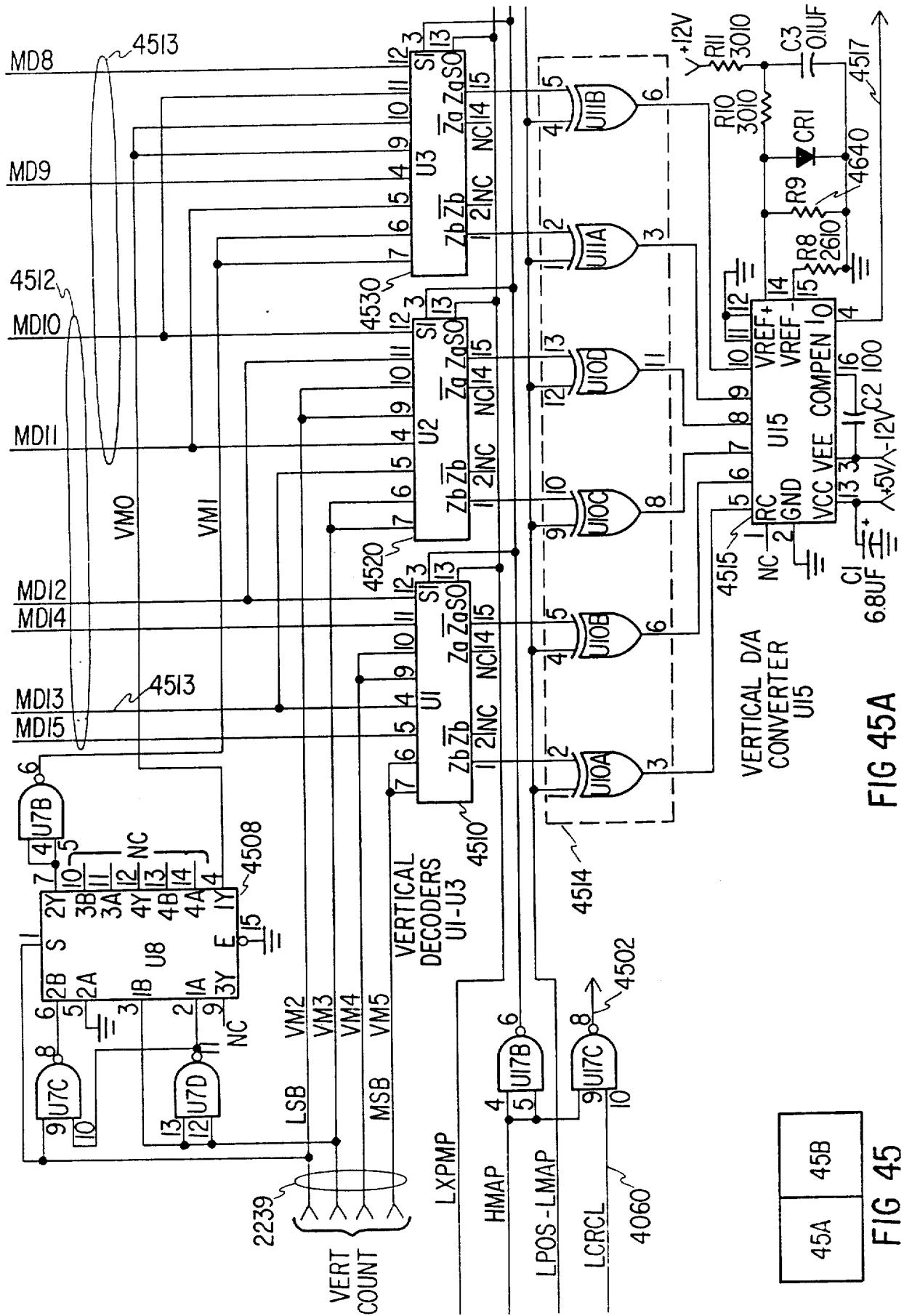

| 46A | 46B |

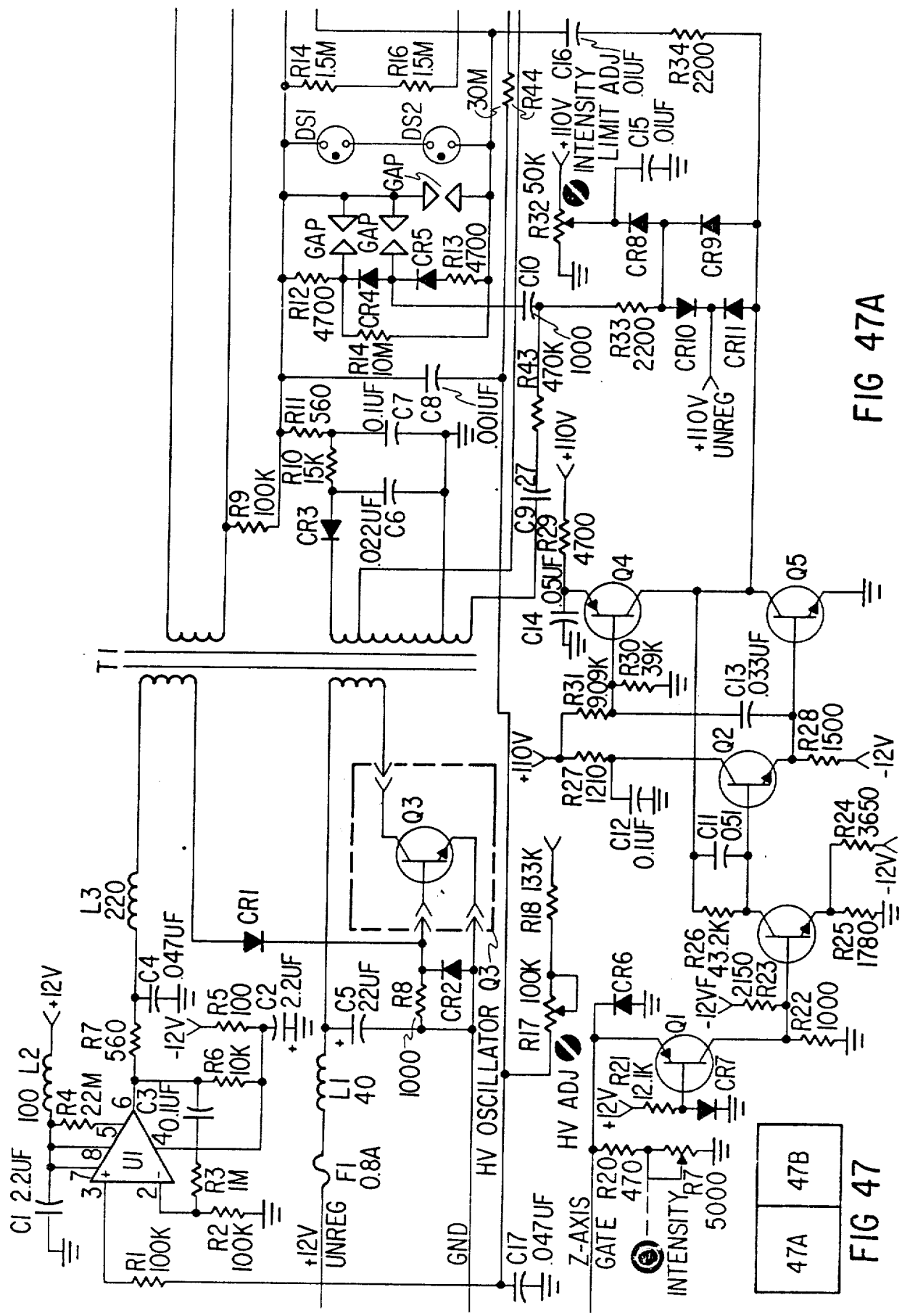

LOGIC STATE ANALYZER

This is a division of application Ser. No. 672,226, filed Mar. 31, 1976, now U.S. Pat. No. 4,040,025.

TABLE OF CONTENTS

Basic Block Diagram
Operating Controls and Indicators
Description of the Detailed Block Diagram
Table I (Cross-Reference of Block Diagram Elements to Detailed Schematics)
Description of Data Input, Temporary Storage and Pattern Recognition Block Diagram
Description of the Digital Delay and Trigger Generator Block Diagram
Trigger Generator and Delay Generator Circuitry
Timing Generator Circuitry
The A Memory and Data Index and Control Circuitry
Display Mode Operation
Word Intensifying Circuitry
Data Routing and Multiplexing Circuitry
Display Blanking Circuitry
Table II (Multiplexer Control Signals)
Data Acquisition Circuitry
Display Generator Circuitry
Display Output Circuitry
Table III (Multiplexer Truth Table)
Table IV (Truth Table for Horizontal and Vertical Decoders)
Table V (Truth Table for the Horizontal ROM)
Appendix A (Description of Signal Mneumonics)

BACKGROUND OF THE INVENTION

Engineers developing digital systems find themselves increasingly more interested in digital word flow than in the waveforms of particular signals. For example, instruction and address sequences in a microprocessor are usually of more interest to the designer and diagnostician than the waveform on a signle address or instruction line.

Some past efforts have been directed towards providing digital instruments which are capable of producing trigger pulses in response to the detection of selected digital words. This trigger pulse can be used to trigger an oscilloscope or other display device. See, for example, U.S. Pat. No. 3,805,255 by C. Mark Baker entitled "Scanning Light Emitting Diode Display of Digital Information." Other recent efforts have provided a listing of sequential binary words. See, for example, the Hewlett-Packard Journal of January 1974.

SUMMARY OF THE INVENTION

In accordance with the preferred embodiment of the present invention, digital words are selectively acquired and then displayed in tabular form or as dots on a state map display. In tabular form, the digital words may be displayed in various selectable groups; the data word used as a trigger word of the group is displayed in a brightened state. When using the map display format, each digital word is displayed as a dot. One half of the word is utilized to determine the X-axis position and the other half of the word is utilized to determine the Y-axis position. The sequence of the digital words thus displayed is shown by a vector drawn between the dots. A cursor is provided to allow selection of a map area to be displayed on an expanded scale. The display also indicates the relative occurrence of a particular digital word. The more often a state repeats, the brighter its dot. Once familiar with the patterns generated by a particular sequence of words, the user can recognize whether or not a particular pattern is correct without having to do a state-by-state study of a tabular listing.

DESCRIPTION OF THE DRAWINGS

FIG. 1 is a timing diagram of digital data in a bit serial format.

FIG. 2 is a timing diagram of digital data in the word serial format.

FIG. 3 is a timing diagram of digital data in the byte serial format.

FIG. 4 is a functional block diagram of a logic analyzer for use in the data domain.

FIG. 7 shows a typical display in accordance with the map format of the preferred embodiment.

FIG. 8 shows the coding used in the preferred embodiment to select a sector of the map display to be displayed in the expanded map display mode.

FIG. 9 shows the groupings selectable in the tabular format mode of the preferred embodiment.

FIG. 11 shows the relationship between FIGS. 11A and 11B.

FIGS. 11A and 11B taken together are a block diagram of a logic state analyzer in accordance with the preferred embodiment.

FIG. 32 shows the relationship of FIGS. 32A, 32B and 32C.

FIGS. 32A, 32B and 32C taken together are a schematic diagram of the temporary storage and pattern recognition circuitry of the preferred embodiment.

FIG. 33 shows the relationship of FIGS. 33A, 33B, 33C and 33D.

FIGS. 33A, 33B, 33C and 33D taken together are a schematic diagram of the digital delay and trigger generation circuitry of the preferred embodiment.

FIG. 36 shows the relationship of FIGS. 36A, 36B and 36C.

FIGS. 36A, 36B and 36C taken together are a schematic diagram of the memory index and control circuitry of the preferred embodiment.

FIG. 41 shows the relationship of FIGS. 41A, 41B and 41C.

FIGS. 41A, 41B and 41C taken together are a schematic diagram of the display state counters and the B memory of the preferred embodiment.

FIG. 42 shows the relationship of FIGS. 42A and 42B.

FIG. 43 shows the relationship of FIGS. 43A and 43B.

FIGS. 43A and 43B taken together are a schematic diagram of the data acquisition reset circuitry of the preferred embodiment.

FIG. 44 shows the relationship of FIGS. 44A and 44B.

FIGS. 44A and 44B taken together are a schematic diagram of the display reset circuitry of the preferred embodiment.

FIG. 45 shows the relationship of FIGS. 45A and 45B.

FIGS. 45A and 45B taken together are a schematic diagram of the horizontal and vertical decoders and their associated digital-to-analog converter circuitry as used in the preferred embodiment.

FIG. 47 shows the relationship of FIGS. 47A and 47B.

FIGS. 47A and 47B taken together are a schematic diagram of the high voltage power supply and gate amplifier of the preferred embodiment.

DESCRIPTION OF THE PREFERRED EMBODIMENT

As digital systems have become more complex, the task of debugging and trouble-shooting these systems has become increasingly burdensome. Presently available test instruments, although suitable for making gross checks for limited analysis, are not designed to handle most failure modes found in digital systems. This is because the equipment commonly used is primarily designed for use in the time domain or the frequency domain. Digital equipment generally operates in an entirely different domain — that of the data domain. Accordingly, test equipment designed to isolate failures within that digital equipment must also operate in the data domain.

Digital pulses in a system are primarily differentiated by the choice of data format, i.e., how the streams of digital pulses are organized and synchronized into meaningful data words. For example, three different representations of the message "data domain" are shown in FIG. 1, FIG. 2 and FIG. 3. FIG. 1 uses a bit serial format; FIG. 2 uses a word serial format; and FIG. 3 uses a byte serial format. Note that, without knowing the mode in use by the system and the relationship of all the signals, any bit becomes indistinguishable from any other bit.

Figures 5, 6:
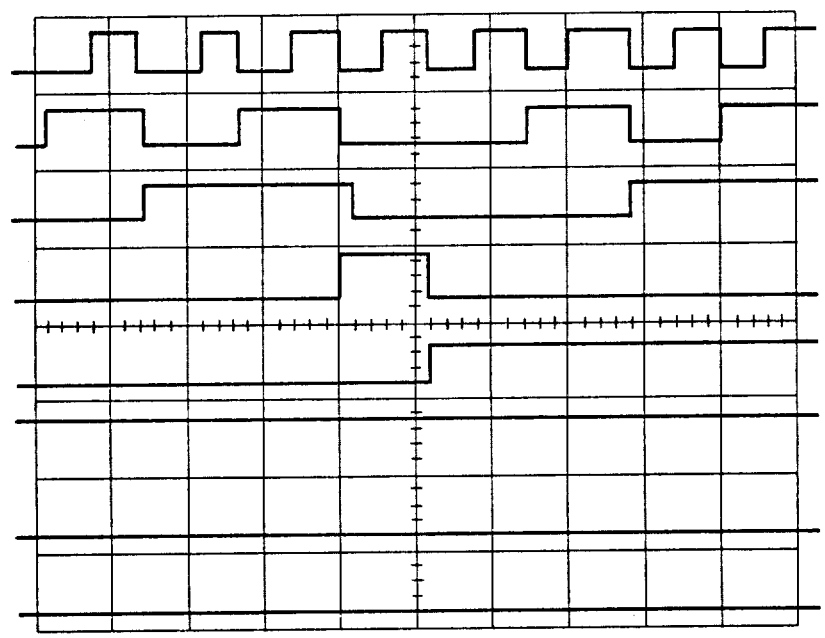
FIG. 5 is a conventional oscilloscope display of timing relationships of digital signals.
FIG. 6 shows a form of the tabular format display of digital information provided by the preferred embodiment.

In addition, note the contrast between the representation of digital data as shown in FIG. 5 and the representation of the same data as shown in FIG. 6. The display shown in FIG. 5 yields more information about the precise timing relationships between signals but the display of FIG. 6 is more informative and more easily read when one is interested in the relative logic states of various signals. In the case shown in FIGS. 5 and 6, the signals are the outputs of a two-decade counter.

BASIC BLOCK DIAGRAM

In FIG. 4 there is shown the basic block diagram of a logic analyzer equipped to operate in the data domain. Such a logic analyzer should have data-collection circuitry 104 for acquiring and digitizing the data signals. It should also have data registration circuitry 106 for controlling the acquisition of the data by monitoring the relevant clock and qualifier signals. In addition, it is desirable to have one or more memories 108 for storing representations of the data for use in a subsequent display operation on a CRT screen or other selected display device 109. These elements represent a framework for a device designed to work in the data domain.

Figure 10:
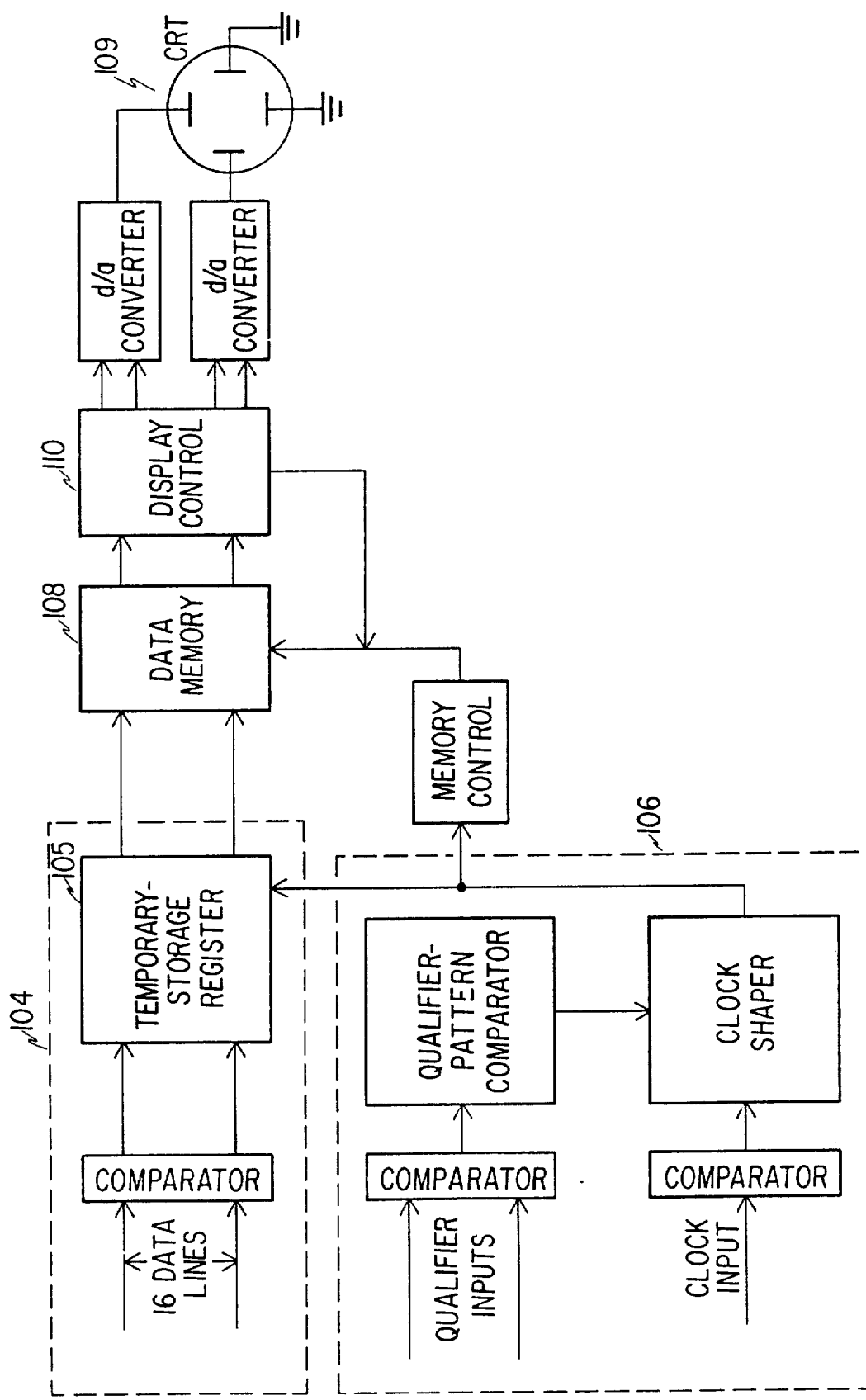
FIG. 10 is a simplified functional block diagram of the circuitry of the preferred embodiment.

A block diagram of a logic analyzer in accordance with the preferred embodiment is shown in FIG. 10. This analyzer includes a number of desirable features, such as a temporary storage register 105 and display control circuitry 110. Using these elements, it is possible to provide formated tabular listings as shown in FIG. 9, digital state map displays as shown in FIG. 8.

Figure 12:
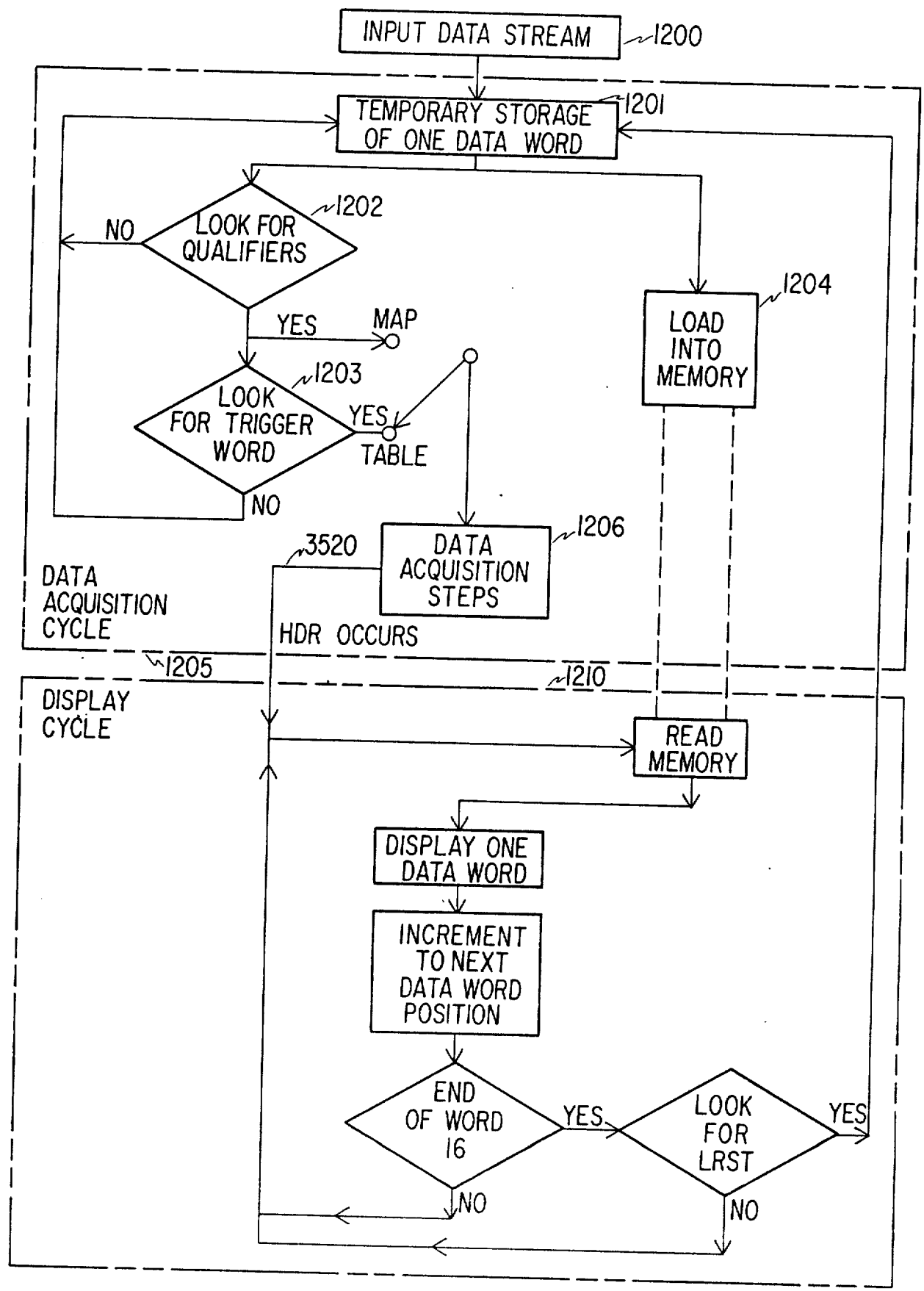
FIG. 12 shows the functional sequence of events performed by the preferred embodiment.

Referring now to FIG. 12, there is shown the basic sequence of functional events performed within the preferred embodiment. During the data-acquisition cycle 1205 words in the input data stream 1200 are put in temporary storage register 1201. In the tabular display mode, if both qualifier and trigger word conditions are met, the word is loaded into memory 1204. In the state map mode, the digital word is loaded into memory 1204 whenever qualifier conditions 1202 are met.

Data words are acquired and loaded into memory until a predetermined number of data words have been stored therein. When the predetermined number has been reached, and the data acquisition steps 1206 have been completed, a signal HDR is generated. The generation of this signal transfers the preferred embodiment from the data acquisition mode to the display mode. The data words are read from memory 1204 one at a time and displayed until the last word has been displayed. Since the memory of the preferred embodiment has storage capacity for only 16 words, the display cycle is completed when the sixteenth word is displayed. After displaying the sixteenth word, operator settings are interrogated to see if the data should be displayed again or if new data should be acquired for the subsequent display cycle. If new data is to be acquired, the complete data acquisition cycle will be repeated.

OPERATING CONTROLS AND INDICATORS

Before proceeding further with the description of the circuitry in the preferred embodiment, an explanation of the operating controls and the indicators used in the preferred embodiment will be provided. Clock inputs to the preferred embodiment are received via a connector 1. Qualifier inputs are supplied via monitor probes coupled to a connector 7. Data inputs are received via connectors 2. Monitor probes comprising connecting devices, input threshold circuitry, buffer amplifiers, and comparator circuitry are coupled to connectors 1, 2 and 7, as more fully described later. A test point 43 is provided for monitoring the threshold set by a threshold adjustment 42. Threshold adjustment 42 allows the monitor probe input threshold levels to be adjusted over a range of plus and minus 10 volts whenever a control switch 41 is in the variable position. When control switch 41 is placed in the TTL position, the input threshold level of the monitor probes coupled to clock connector 1, qualifier connector 7 and data input connector 2 is automatically set to +1.5 volts. A clock transition control 44 allows selection of the positive or negative clock transition for triggering the preferred embodiment. The out position selects the positive going transition for triggering, while the in position selects the negative going transition for triggering.

When a display trigger switch 39 is in the display position, i.e., the out position, the preferred embodiment is prohibited from displaying data or generating a trigger unless the conditions set by switches 40 are true when the clock transition selected by switch 44 occurs.

When switch 39 is in the trigger position, the preferred embodiment is prohibited from generating a trigger unless the condition set by switches 40 are simultaneously satisfied. When used in conjunction with trigger switches 38, the trigger word in essence is 18 bits in length. However, the two additional bits represented by the setting of switches 40 are not displayed.

Several display controls allow the operator to select the most usable display for his immediate application. In table display modes, selected by control switches 21, 22, 23 and 24, the preferred embodiment displays ones and zeroes in one or two tables, consisting of sixteen bit words each. Table A, displayed on the left half of the CRT screen, is a display of data which has been acquired and stored in the A memory. Table B, which is displayed on the right half of the CRT screen, is a display of B memory data. B memory is loaded with the data contained in the A memory by the activation of a store A in B switch 20. Since the store A to B switch 20 duplicates the contents of A memory in B memory, this feature allows Table B to be used as a reference field and enables analysis on a comparison basis. Both Table A and Table B, i.e., the contents of A memory and B memory, are displayed in response to the activation of control switch 22.

When switch 23 is selected, Table A is displayed on the left half of the screen and the bit-by-bit exclusive OR or A memory with B memory is displayed on the right half of the screen. Bit differences are displayed as intensified ones, and bit correlations are displayed as zeroes.

A partial display mode permits display of less than 16 words and allows the viewing of data as it is acquired into the preferred embodiment. The preferred embodiment automatically enters the partial display mode when the display qualified clock rate is less than approximately thirty bits per second. A slow display qualified clock rate can be caused by a low-frequency clock signal or a high-frequency clock signal which infrequently coincides with the occurrence of the qualifier conditions indicated by switches 40 in the partial display mode. Data words are displayed in the CRT as they are received, not waiting until a complete 16-word data block is in the memory.

In table display modes, a preset trigger word determined by the setting of trigger word switches 38 controls the reference of the 16-word display window to the input data stream. Depending on the trigger mode selected, the display starts at the trigger word, or ends at the trigger word, or is delayed up to 99,999 input clock pulses after the trigger word. The delay is determined by presetting the desired number of input clock pulses into delay switches 31. When start display switch 33 is activated, the preset value in switches 31 determines the number of display qualified clock pulses the first displayed word is delayed from the trigger word. When end display switch 34 is activated, the value set in switches 31 sets the number of display qualified clock pulses the last displayed word is delayed from the trigger word. In either the map display or table display modes, switches 31 set the number of display qualified clock pulses a signal from delayed trigger output 4 is delayed from the trigger word. Switch 32 is used to turn the delay generator circuitry on and off. The off position has the same effect as setting all the thumb wheels in switches 31 to zero.

When switch 33 is selected, the trigger word as determined by switches 38 is the first, that is, top displayed word and the next fifteen display qualified input clocks will cause the entering of the fifteen following words in memory. When switch 34 is selected, the trigger word, as indicated by switches 38, is the last or bottom word displayed with the preceding fifteen qualified words displayed above it.

Trigger word recognition can be further conditioned upon the prior presence of a positive going transition on a signal received through a trigger arm input 5. This mode is selected by activating switch 35, i.e., placing switch 35 in the arm position. In the norm position, a trigger will be produced any time trigger word and qualifier conditions are met and the arm signal will have no effect.

Switch 36 is used to condition the triggering of the circuitry of the preferred embodiment upon the presence of a simultaneous trigger condition in another instrument. This simultaneous trigger condition is detected via the trigger bus input 6. When switch 36 is in the bus position, a trigger is generated only when the incoming data on both bussed instruments match the settings of their combined trigger word switches. However, when a trigger bus cable is not connected, the preferred embodiment functions in the local mode regardless of the switch setting. In the local mode position of switch 36, a trigger will be produced whenever the incoming data meets the trigger requirements regardless of the status of other instruments on the trigger bus. The use of the trigger bus is discussed in more detail later and in the co-pending patent application by William A. Farnbach, and Charles T. Small entitled "Synchronization of Digital Circuits by Bus Triggering" filed on Apr. 30, 1975, Ser. No. 573,298.

In the table display mode, switch 37 will disable trigger word switches 38 when placed in the off position. This effect is equivalent to placing all the trigger word switches in the off position. Switch 37 has other effects when operating in the map display mode, as described later.

Various control enable the operator to select the most usable display for his application. Display time control 16 determines the length of time a given 16-word data block is displayed on the CRT before being updated by new input data. In the preferred embodiment, this time between data block updates can be set from approximately 200 milliseconds to approximately 5 seconds. Display time control 16 is particularly useful in reducing display flicker at low data acquisition rates.

Column blanking control 17 is adjusted by the operator to eliminate unused vertical columns on the display. In the preferred embodiment, blanking begins with the most significant bit column. The least significant bit column cannot be blanked. Blanking is particularly useful when monitoring a series of data words having less than 16 bits. The unused vertical columns can be removed from the display by adjustment of column-blanking control 17.

Logic selection switch 18 allows selection of the use of either negative-logic or positive-logic conventions. When in the positive-logic position, the most positive input voltage levels are displayed as ones, and the most negative level signals are displayed as zeroes. When placed in the negative-logic position, the most negative input level is displayed as a one, and the most positive level is displayed as a zero.

Byte-formating switch 19 controls the grouping of the display data in either three-bit or four-bit groups. This feature provides a greater degree of readability of the displayed data. In the four-bit position, display data is arranged in four-bit bytes, thereby facilitating interpretation of the data as BCD or hexidecimal numbers. In the three-bit position, display data is arranged into three-bit bytes. This display feature facilitates interpretation of the data as octal numbers.

Various sample modes may be selected by the operator through the use of switches 27, 28, 29 and 30. When the repetitive sample mode is selected by activating switch 27, display data is periodically updated approximately every 200 milliseconds to 5 seconds, depending on the setting of display time control 16. If the single-shot sampling mode is selected by the activation of switch 29, new data is not displayed until the reset button 30 is pushed; then new data is acquired and displayed until reset button 30 is again activated.

The halt-A-is-not-equal-to-B sample mode may be selected by activation of switch 28. In this mode, data is repetitively acquired and displayed as long as the data in A memory remains the same as the data in B memory. Whenever the data stored in A memory differs from the data stored in B memory, the preferred embodiment locks in a display cycle. The acquired data is then displayed until reset by activation of switch 30. This sampling mode frees the operator from watching for infrequent or intermittent logic sequence errors.

The map display mode provides an overview of A memory with data words being displayed as dots on the CRT screen. All possible states in a 16-bit machine (65,536 states) can be displayed in the map mode. In this mode, data is acquired randomly, i.e., in a free-running sampling mode or the pattern and delayed trigger outputs may be used in the same way as they are in the tabular display modes. As mentioned previously, the display qualifier mode can be selected by positioning switch 39 in the display position. Using this switch, the display of data is dependent on the qualifier conditions set in switches 40.

In the map display mode, the position of each dot on the CRT screen uniquely identifies its address or state value. In the preferred embodiment, the eight most significant bits of a sixteen-bit word determine the vertical position of its representative dot on the CRT screen. The eight least significant bits of the sixteen-bit word determine the horizontal position of its representative dot. The all-zero state is displayed in the upper left corner of the CRT screen, and the all-one state is displayed in the lower right corner of the CRT screen, assuming the use of a positive logic system.

The intensity of a dot indicates the relative frequency of occurrence of that logic state. A vector is traced between dots to indicate the direction of logic flow in the machine. The brightened or intensified end of the vector indicates the direction of the vector. The vectors are produced in a non-linear fashion so that when logic flow occurs in opposite directions between two logic states, the vectors will not overlap and obscure useful information.

The normal map display mode is selected by switch 25. In the normal mode, the six most significant vertical bits, bits 15 through 10, and the six most significant horizontal bits, bits 7 through 2, of a data word are mapped on the CRT. In expand mode, selected by switch 26, the sector of the normal map display selected by the two most significant vertical bits, bits 15 and 14, and the two most significant horizontal bits, bits 7 and 6, is expanded to full screen. The six least significant vertical bits, bits 13 through 8, and the six least significant horizontal bits, bits 5 through 0, of the input data words are mapped on the display in expand mode. Hence, expand mode provides a magnification of the expanded normal map sector.

In the map mode, trigger word switches 38 control the location of a cursor which is a circle displayed on the CRT screen. In the normal map mode, selected by switch 25, the cursor is used to select one of the sixteen sectors to be expanded when the expand mode is selected by switch 26. The trigger word switches 38 for bits 15 and 14 control vertical sector selection, while the switches for bits 7 and 6 control horizontal sector selection, as shown in FIG. 8.

In expand mode, the cursor can be used to select a specific state to be the trigger word in a table display. The cursor is positioned about a single dot on the map display by using the six least significant vertical and the six least significant horizontal bits of the trigger word selected by switches 38.

When the cursor is positioned about the dot, the setting on switches 38 gives the address or state of the selected dot. The user may then select one of the tabular display modes and use the logic state selected by the cursor as the trigger word. The operator may also use any of the triggering options selectable by switches 32 through 37, as described above.

While in the map display mode, placing switch 37 in the off position will remove the cursor from the CRT screen, and only the upper left sector (switch 18 in the positive position) or the lower right sector (switch 18 in the negative position) of the map may be expanded. In the map display mode, switch 37 has no effects on qualifier inputs as selected by switch 40. Note that the off position of switches 38 is interpreted as a low or zero selection when in the map display mode.

Various indicators are provided to aid the operator in determining the operating status of the logic state analyzer. A no-arm indicator 9 is illuminated when the logic state analyzer has remained unarmed for more than approximately 0.1 seconds. A no-clock indicator 10 is illuminated when the logic state analyzer has not received a clock for more than approximately 0.1 seconds. A no-qualifier indicator 10 is illuminated when the logic state analyzer has not received a display qualifier condition for more than approximately 0.1 seconds. This indicator is disabled when switch 39 is in the trigger position and when the no-clock indicator is illuminated. The no-trigger indicator is illuminated when the logic state analyzer has not received a trigger for more than approximately 0.1 seconds. This indicator is disabled if either the no-arm indicator 9, the no-clock indicator 10, or the no-qualifier indicator 11 is lit. This selective disabling of the indicators allows the operator to see which one of the display conditions has not been satisfied. If a condition precedent is not satisfied, the subsequent condition indicators are not enabled.

For example, if no arming signal has been received via connector 5, and/or no clock signal has been received via clock input connector 1, it would be impossible for a qualifier condition or a trigger condition to have been met. Hence, these indicators are not enabled or illuminated. Similarly, if no qualifier condition has been met, it will be impossible to have a trigger condition since no data capable of triggering the logic state analyzer has been received. Therefore, these indicators show the operator which requirement for producing a display has not been met, without creating confusion by lighting the indicators for subsequent display conditions which could not be satisfied. In addition to the above, a data held indicator is illuminated to show that the data displayed has been displayed for more than approximately 0.3 seconds without being updated. Of course, all the times mentioned above may be varied to suit a particular application or operator preference.

In summary, the following steps and options are available to the operator in using the logic state analyzer of the preferred embodiment. Clock data and qualifier monitor probes are connected to the circuitry under test. These signals are then coupled to the logic state analyzer via input connectors 1, 2 and 7. Switch 44 is then placed in a position for the desired edge triggering and threshold switch 41 is adjusted for the desired threshold level. In addition, display time control 16 and column blanking control are adjusted to the full counterclockwise position.

The operator then selects the desired display mode. If switch 21 is activated, a tabular display of the contents of A memory alone will be displayed on the left side of the CRT screen. Selection of switch 22 will provide a tabular display of both the A memory and the B memory. Activation of switch 23 will cause the A memory data to be displayed on the left side of the CRT screen, and the bit-by-bit exclusive OR-ing of A and B memory data on the right side of the CRT screen. The differences between the A and B memory contents are displayed as intensified ones in the right side display. Activation of switch 24 will provide a display of the contents of B memory on the right-hand side of the CRT screen with the A memory display being blanked.

The map display modes are selected by switches 25 and 26. Activation of switch 25 will cause the incoming data to be displayed in the normal map mode, i.e., the six most significant vertical bits, bits 15 through 10, and the six most significant horizontal bits, bits 7 through 2, of the A memory contents are displayed in map format. Activation of map expansion switch 26 may also be used to cause the display of data previously stored in the A memory to be displayed in map format.

Also, the expanded map mode may be selected to display 1/16th of the normal map display. The portion selected by the two most significant bits of the vertical axis, bits 15 and 14, and the two most significant bits of the horizontal axis, bits 7 and 6, is expanded to a full screen display. In expand mode, the six least significant vertical and the six least significant horizontal bits are used to determine the map address for the data.

The operator selects a sample mode by activating switch 27, switch 28, or switch 29. Activating switch 27 will cause the display to be reset repetitively at a rate set by display time control 16, new data being acquired and displayed each time the system or circuitry being monitored meets the triggering requirements (i.e., when the input data word received via connector 2 matches the selected trigger word in switches 38) and the clock input received via connector 1 and the qualifier conditions received via connector 7 agree with the conditions preset by switches 41, 44, 39 and 40.

Alternatively, when the halt, if A = B mode, is selected by activating switch 28, the logic state analyzer of the preferred embodiment will operate in the repetitive mode until a difference is detected between data being acquired and stored in Table A and the data previously acquired and stored in Table B.

Also, the single sample mode may be selected by activating switch 29. This causes the logic state analyzer to acquire and display only one sixteen-work block of data. Reset button 30 must be pressed before the logic state analyzer will continue. Of course, reset button 30 may be activated at any time during any of the above sample modes to cause the logic state analyzer to return to the beginning of a data acquisition cycle.

Next, the user should select a triggering mode by setting switches 31 through 37 to the desired state. Delay switches 31 should be set to the number of clock pulses the display operation and the signal output from connector 4 are to be delayed from the receipt of the selected trigger word. Activation of start display switch 33 will cause the display to have a triggering word positioned at the top of the display, followed by the subsequent 15 input data words if delay = $\phi$. Activation of end display switch 34 will cause the trigger word to be positioned at the bottom of the display with the preceding 15 input data words displayed above it if delay = $\phi$. If no delay is desired, the delay switches 31 may all be rotated to the zero position or delay control switch 32 may be turned to the off position.

If a trigger word is to be used, the trigger word must be set into trigger-word switches 38. Word-control switch 37 must also be activated. If word-control switch 37 is in the off position, all the trigger-word switches 38 are effectively placed in the off or "don't care" position. In the map display mode, the off position of word-control switch 37 removes the cursor from the CRT and allows only the upper left corner or lower right corner sector to be expanded, depending on the setting of logic switch 18.

Triggering may also be made dependent on the presence of an arm signal received via connector 5. If arm-control switch 35 is placed in the normal position, the trigger generator will produce a trigger whenever the trigger word and qualifier conditions are met. When arm-control switch 35 is placed in the arm position, the trigger generator will be inhibited from producing a trigger until it has been armed by a positive going transition of the signal received via the trigger arm input connector 5.

If it is desired to synchronize the logic state analyzer with another instrument, triggering can be conditioned on the presence of a simultaneous trigger condition in that instrument, as represented by a signal received via trigger bus connector 6. To use the trigger bus, local/bus control switch 36 must be placed in the bus position. In the local position, the trigger bus is ignored and the trigger circuitry will produce a trigger any time the other selected trigger conditions occur.

If word-control switch 37 has been positioned in the on position to enable the trigger word switches, a trigger word must be set in trigger word switches 38. In the table display mode, the switches are set to match the required triggering word of the input data stream. The switches are set to the high position to recognize a positive logic state, to the low position to recognize a negative logic state, or to the off position for a "don't care" or "not required" input condition. In the map display mode, the trigger word switches 38 are used to locate the cursor about a word of interest. The switches for bits 15, 14, 7 and 6 are also used to select one of the sixteen sectors to be displayed in the map expand mode.

After the trigger-word switches 38 have been set or if trigger-word control switch 37 has been positioned in the off position, the qualifier mode should be selected. Qualifier-control switch 39 will cause the data to be selectively displayed when the two-bit qualifier condition is met. For the setting of qualifier-condition switches 40, the incoming data will be ignored if the display qualifier conditions are not met. If qualifier-control switch 39 is placed in the trigger position, the qualifier signals received via qualifier connector 7 are treated as external synchronous trigger signals or they may be used to expand the length of the trigger recognition word represented by switches 38 by additional two bits.

The operator then selects the display features desired for his immediate application. Display time control 16 is set for the maximum tolerable flicker rate of the display. Column blanking control 17 is adjusted to blank out any unused vertical columns. Logic control switch 18 may be set to the positive position to cause the most positive input logic level to be displayed as a one, or set to the negative position to cause the most negative input logic level to be displayed as a one. Format control switch 19 may be placed in either the four-bit position to faciliate reading of the display data as hexadecimal or BDC words or it may be put in the three-bit position to facilitate reading the data as octal words.

In addition, store A to B control switch 20 causes the contents of the A memory to be loaded into the B memory. This switch only functions when the A memory is displayed as a table. It has no effect in the map display mode. The following paragraphs explain the logic conventions that are used in describing the preferred embodiment.

The terms "high" and "low" describe the output states of logic circuit elements. High indicates the most positive D.C. level and low indicates the most negative level produced by a given circuit element. Most integrated circuits in the preferred embodiment are from the TTL (transistor transistor logic) or CMOS) complementary metal oxide semiconductor) families of digital devices. A low output from a TTL device is typically less than 0.4 volts, and a high output is greater than or equal to +2.5 volts. A low output from a CMOS device is approximately 0 volts and a high output is approximately +5 volts.

Mneumonics are used to describe the active state and functions of signals in the preferred embodiment. A prefix letter indicates the active state of the signal and the remaining letters indicate its function. An "H" prefix indicates the function is active in the high state. An "L" prefix indicates the function is active in the low state. To facilitate the understanding of circuits responsive to a signal edge, the prefix "P" indicates the function is active on the positive going transition, and the prefix "N" indicates the function is active on the negative going transition. Complete mneumonic functional definitions of the reference and the relevant schematics are listed alphabetically in a mneumonic table in Appendix A.

DESCRIPTION OF THE DETAILED BLOCK DIAGRAM

Figure 11B:
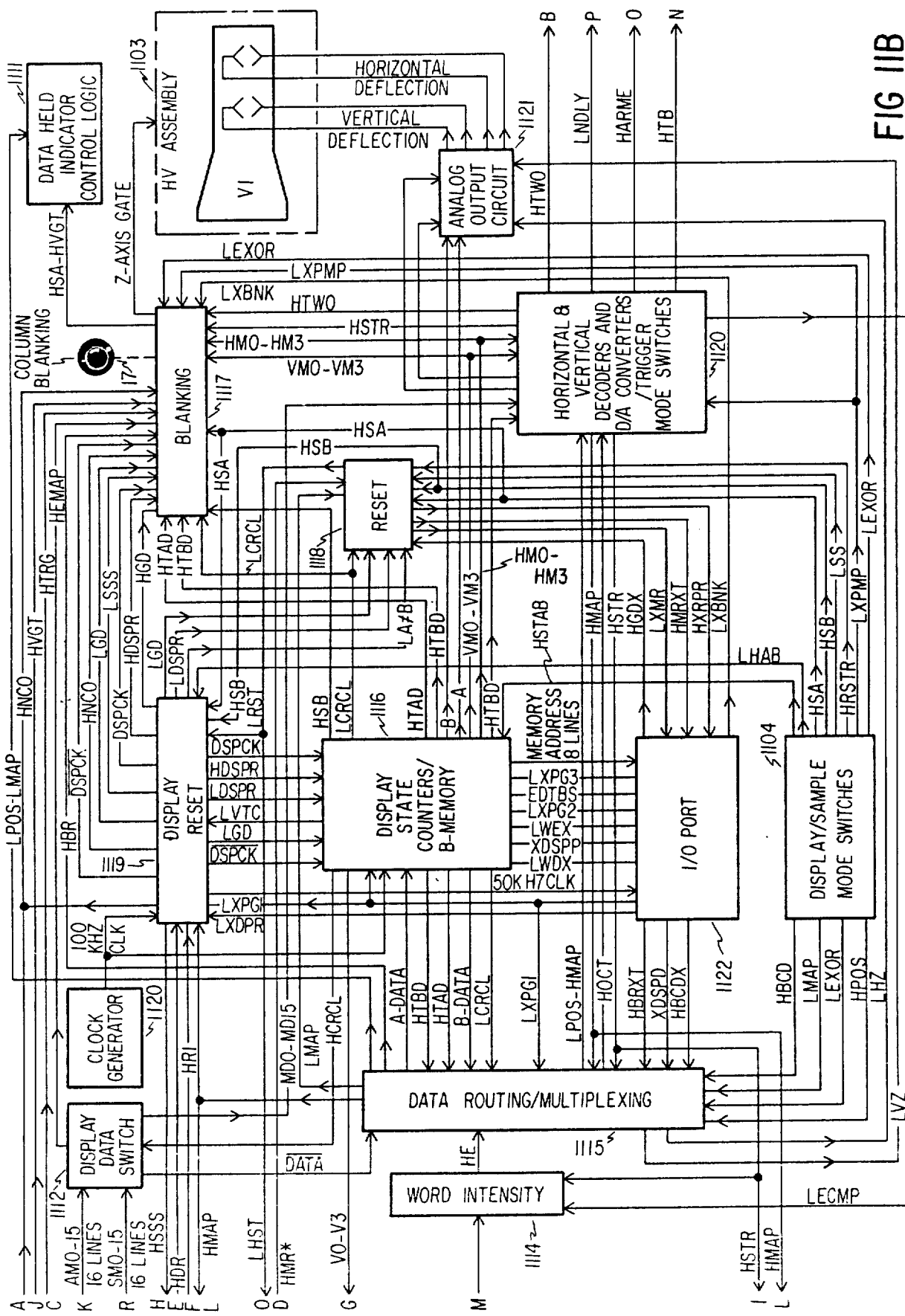

In FIGS. 11A and 11B there is shown a functional block diagram of the circuitry of the preferred embodiment. In general, the data acquisition circuitry is shown in FIG. 11A, and the display circuitry is shown in FIG. 11B. Data input and threshold circuitry 1105 receives clock signals from a circuit under test via a clock probe 1151, and receives data signals via data probes 1152. A threshold voltage signal is supplied to the probes on a line 1153. As described above, this threshold may be varied by threshold controls 41, 42 and 43. A clock slope command signal on a line 1154 is provided to the clock probe 1151 to control the production of the signals on a line 1155 and a line 1156. More details of this circuitry are discussed later with respect to FIG. 20 and FIG. 30.

Figure 14:
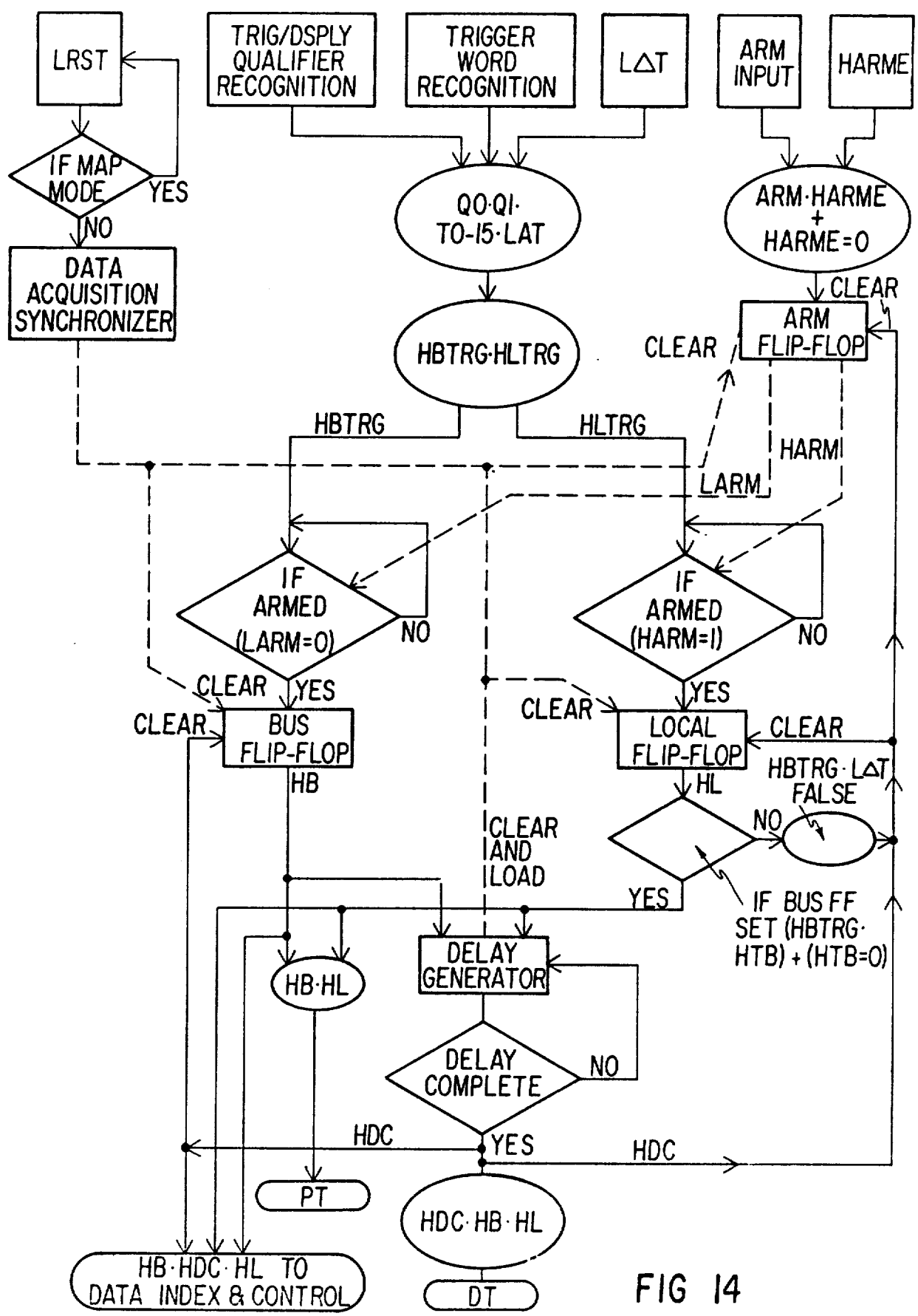
FIG. 14 shows the logical sequence performed by the digital delay and trigger generator circuitry of the preferred embodiment.
Figure 15:
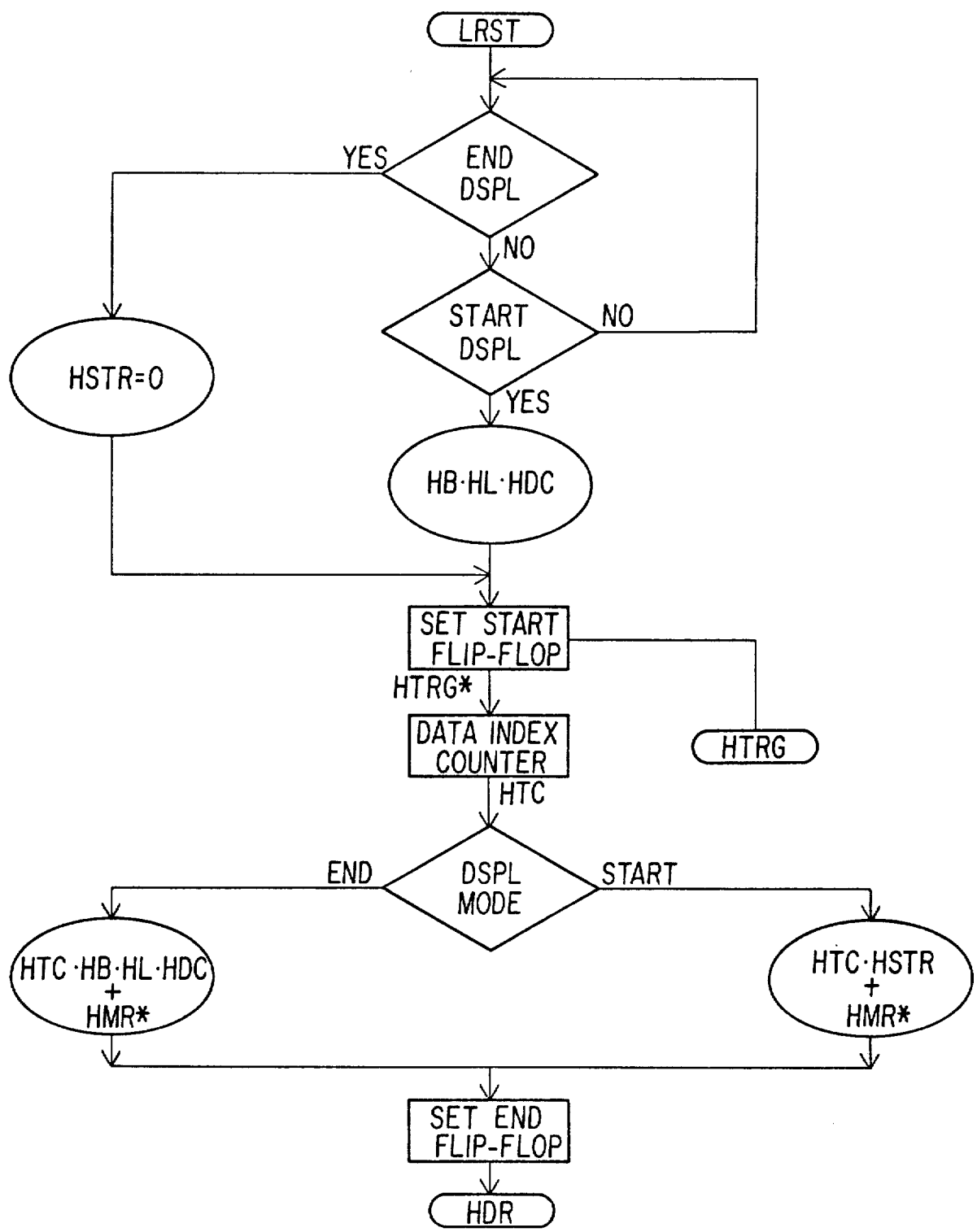
FIG. 15 shows the functional operation of the data index and control circuits at the preferred embodiment.

Data words received via data probes 1152 are coupled to temporary data storage pattern recognition circuitry 1107. Various signals also received by the circuitry are clock signals on lines 1155 and 1156, a clock signal LΔT on a line 1161 which is generated by a timing generator circuit 1109, a trigger bus signal on line 1164, and trigger-word signals on lines 1166. In response to the signals received, the data storage and pattern recognition circuitry 1107 produces the control signals on lines 1171, 1172 and 1173. These control signals are coupled to digital delay and trigger generator circuitry 1108 and cause that circuitry to perform the functional sequence of events shown in FIG. 14. Other inputs to digital delay and trigger generator circuitry 1108 are received from the display circuitry shown in FIG. 11B and a memory index control circuit 1110 shown in FIG. 11A, which also receives clock signals from timing generator 1109 and control signals from temporary data storage and pattern recognition circuit 1107 to perform the functional sequence of events shown in FIG. 15. Under control of these circuits, selected data words are stored in the A memory 1110. Further details regarding these circuits shown in FIGS. 11A and 11B are discussed later with respect to their particular schematics. A cross reference between the functional blocks shown in FIGS. 11A and 11B and the respective detailed schematics is contained in Table I below.

Table I

Figure 20:
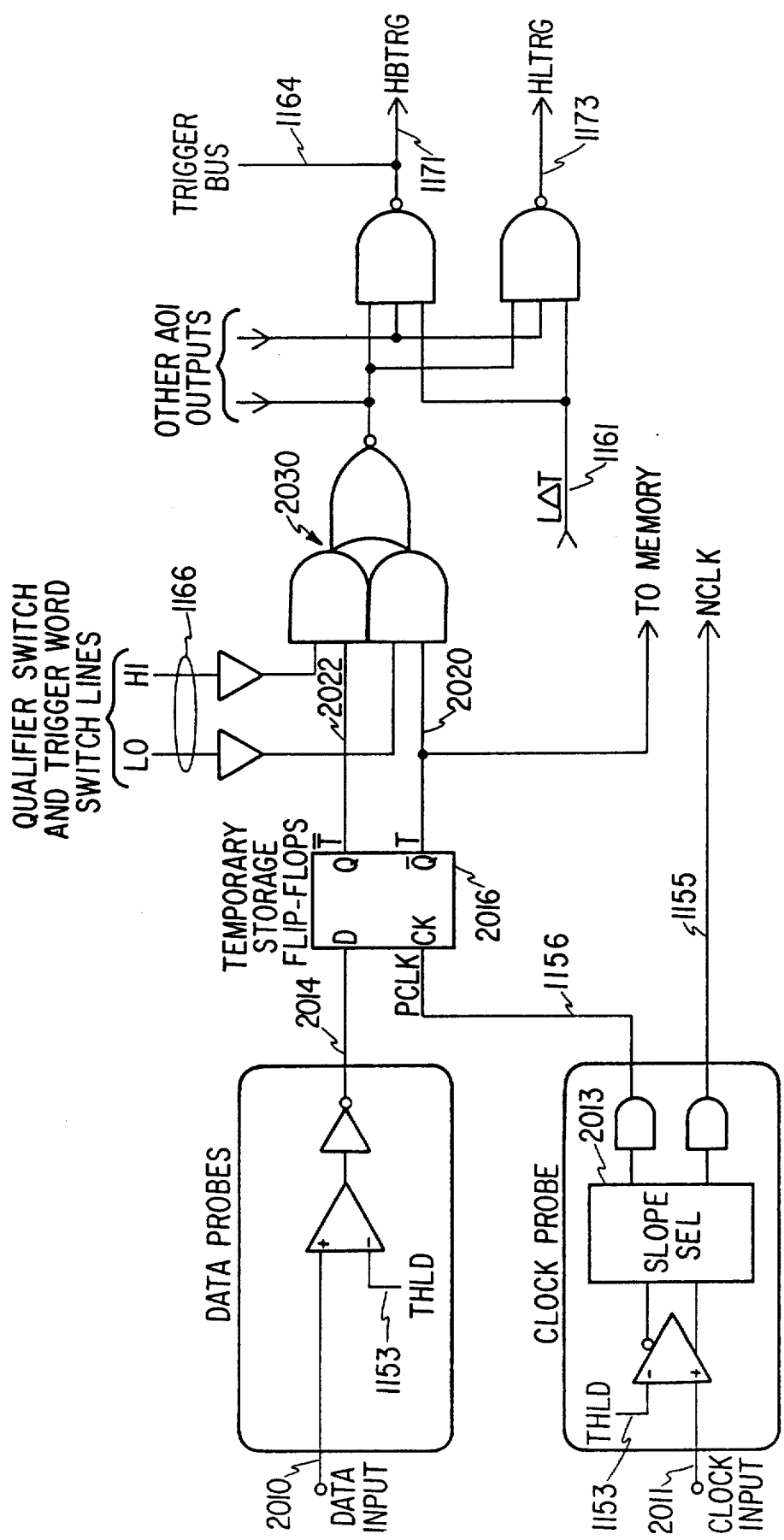
FIG. 20 is a logic diagram of the data input circuitry of the preferred embodiment.
Figure 21:
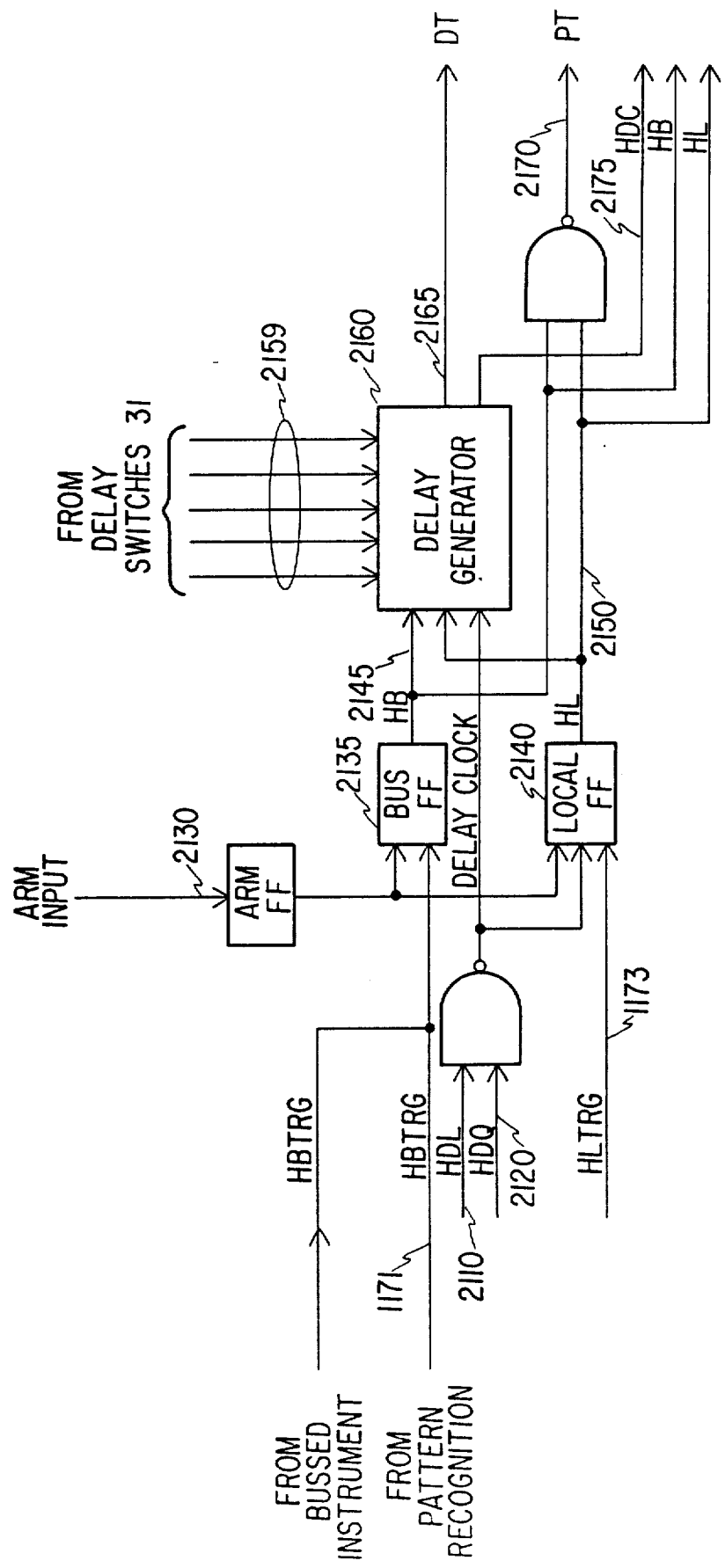
FIG. 21 is a block diagram of the digital delay and trigger generator circuitry of the preferred embodiment.
Figure 22:
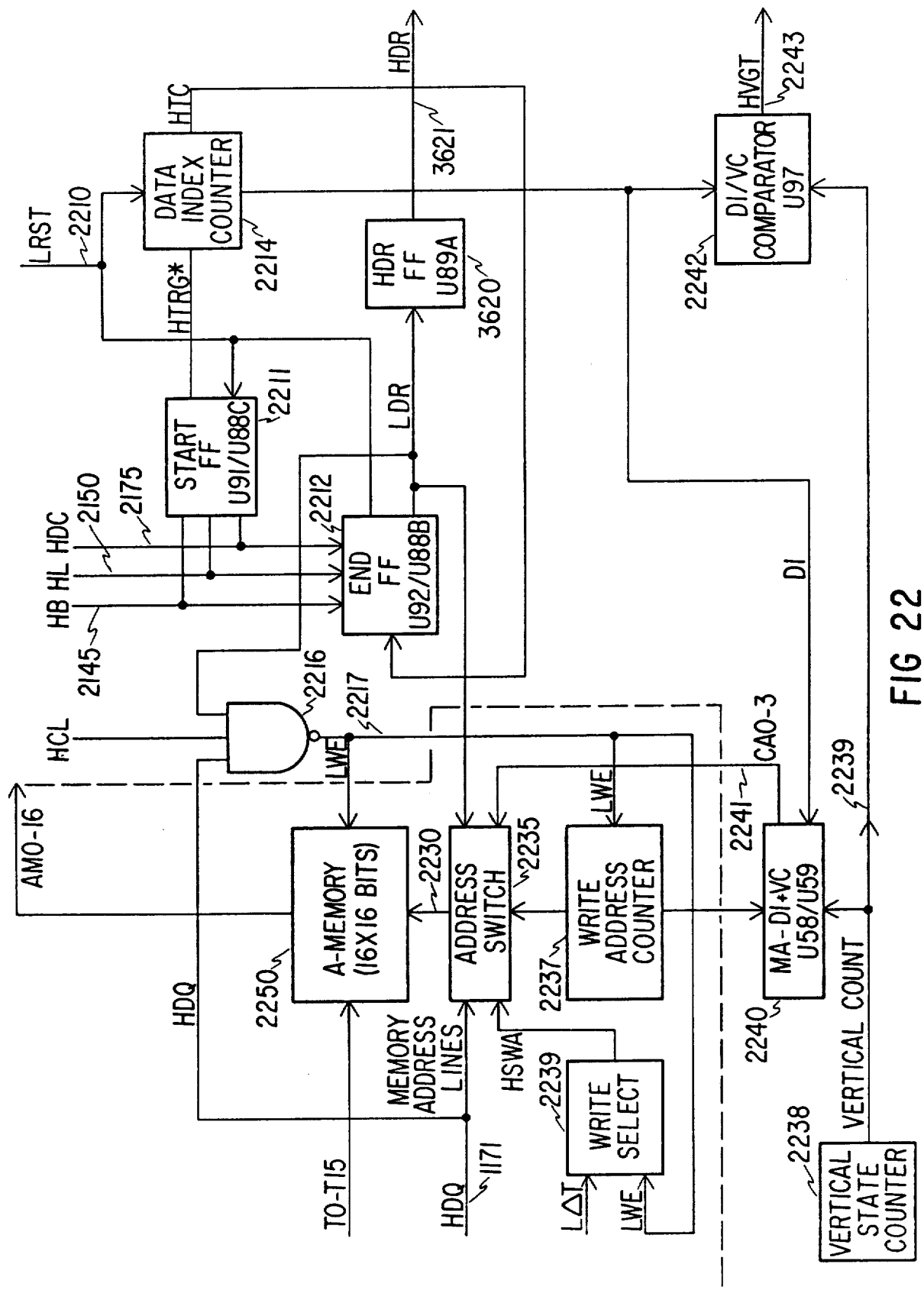
FIG. 22 is a block diagram of the data index and control circuitry of the preferred embodiment.
Figure 23:
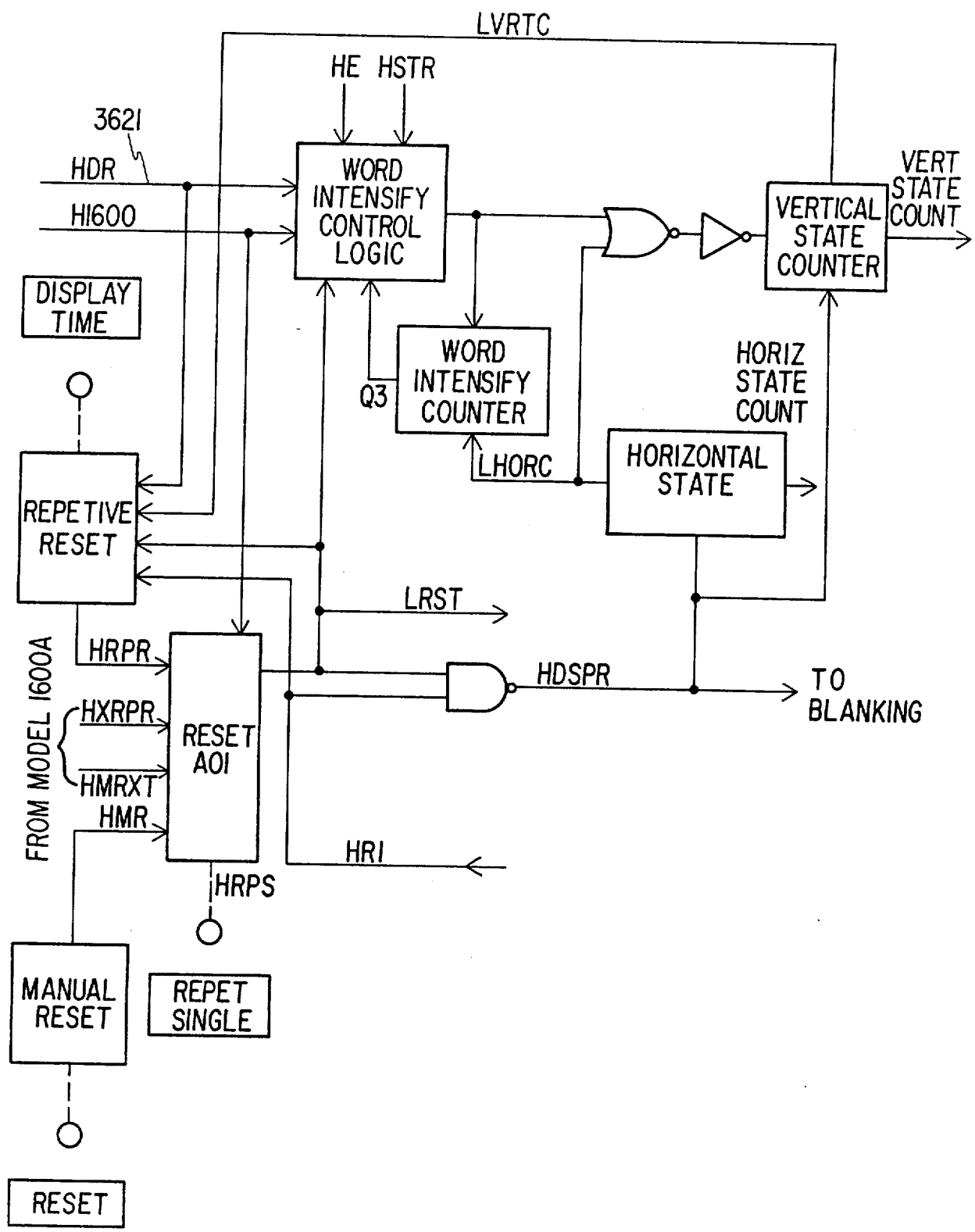
FIG. 23 is a block diagram of the display reset and control circuitry of the preferred embodiment.
Figure 24:
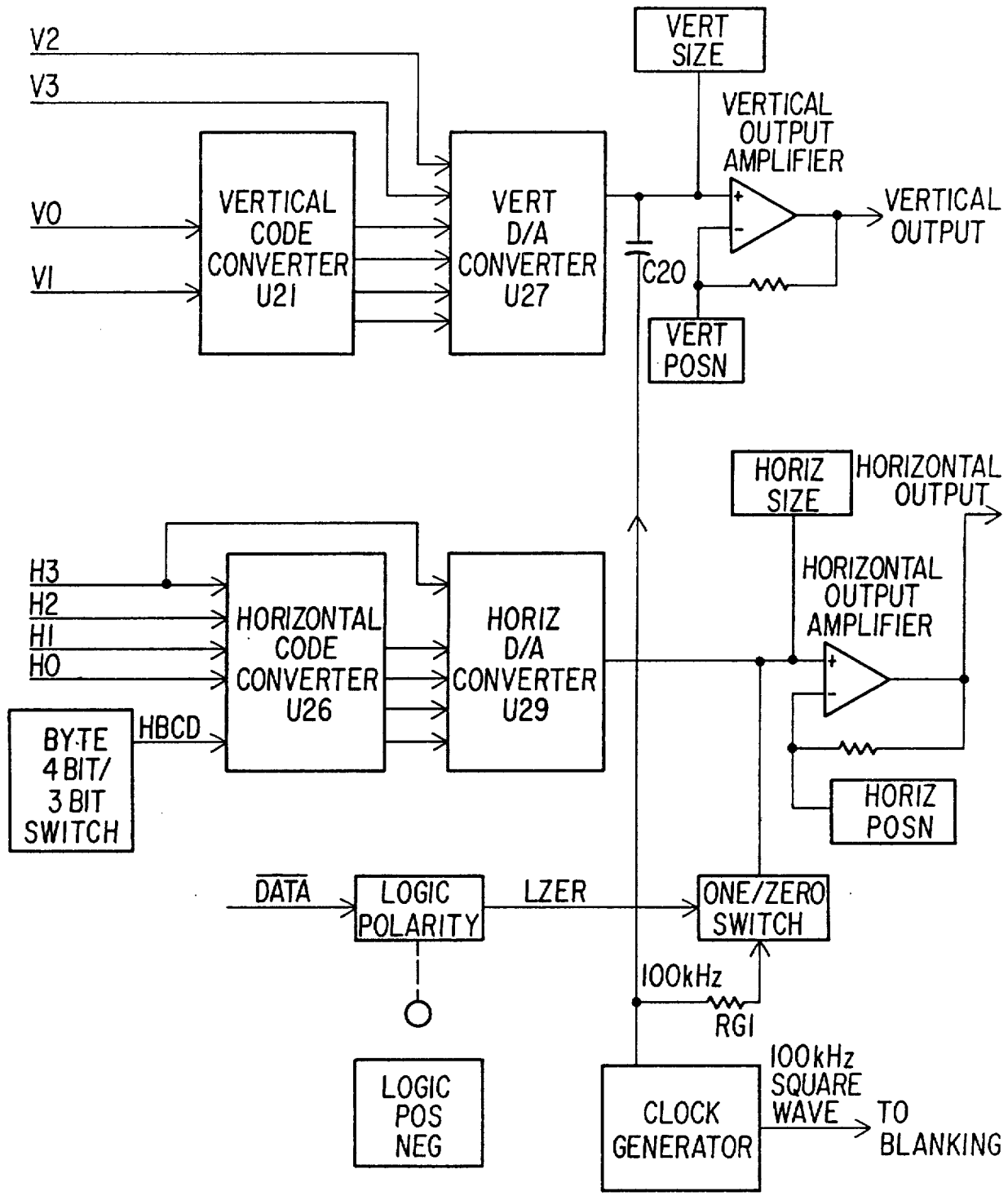
FIG. 24 is a block diagram of the clock generator and analog drive circuitry of the preferred embodiment.
Figure 25:
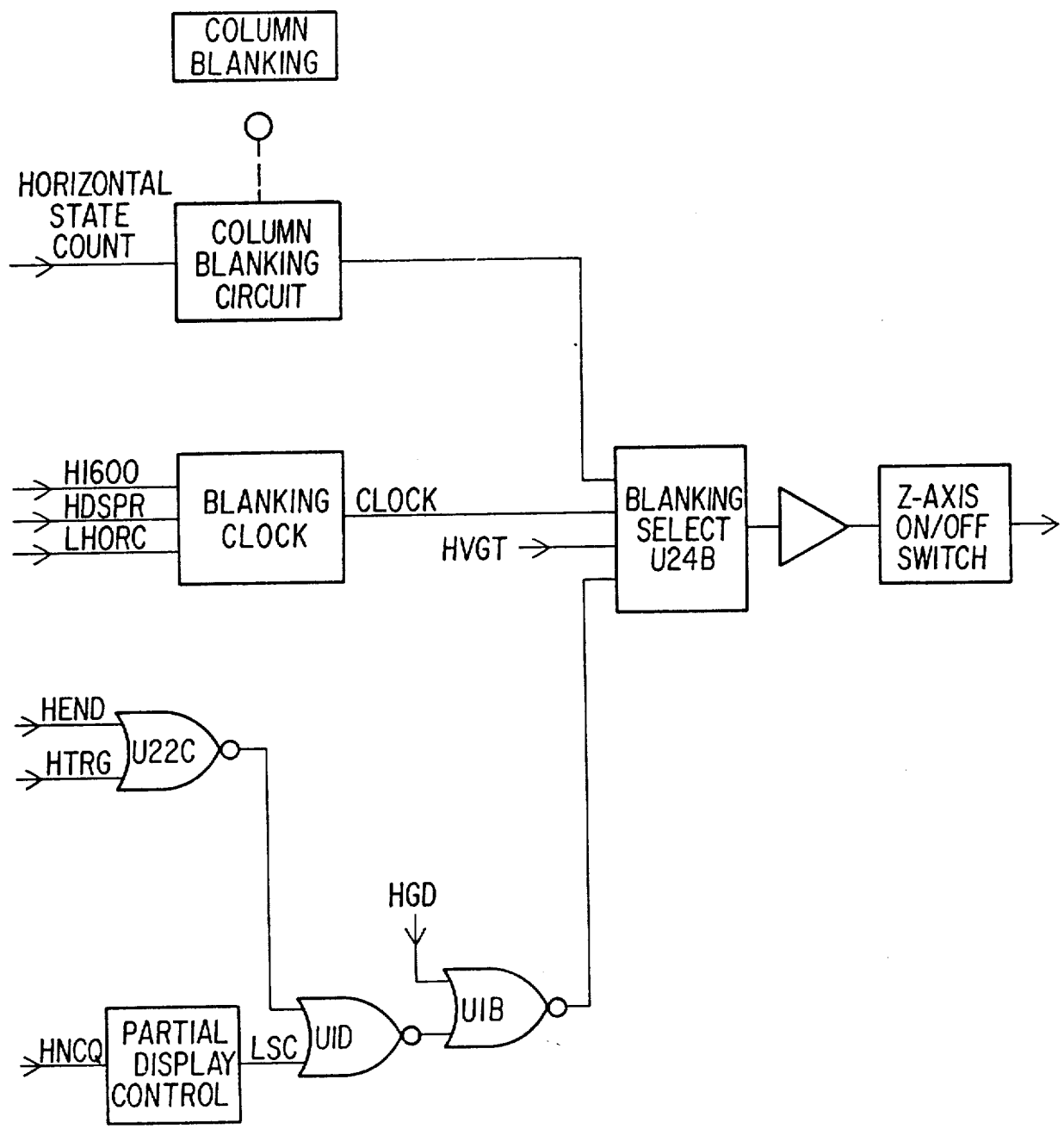
FIG. 25 is a block diagram of the blanking circuitry of the preferred embodiment.
Figure 26:
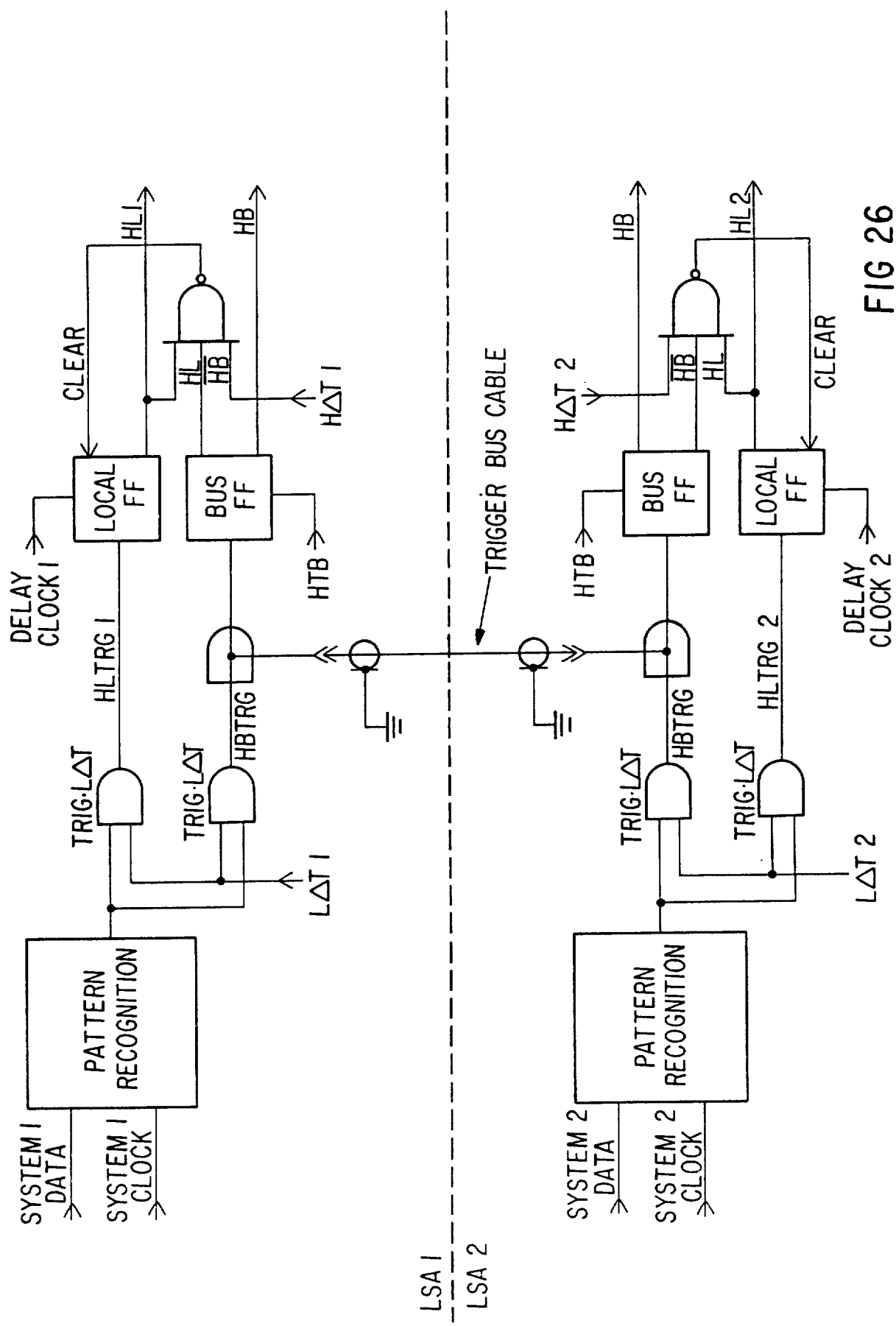
FIG. 26 is a simplified schematic of the trigger bus circuitry of the preferred embodiment.
Figure 27:
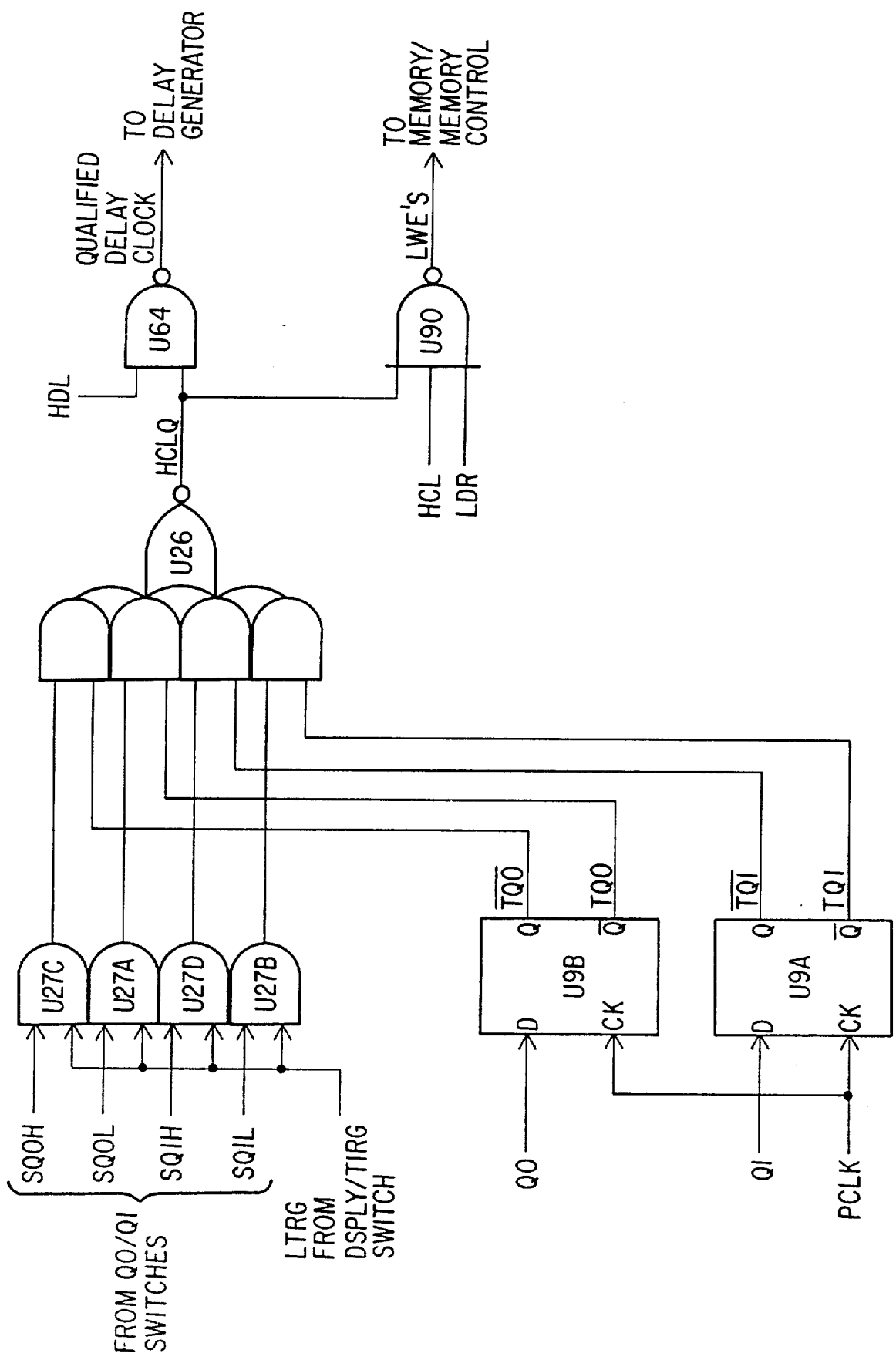
FIG. 27 is a simplified schematic of the qualifier circuit of the preferred embodiment.
Figure 28:
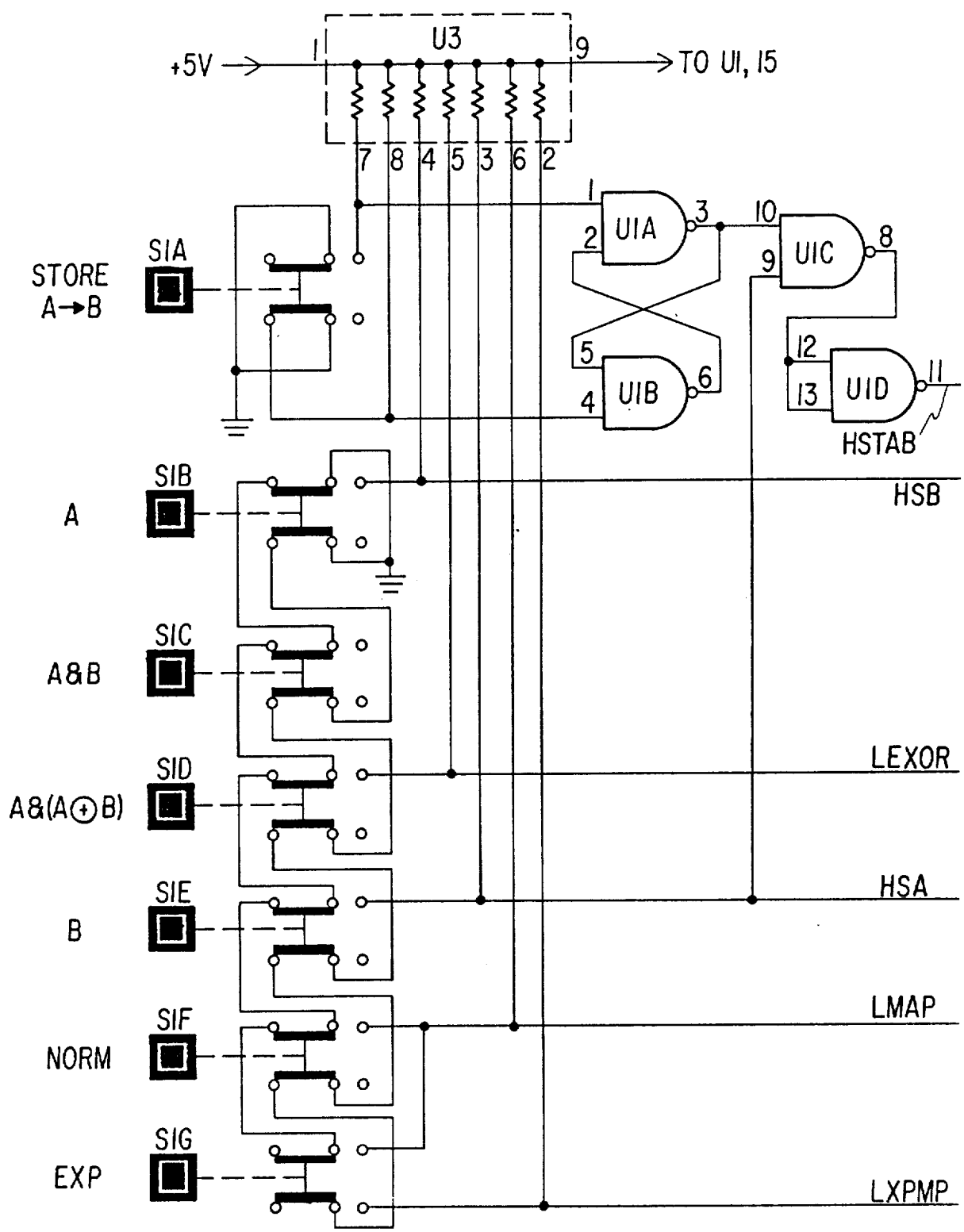
FIG. 28 is a schematic diagram of the display and sample mode circuitry used in the preferred embodiment.
Figure 29:
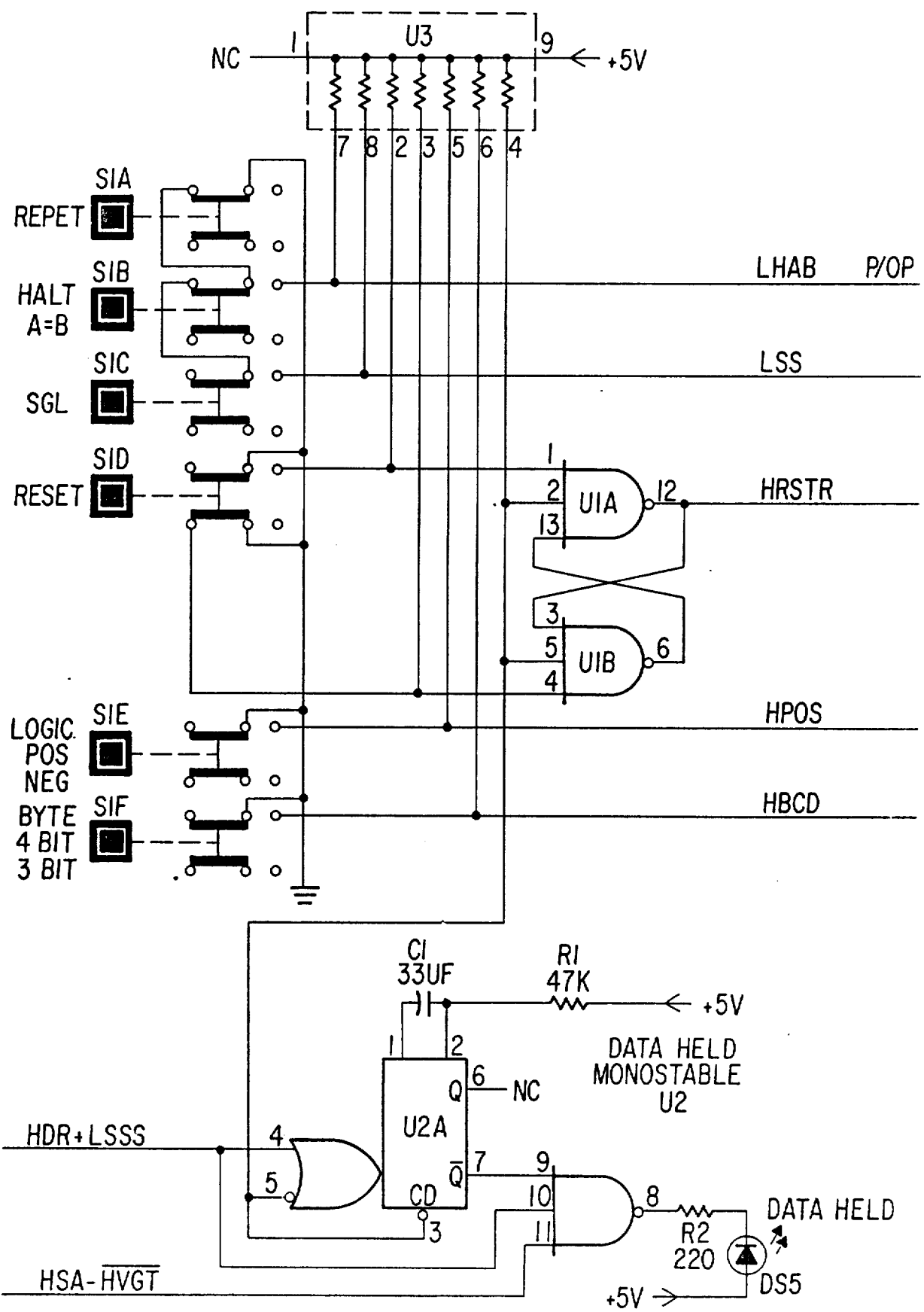
FIG. 29 is a schematic diagram of the display and sample mode control assemblies used in the preferred embodiment.
Figures 30, 30A:
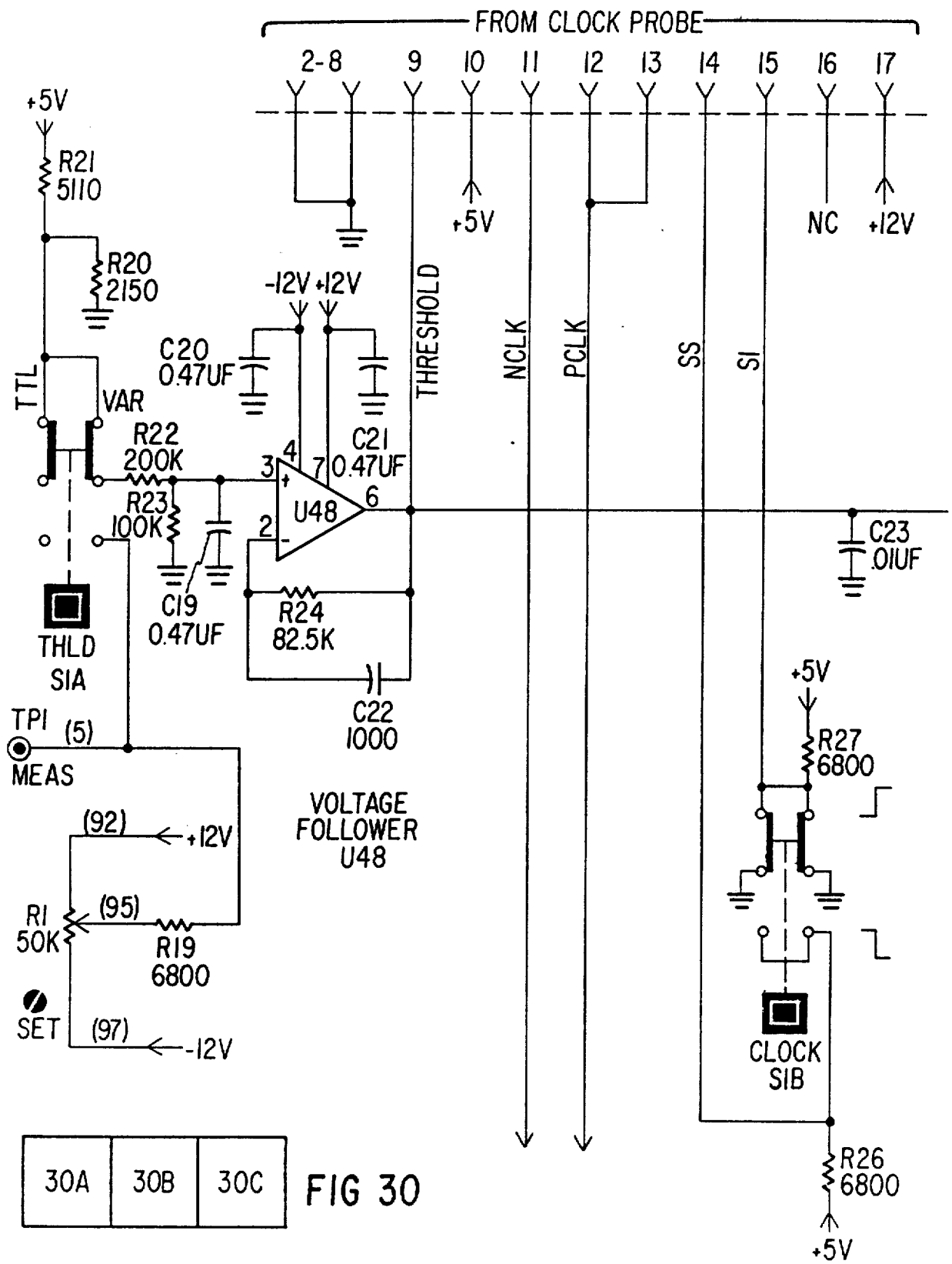
FIG. 30 shows the relationship of FIGS. 30A, 30B and 30C.
FIGS. 30A, 30B and 30C taken together are a schematic diagram of the data input and threshold circuitry of the preferred embodiment.
Figure 30B:
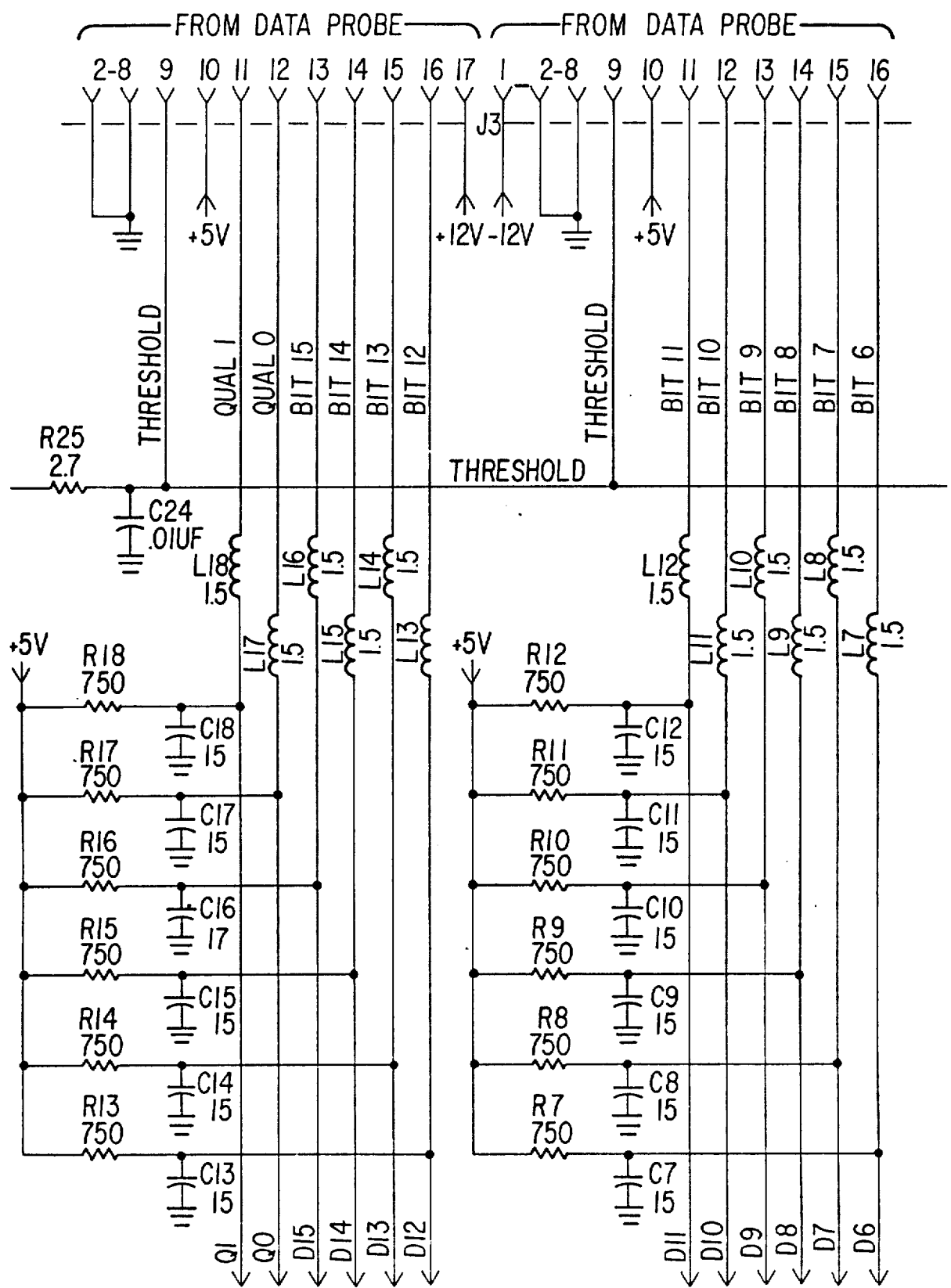
Figure 30C:
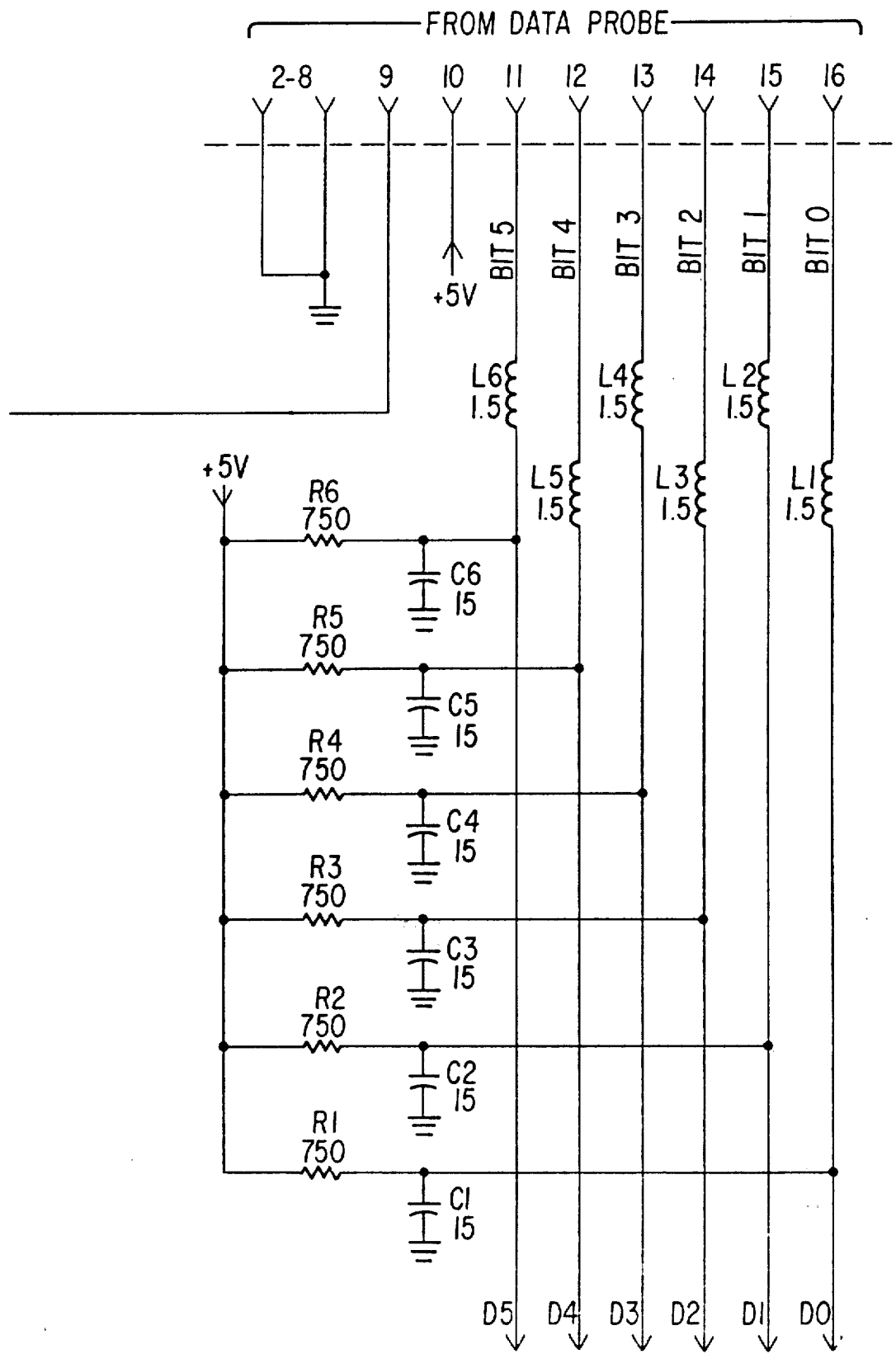
Figure 31:
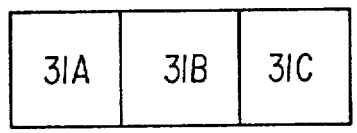
FIG. 31 shows the relationship of FIGS. 31A, 31B and 31C.
Figure 31A:
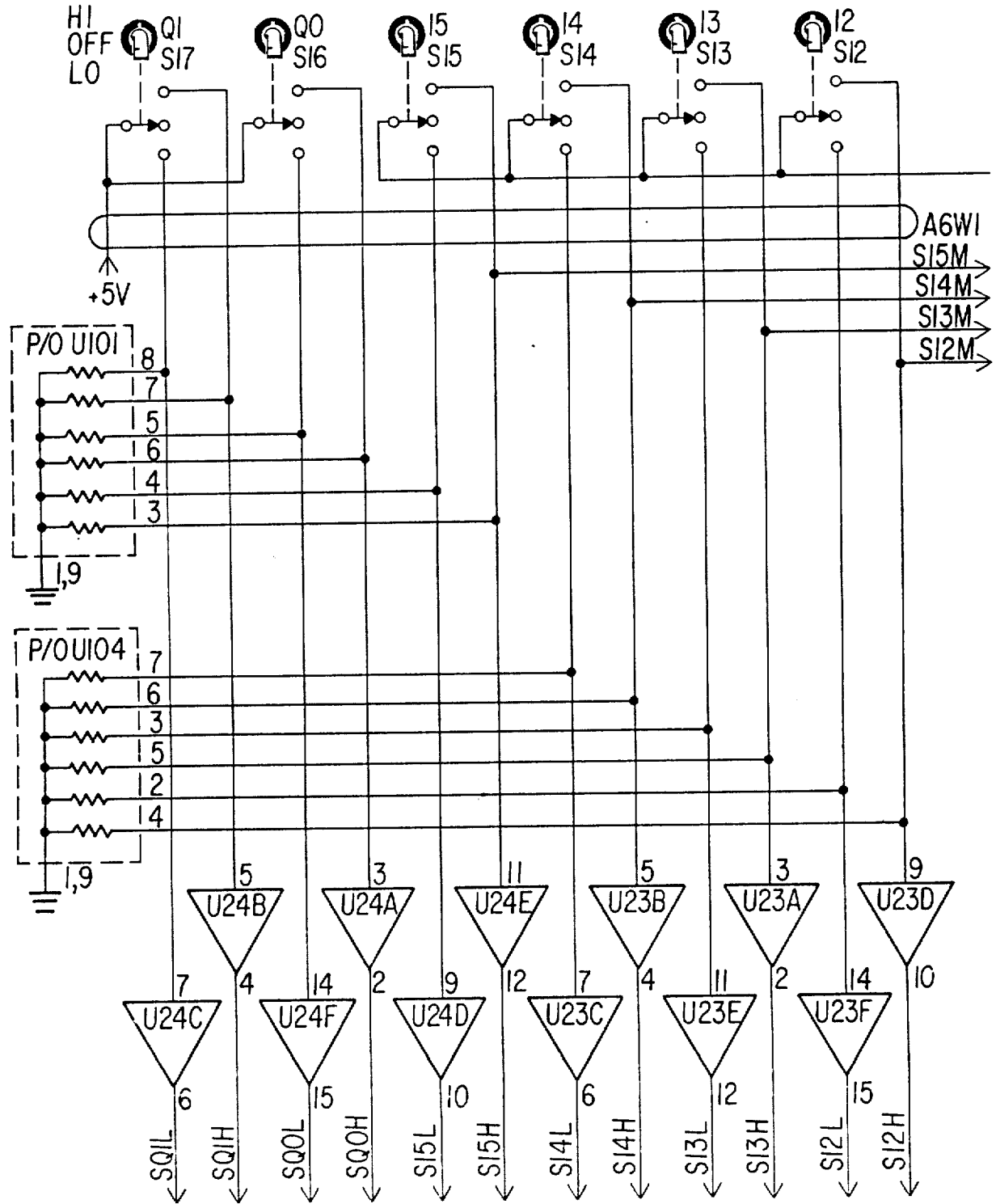
FIGS. 31A, 31B and 31C taken together are a schematic diagram of the trigger switch and trigger word select circuitry of the preferred embodiment.
Figure 31B:
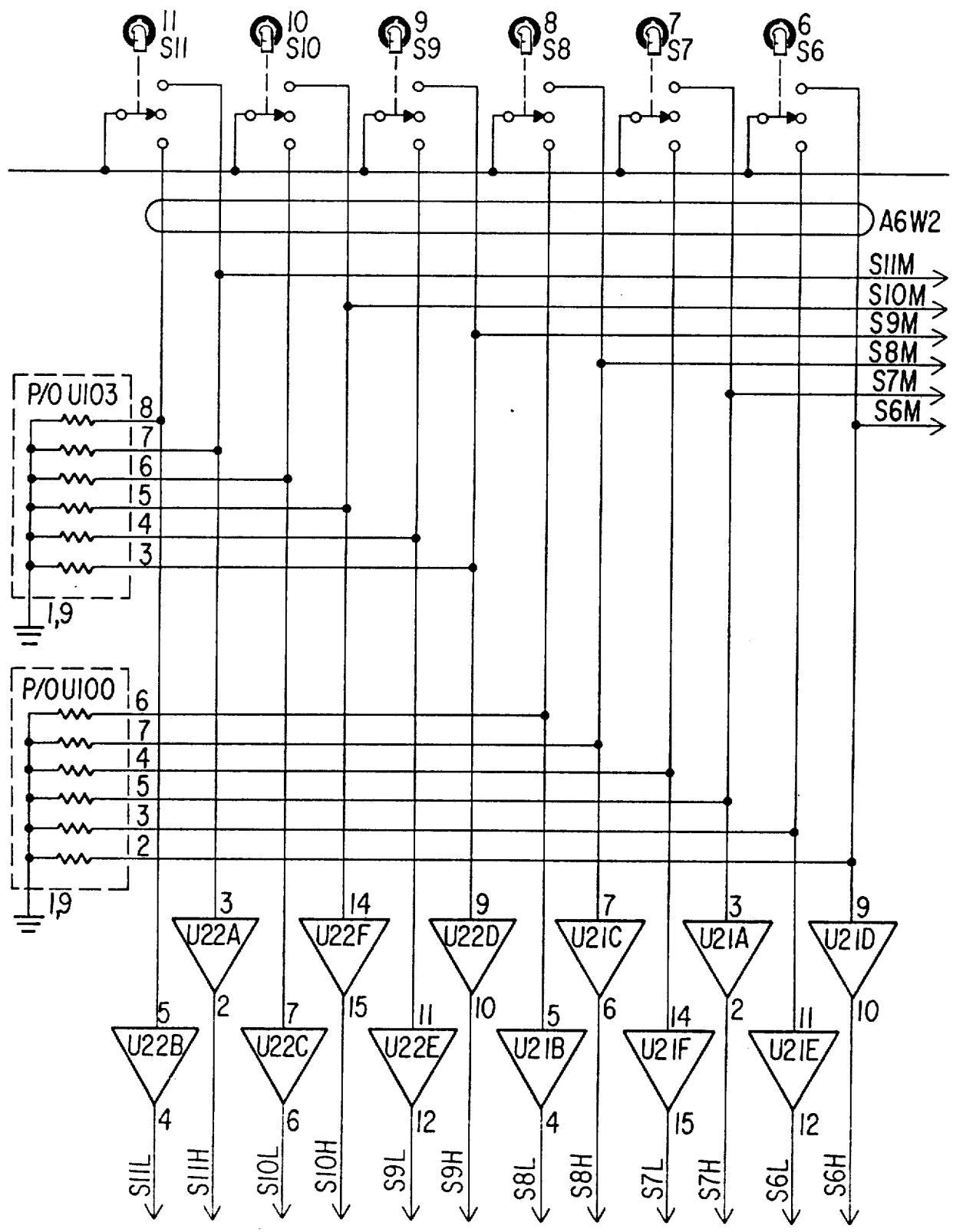
Figure 31C:
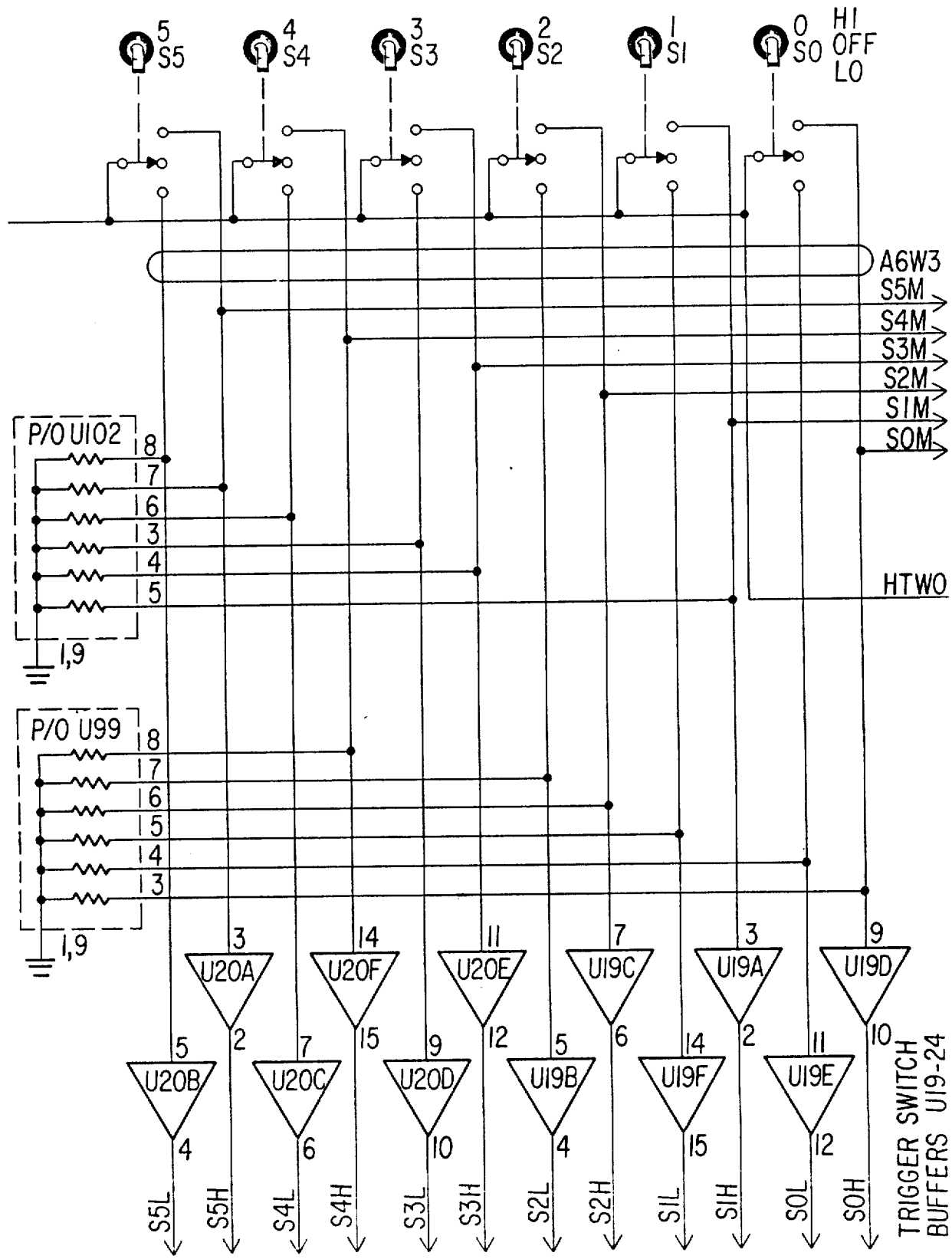
Figure 32B:
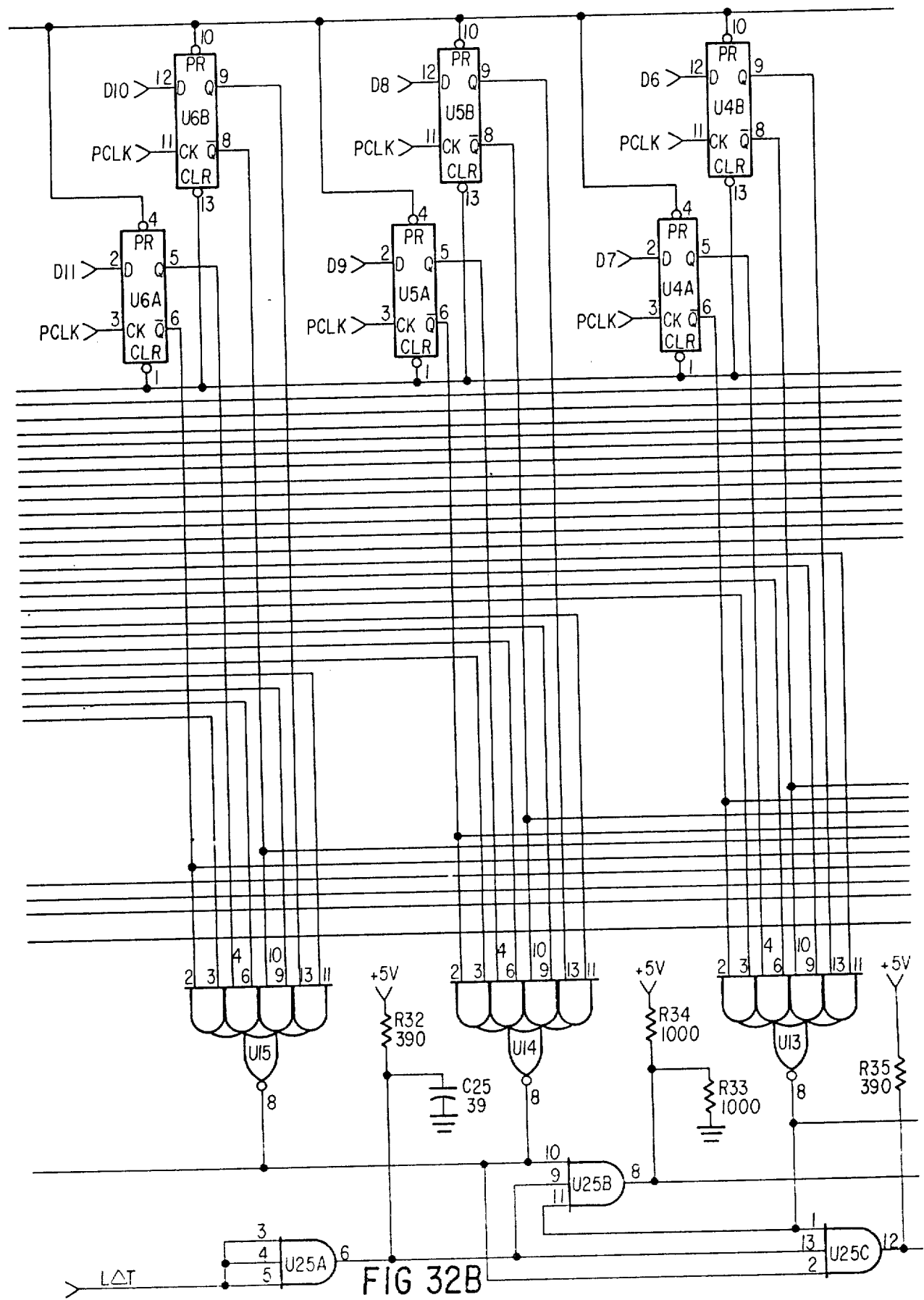
Figure 32C:
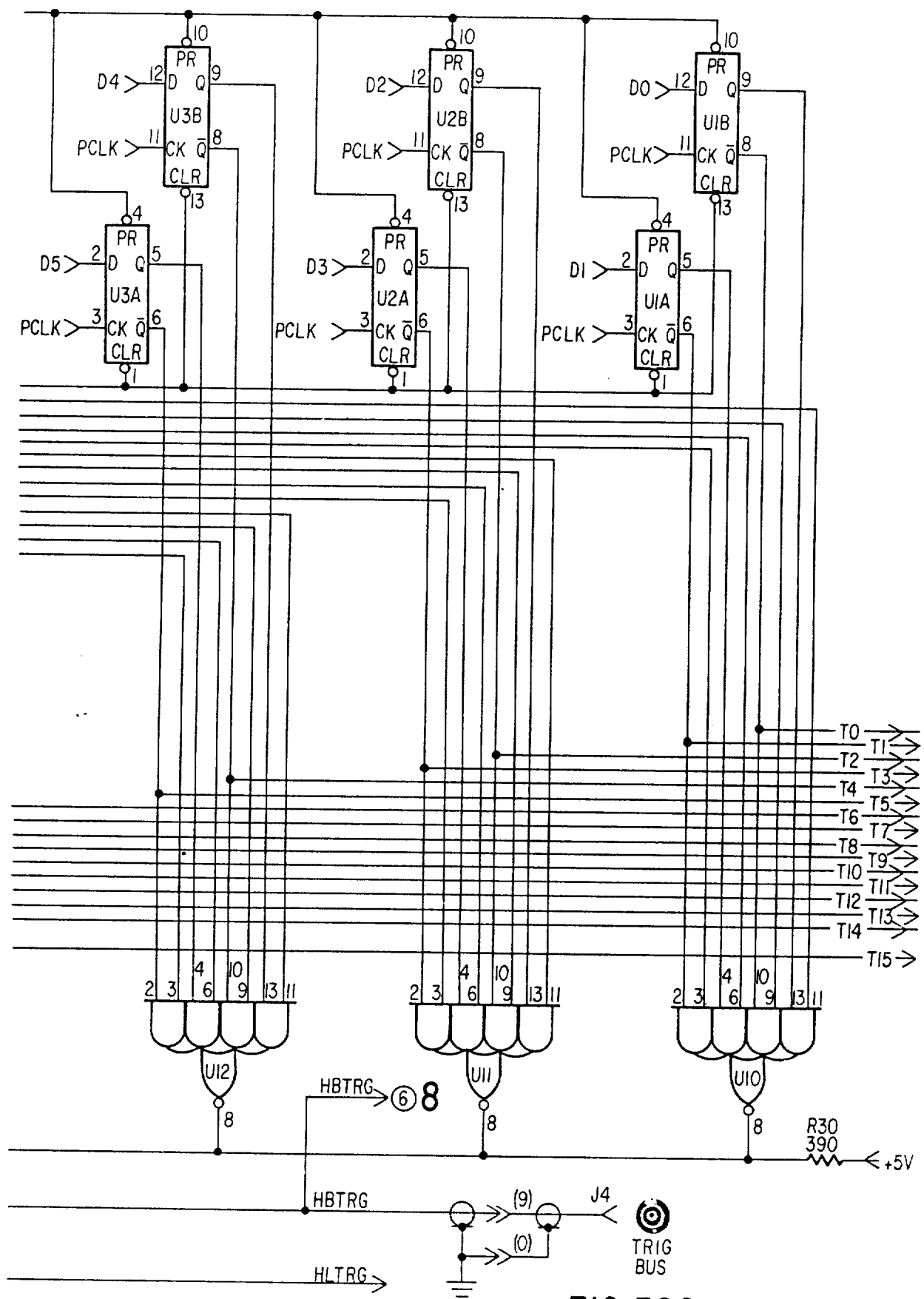
Figure 33B:
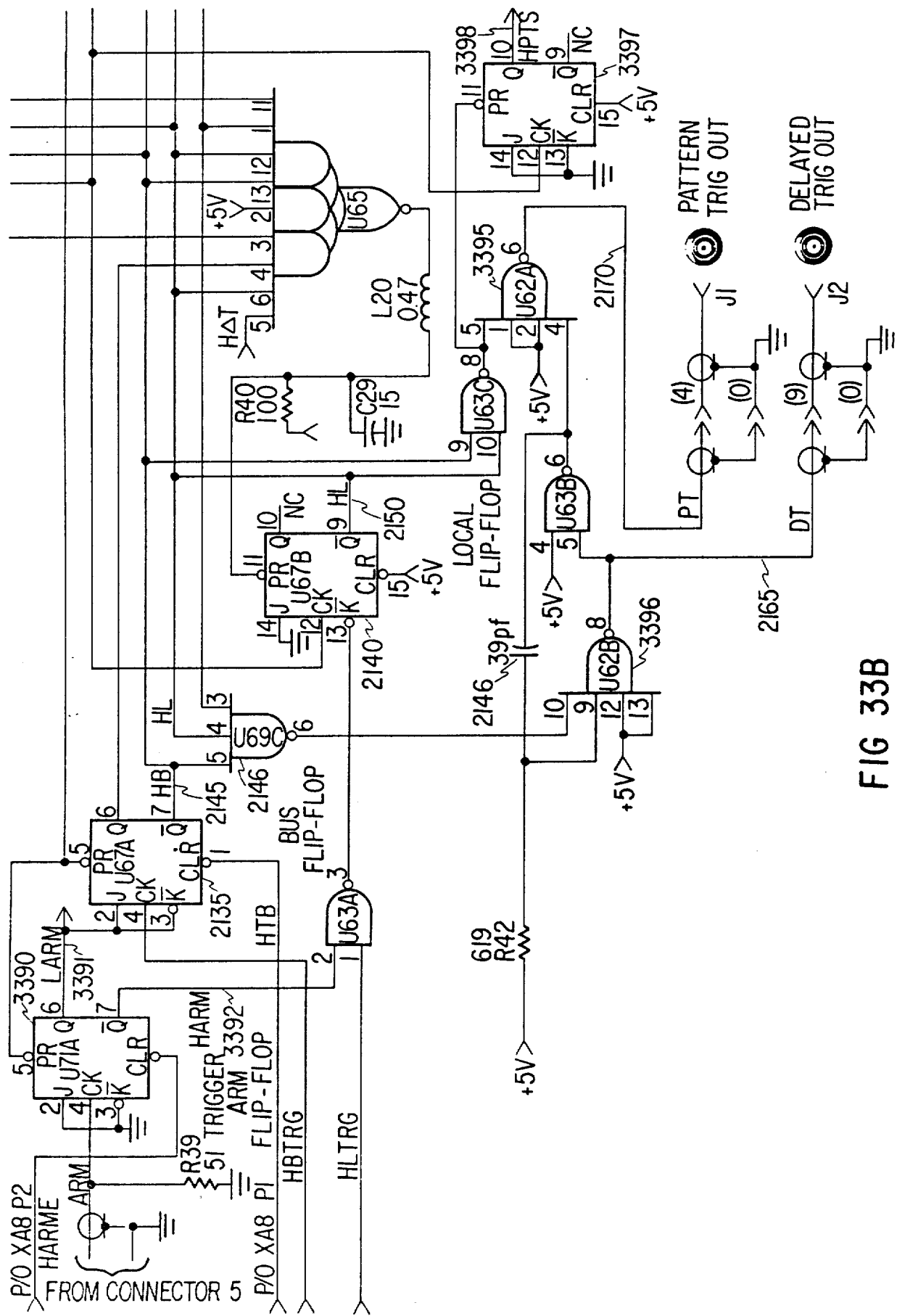
Figure 33C:
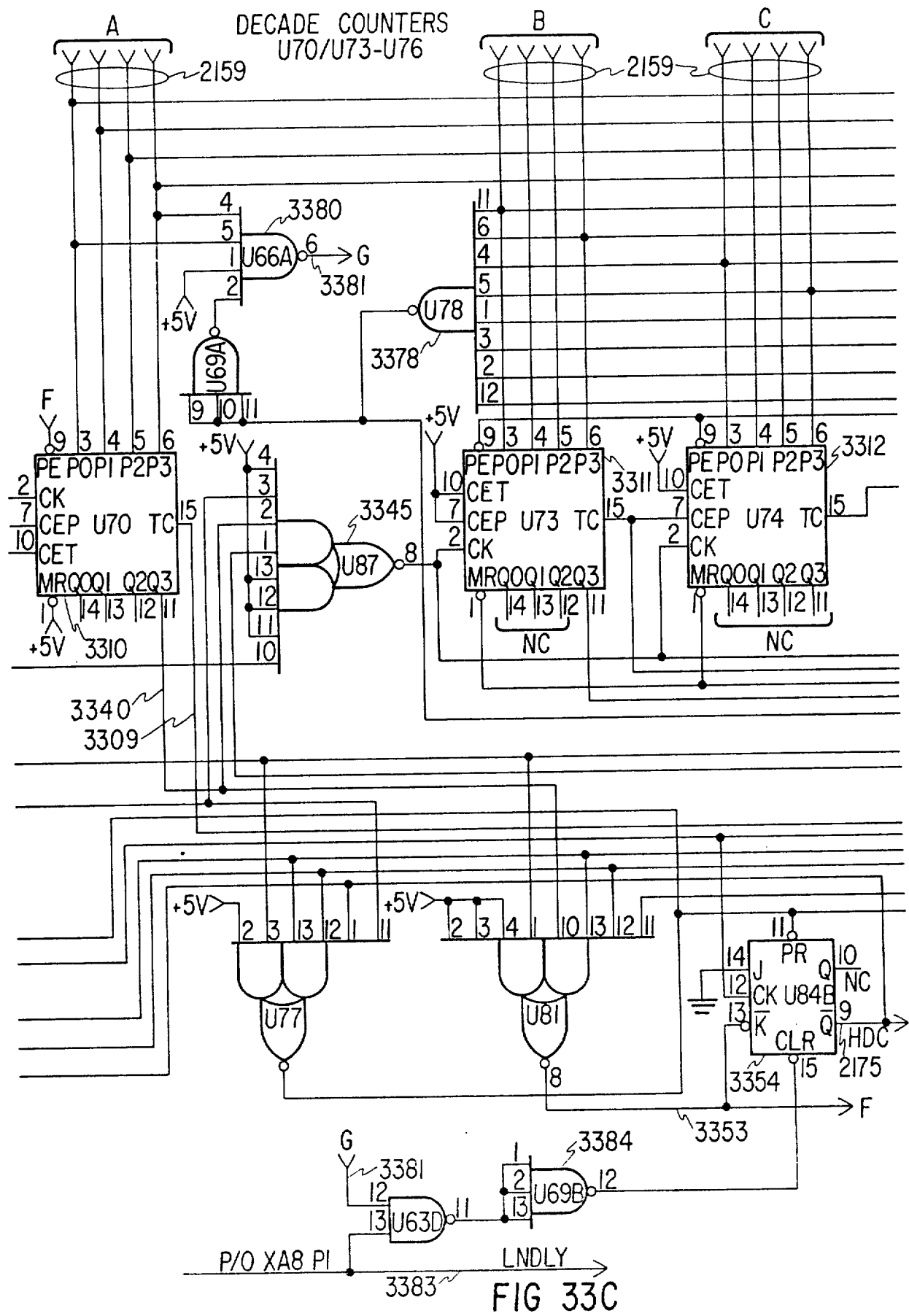
Figure 33D:
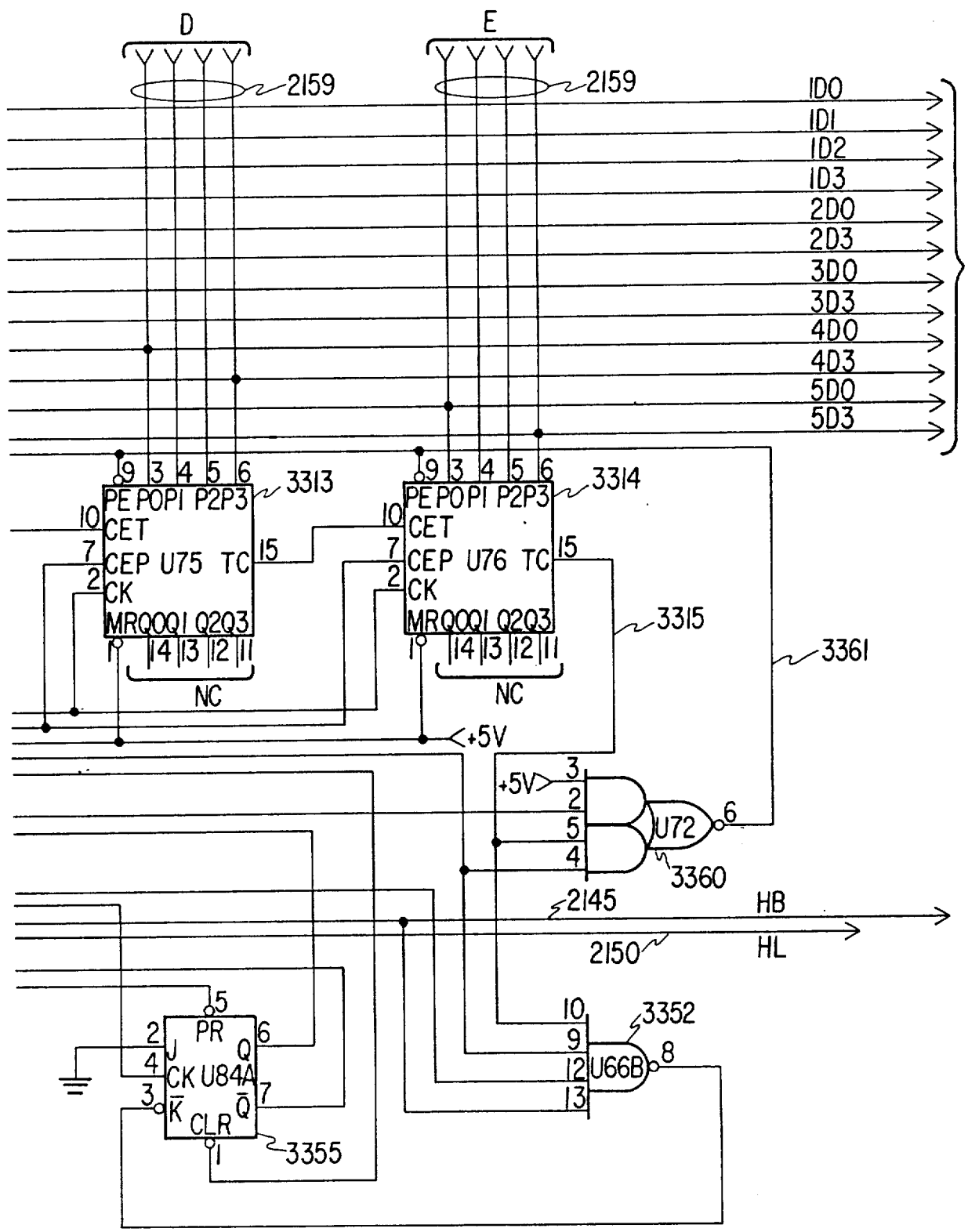
Figure 34B:
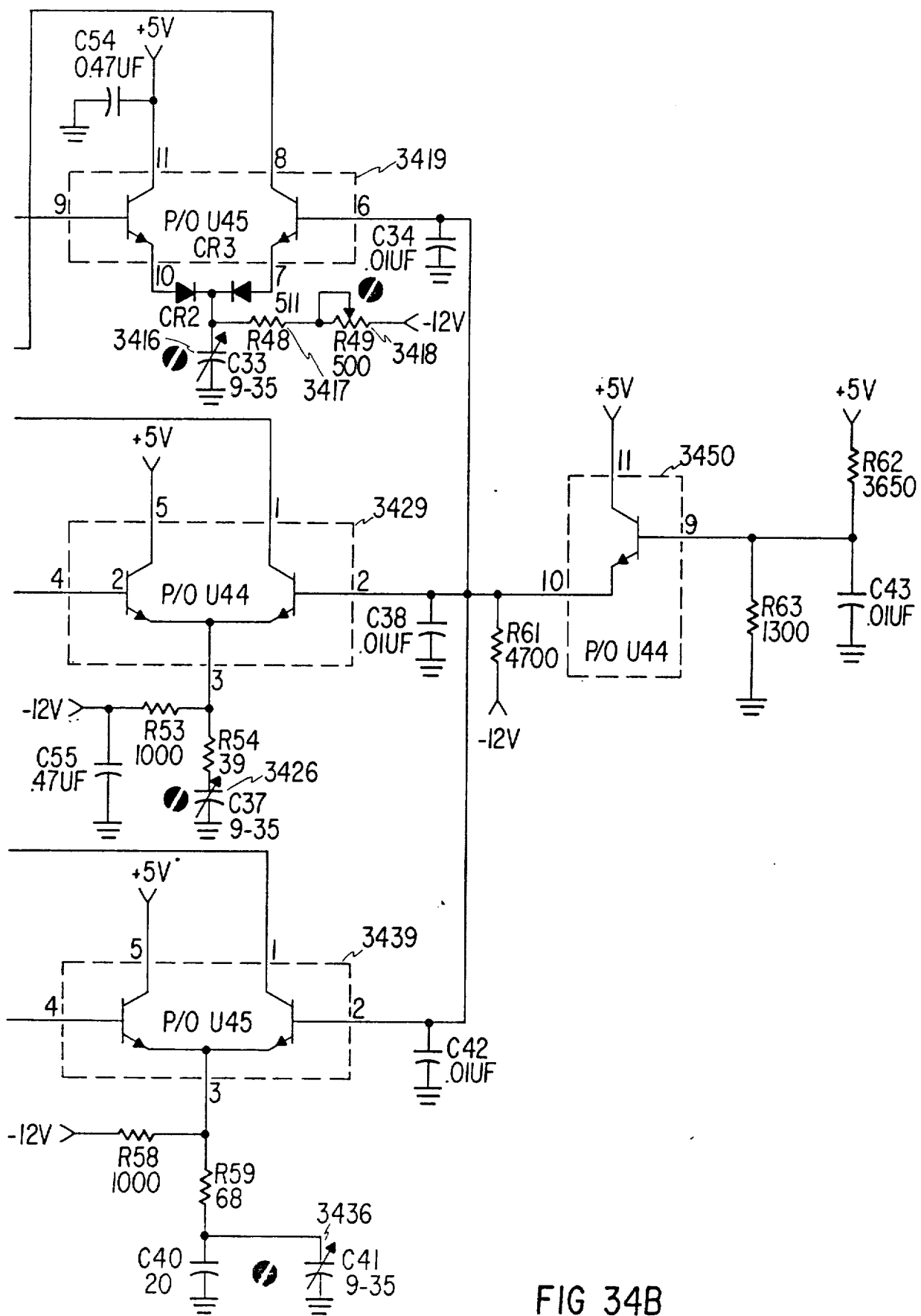
FIG. 34 is a schematic diagram of the timing generator circuitry of the preferred embodiment.
Figure 35B:
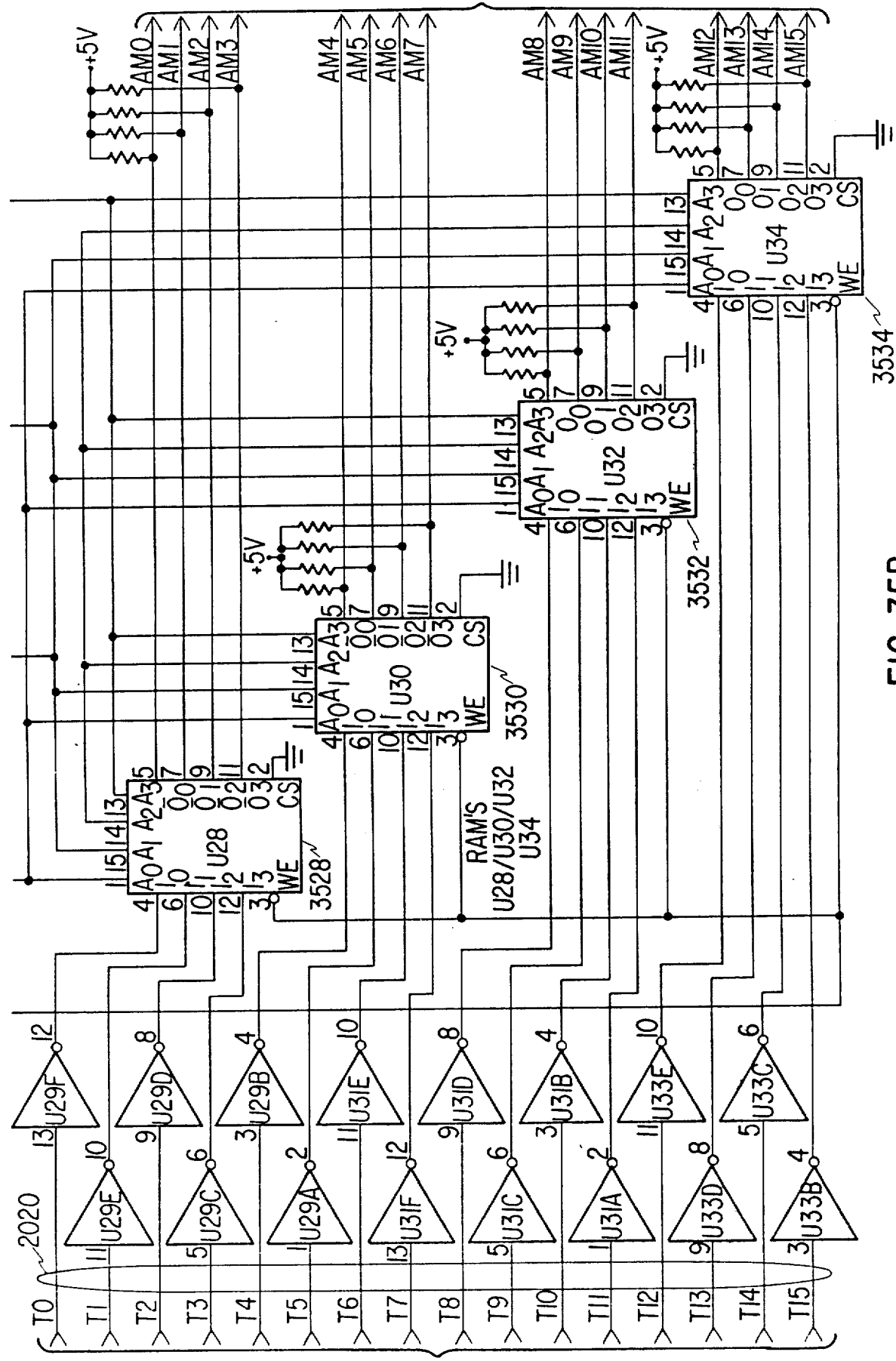
FIG. 35 is a schematic diagram of the addressing and control circuitry for the A memory of the preferred embodiment.
Figure 36B:
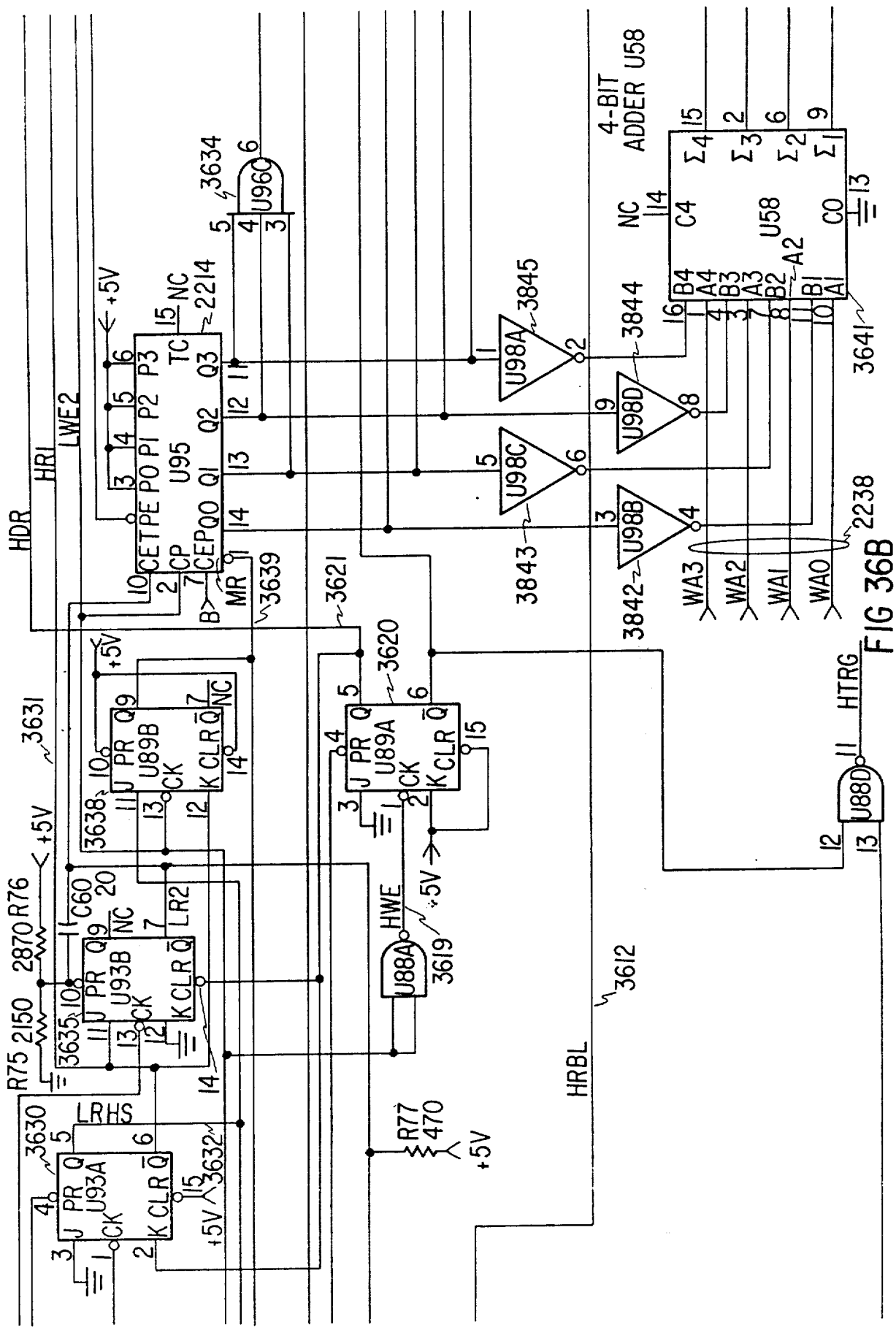
Figure 36C:
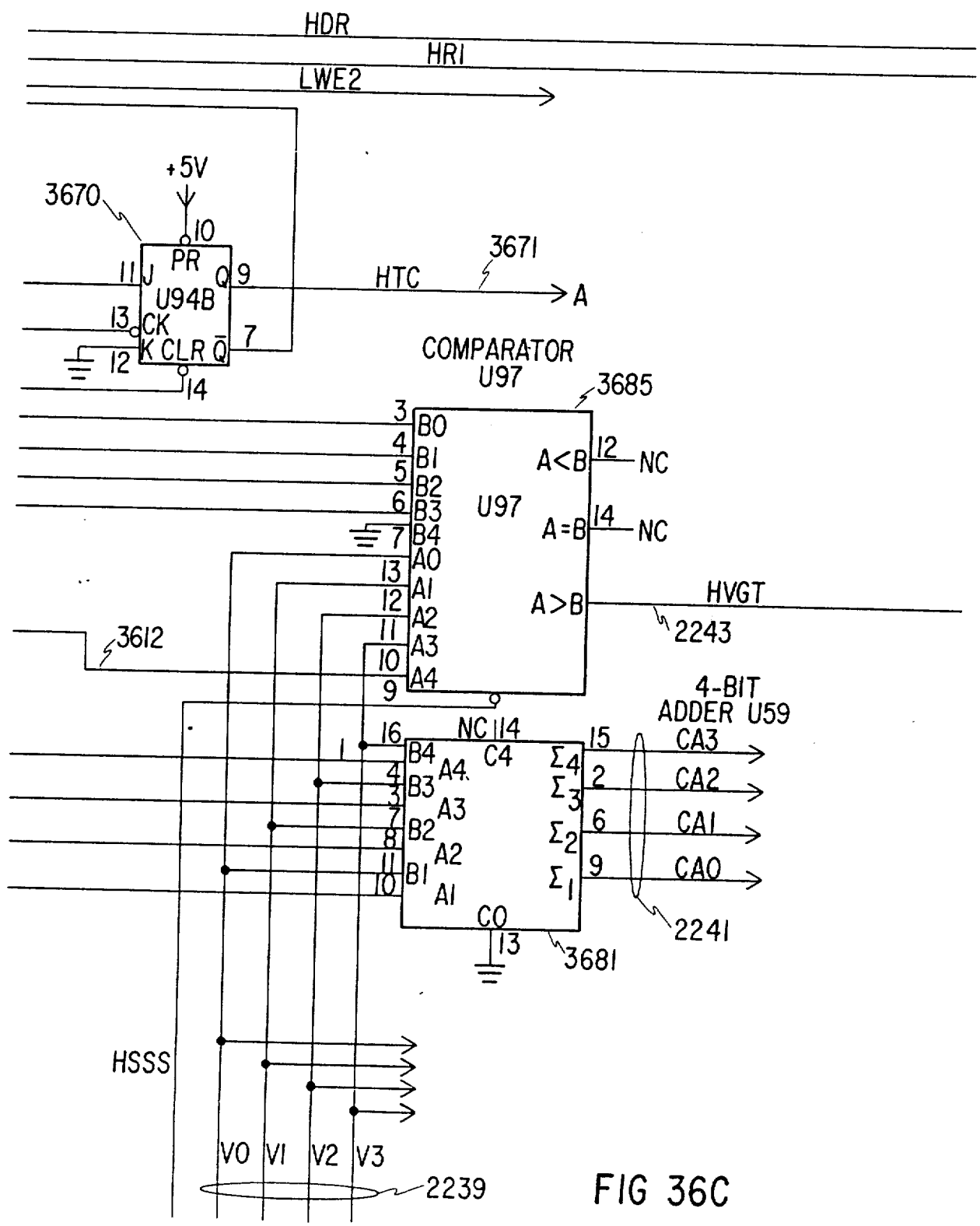
Figures 37, 37A:
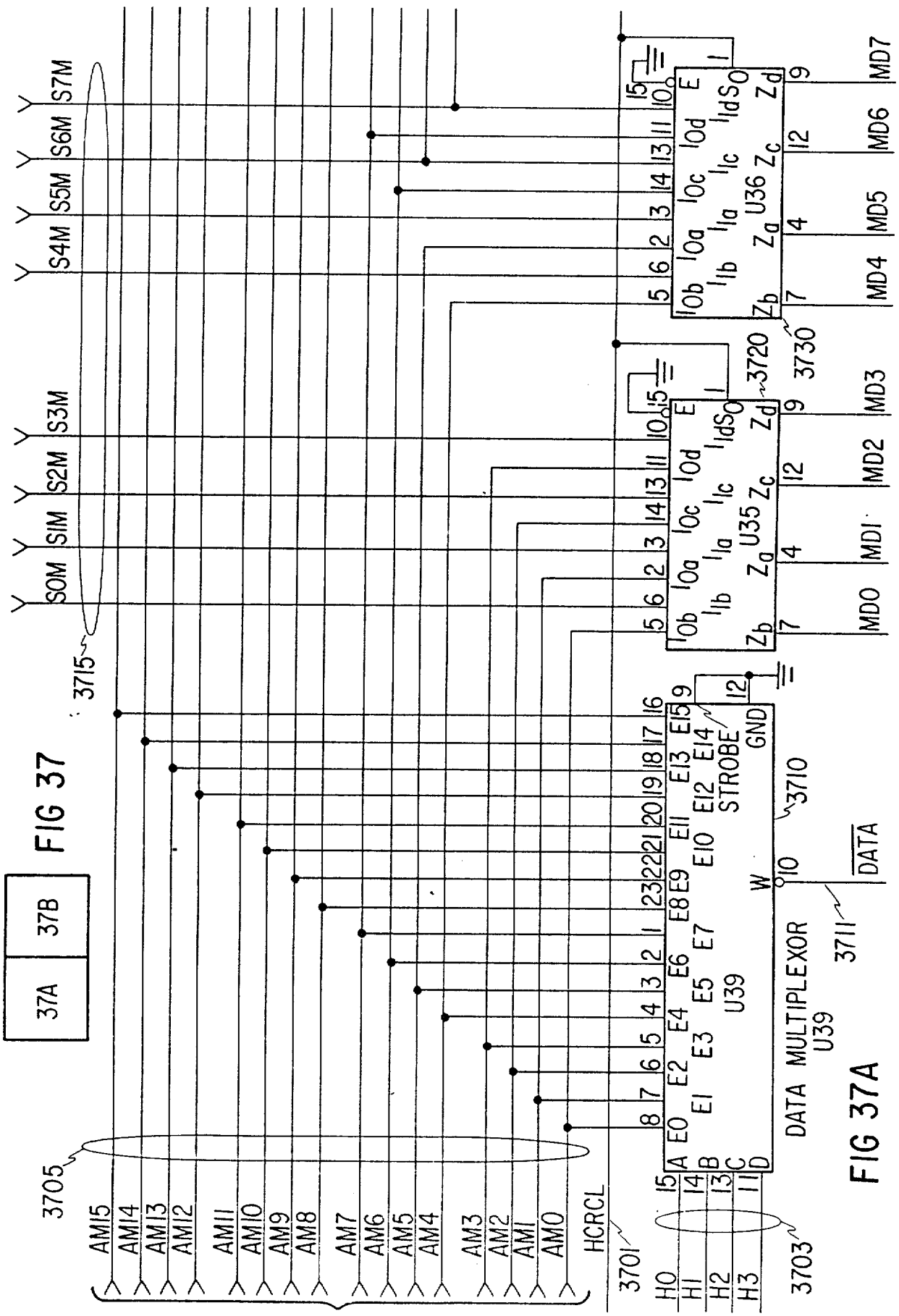
FIG. 37 shows the relationship of FIGS. 37A and 37B.
FIGS. 37A and 37B taken together are a schematic diagram of the display data switch assembly of the preferred embodiment.
Figure 38:
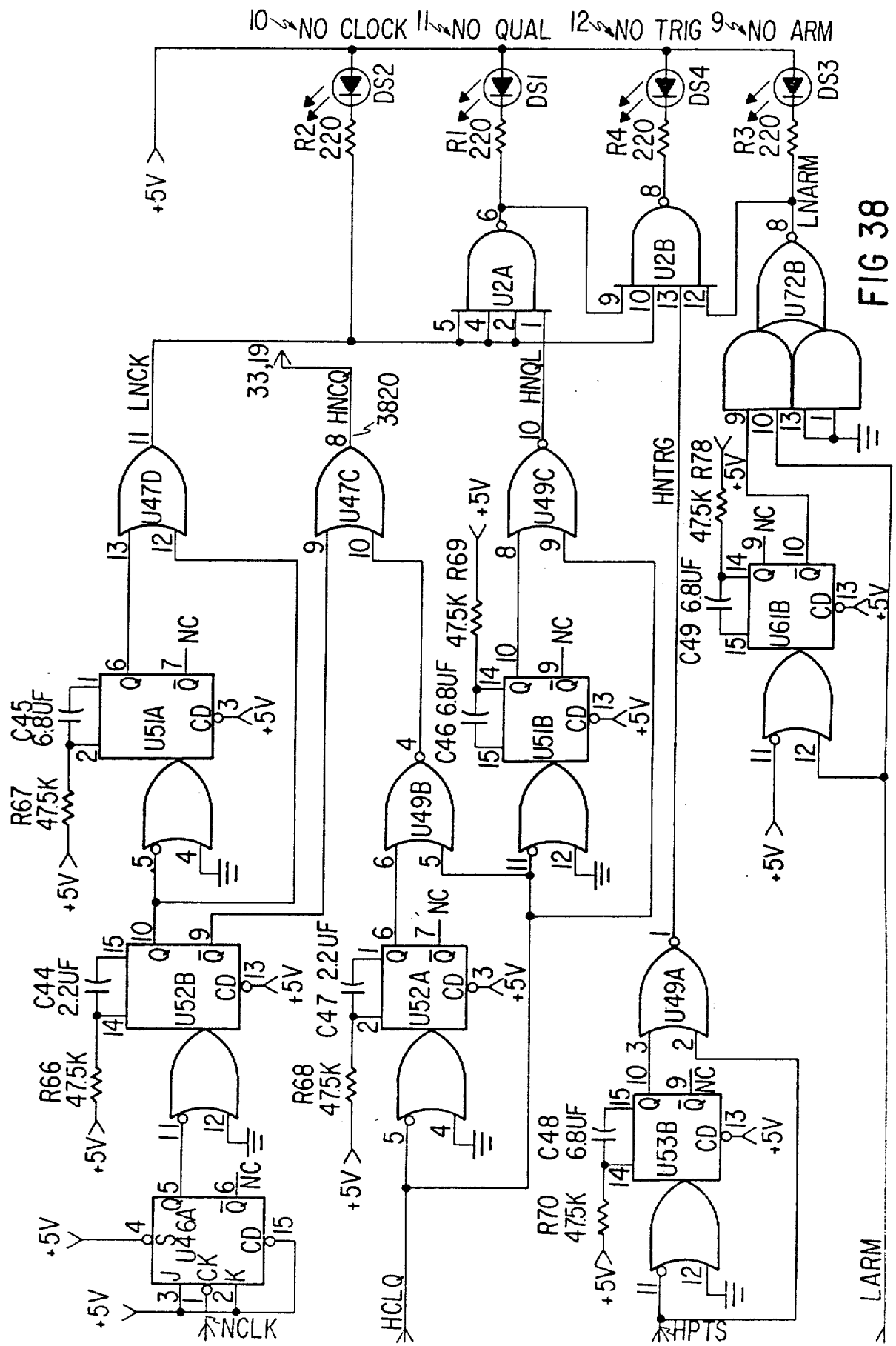
FIG. 38 is a schematic diagram of the indicator light control circuitry of the preferred embodiment.
Figure 39:
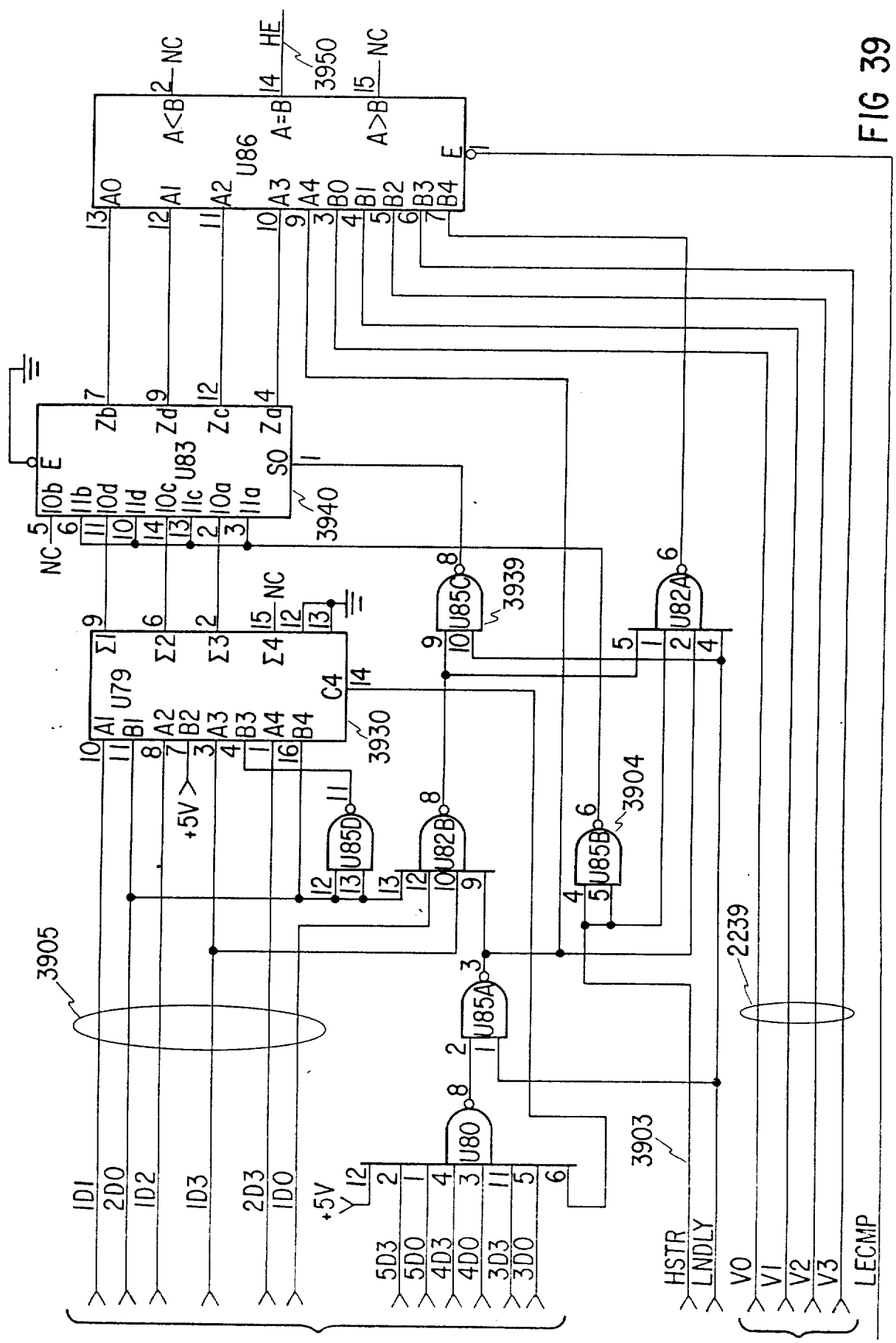
FIG. 39 is a schematic diagram of the word intensify circuitry of the preferred embodiment.
Figure 40:
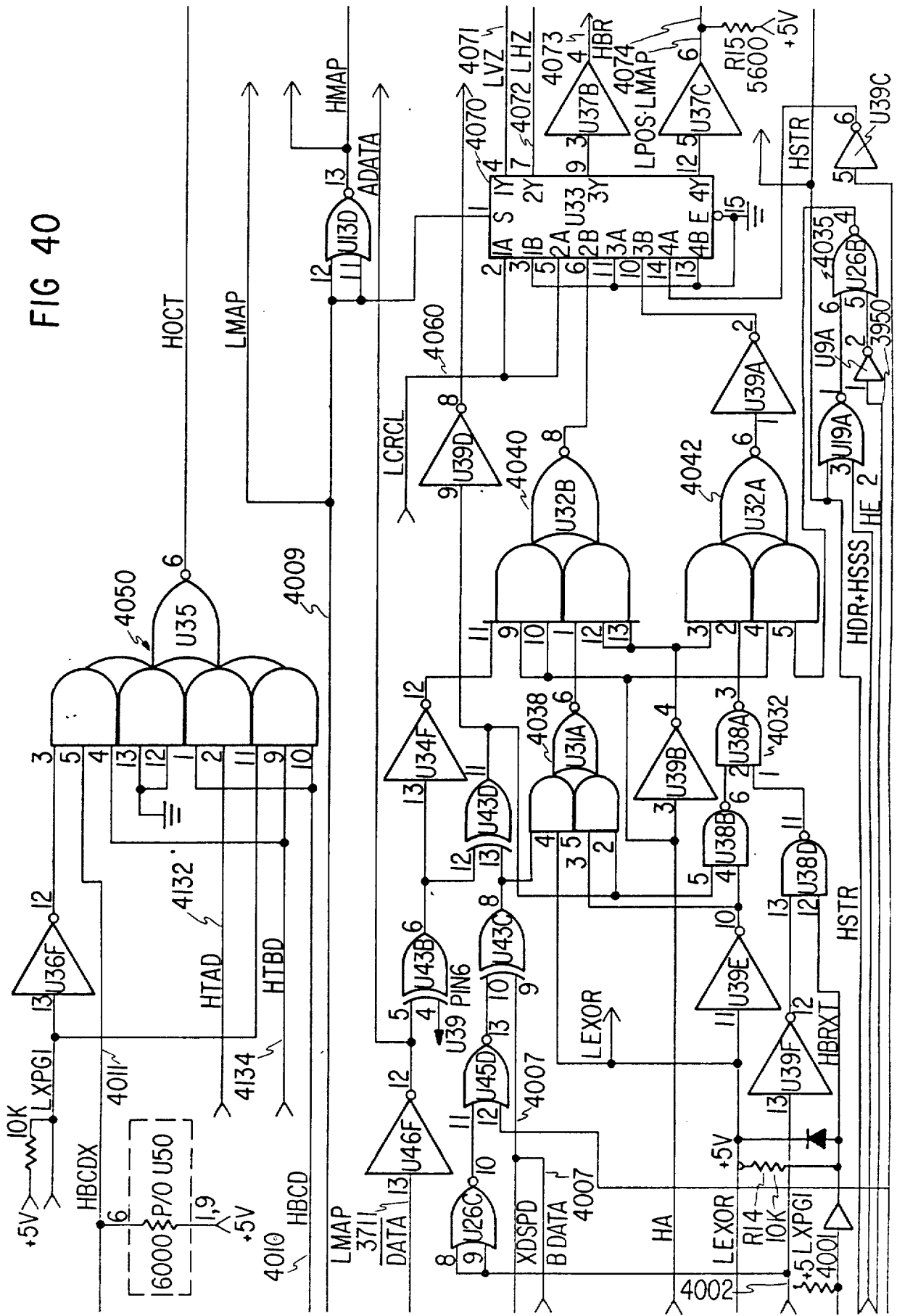
FIG. 40 is a schematic diagram of the data routing and multiplexing circuitry of the preferred embodiment.
Figure 43B:
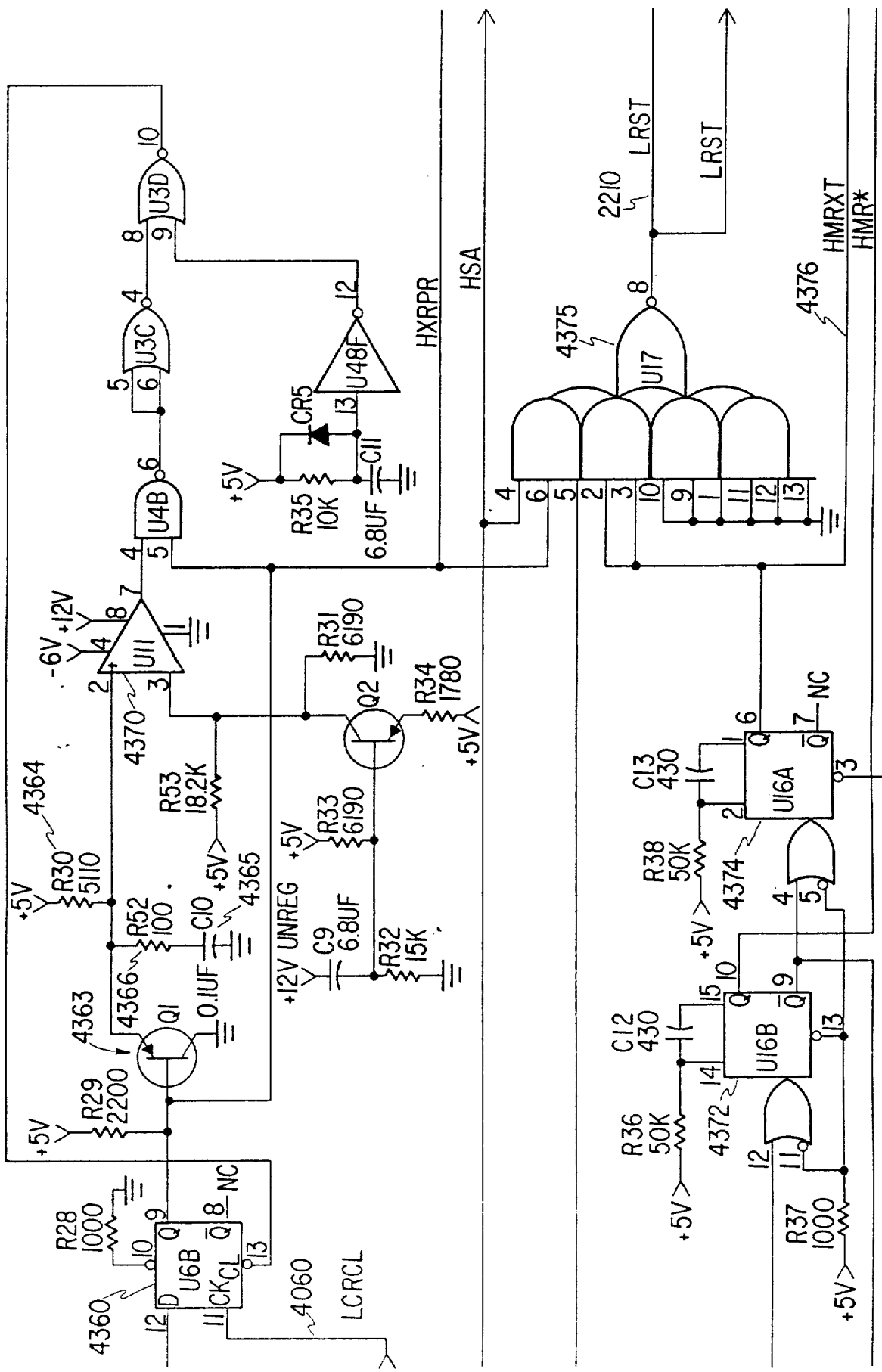
Figure 44B:
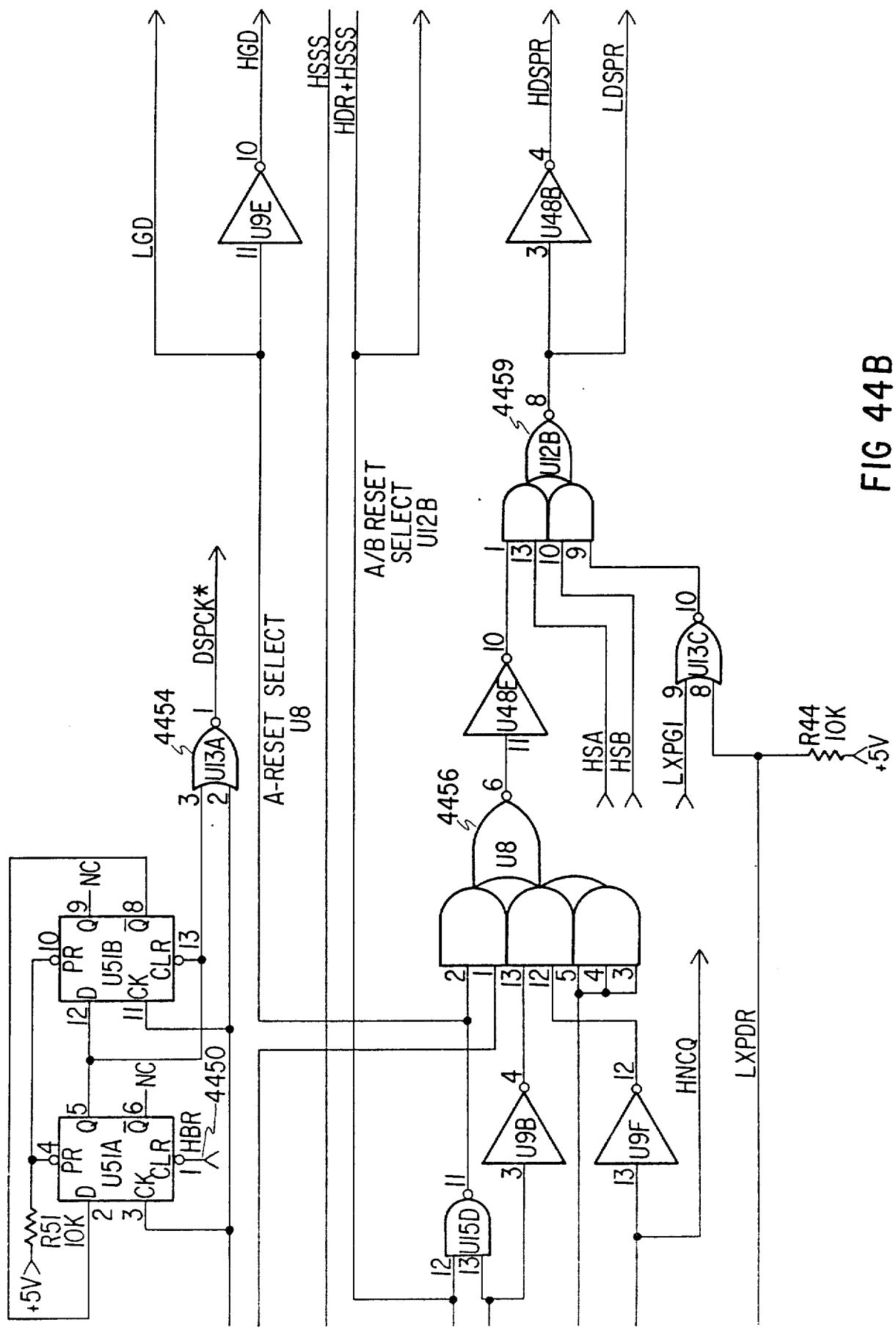
Figure 45B:
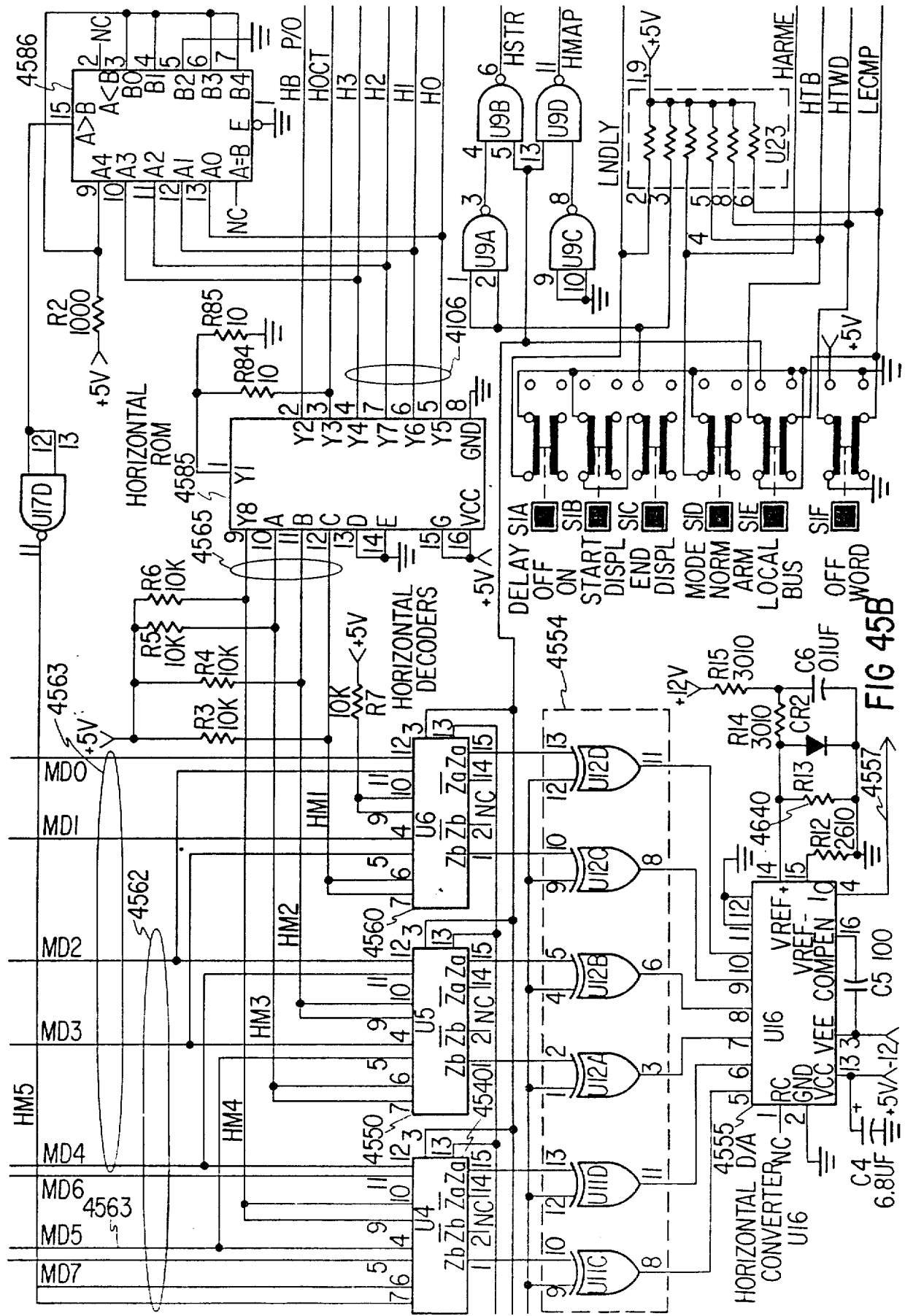
Figures 46, 46A:
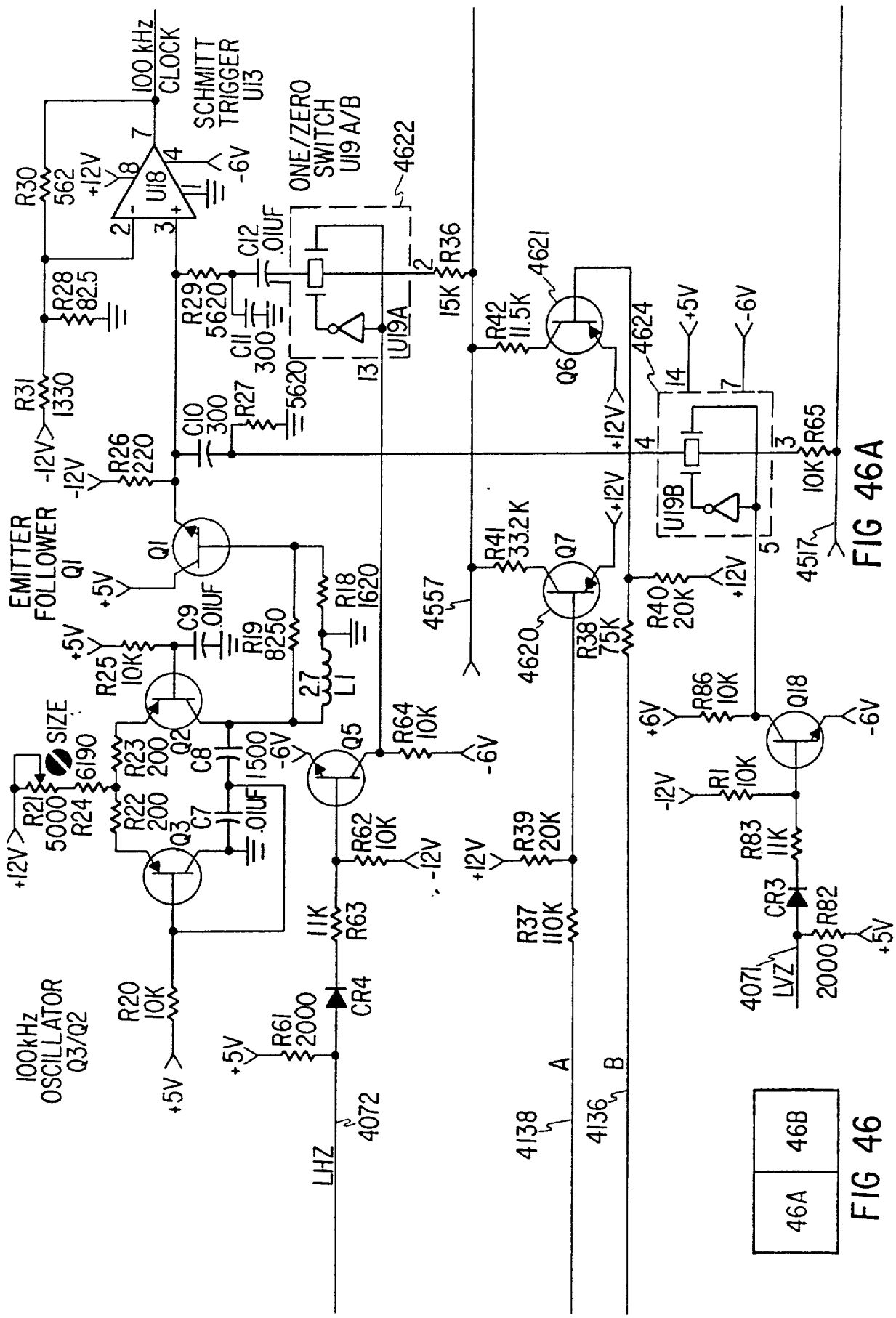
FIG. 46 shows the relationship of FIGS. 46A and 46B.
FIGS. 46A and 46B taken together are a schematic diagram of the analog output amplifiers of the preferred embodiment.
Figure 47B:
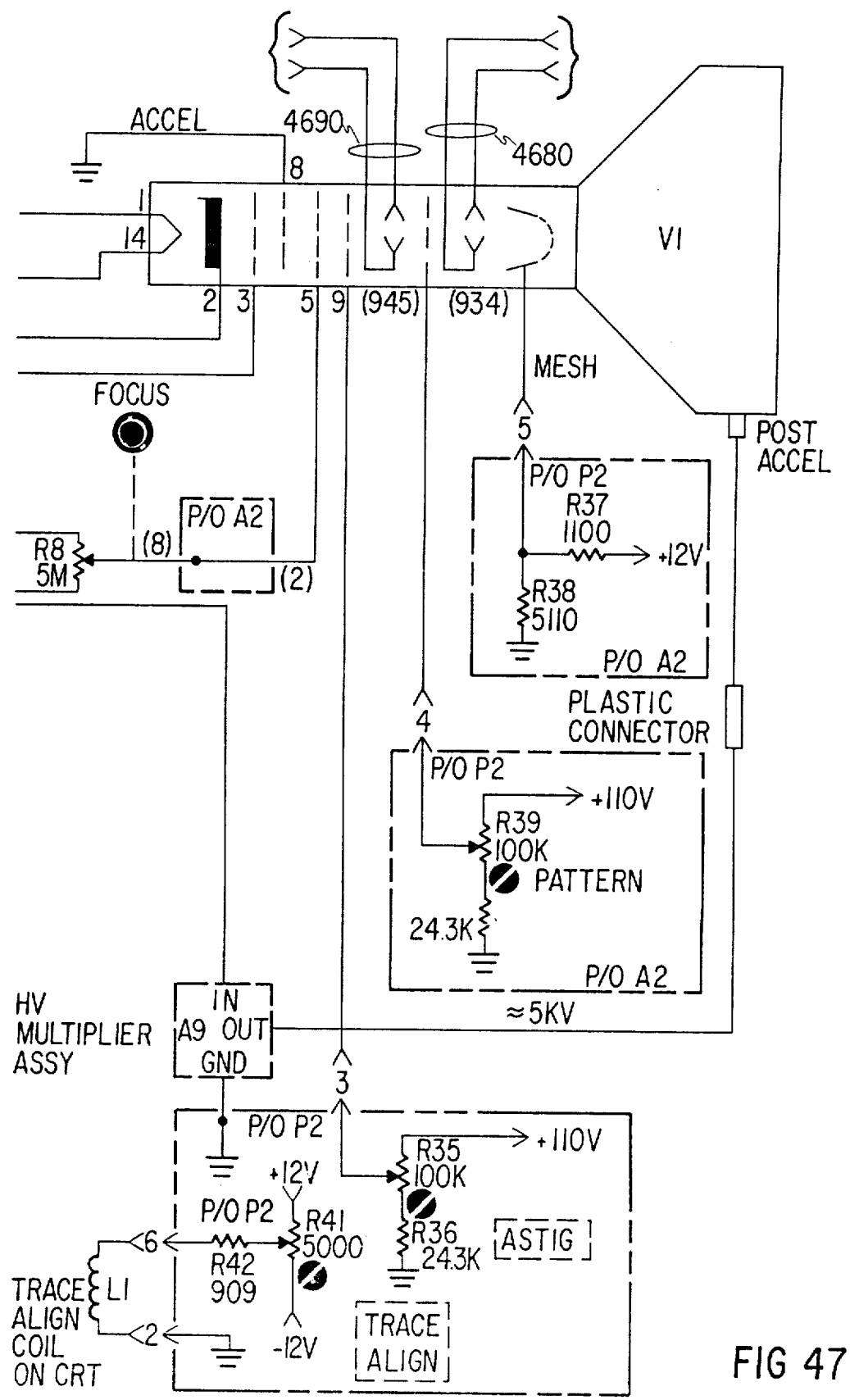

| Element in Figures 11A and 11B | Relevant Figures For Further Details |
| --- | --- |
| 1103 | Figure 47 |
| 1104 | Figures 28, 29 |
| 1105 | Figures 20, 30 |
| 1106 | Figure 31 |
| 1107 | Figures 26, 27, 32 |
| 1108 | Figures 21, 33 |
| 1109 | Figure 34 |
| 1110 | Figures 22, 35, 36 |
| 1111 | Figures 28, 29 |
| 1112 | Figure 37 |
| 1113 | Figure 38 |
| 1114 | Figure 39 |
| 1115 | Figure 40 |
| 1116 | Figure 41 |
| 1117 | Figures 25, 42 |
| 1118 | Figure 43 |
| 1119 | Figures 23, 44 |
| 1120 | Figures 24, 45 |
| 1121 | Figures 24, 46 |

Figure 16:
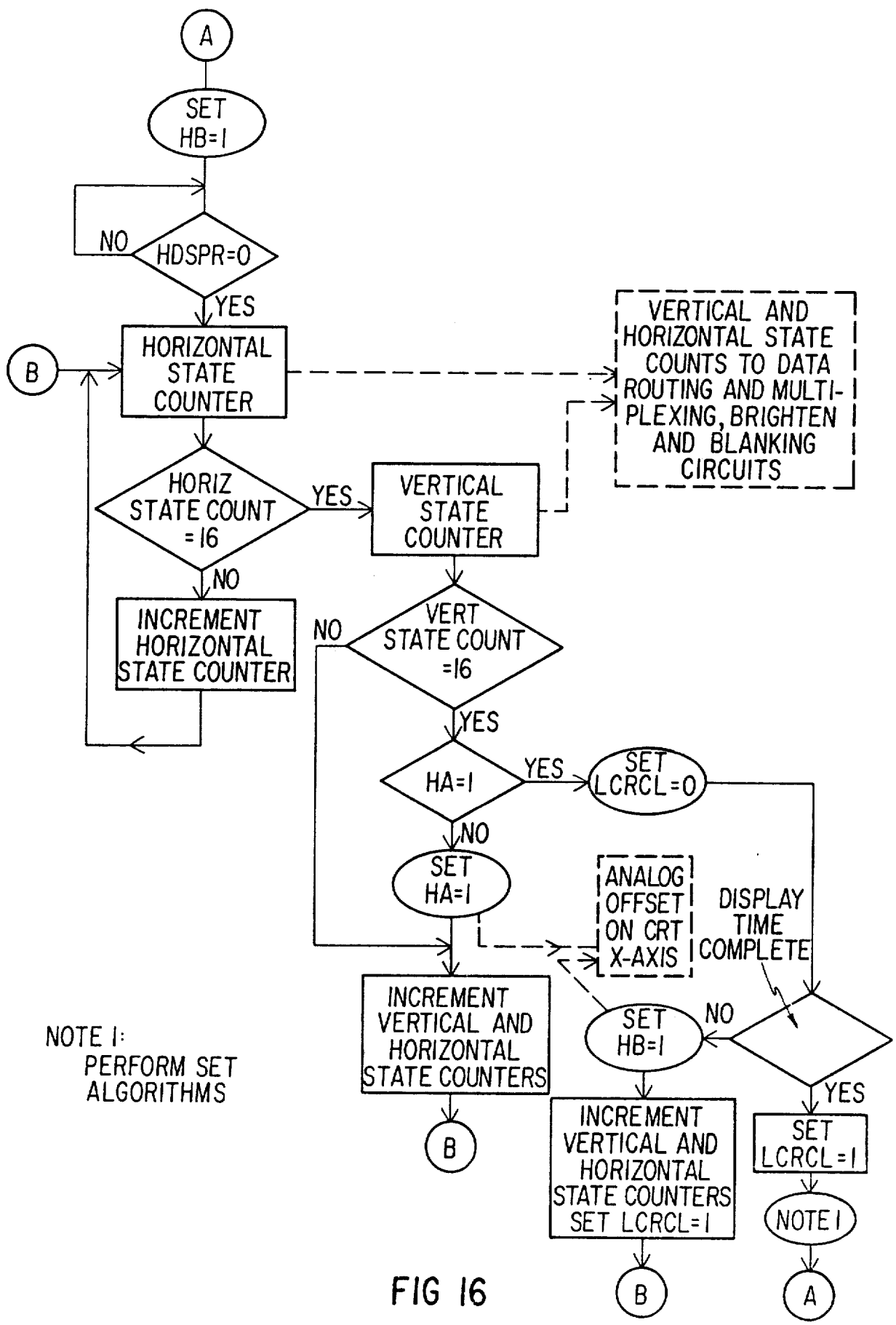
FIG. 16 shows the functional sequence of events during the display cycle in the display mode.
Figure 17:
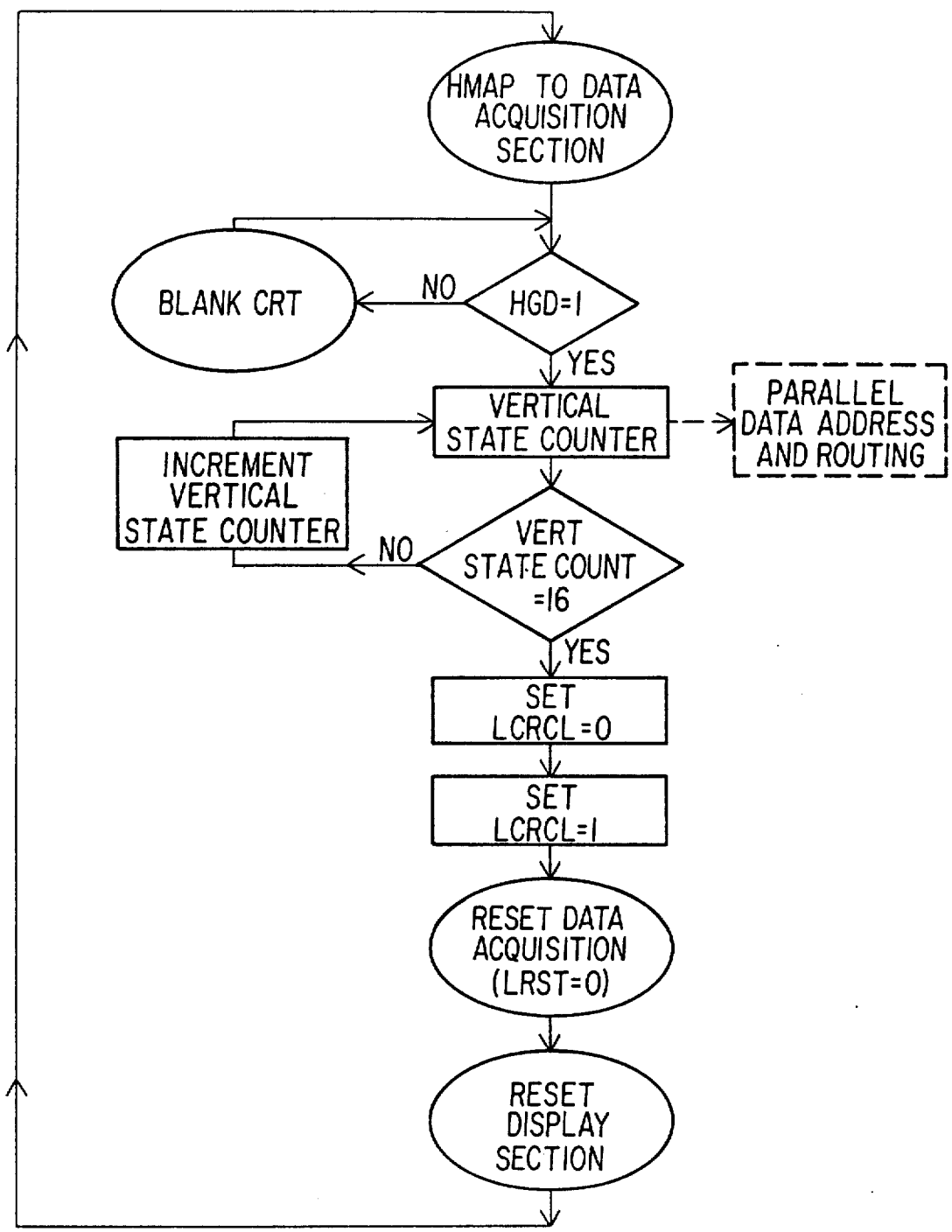
FIG. 17 shows the functional sequence of events during the map display mode.
Figure 18:
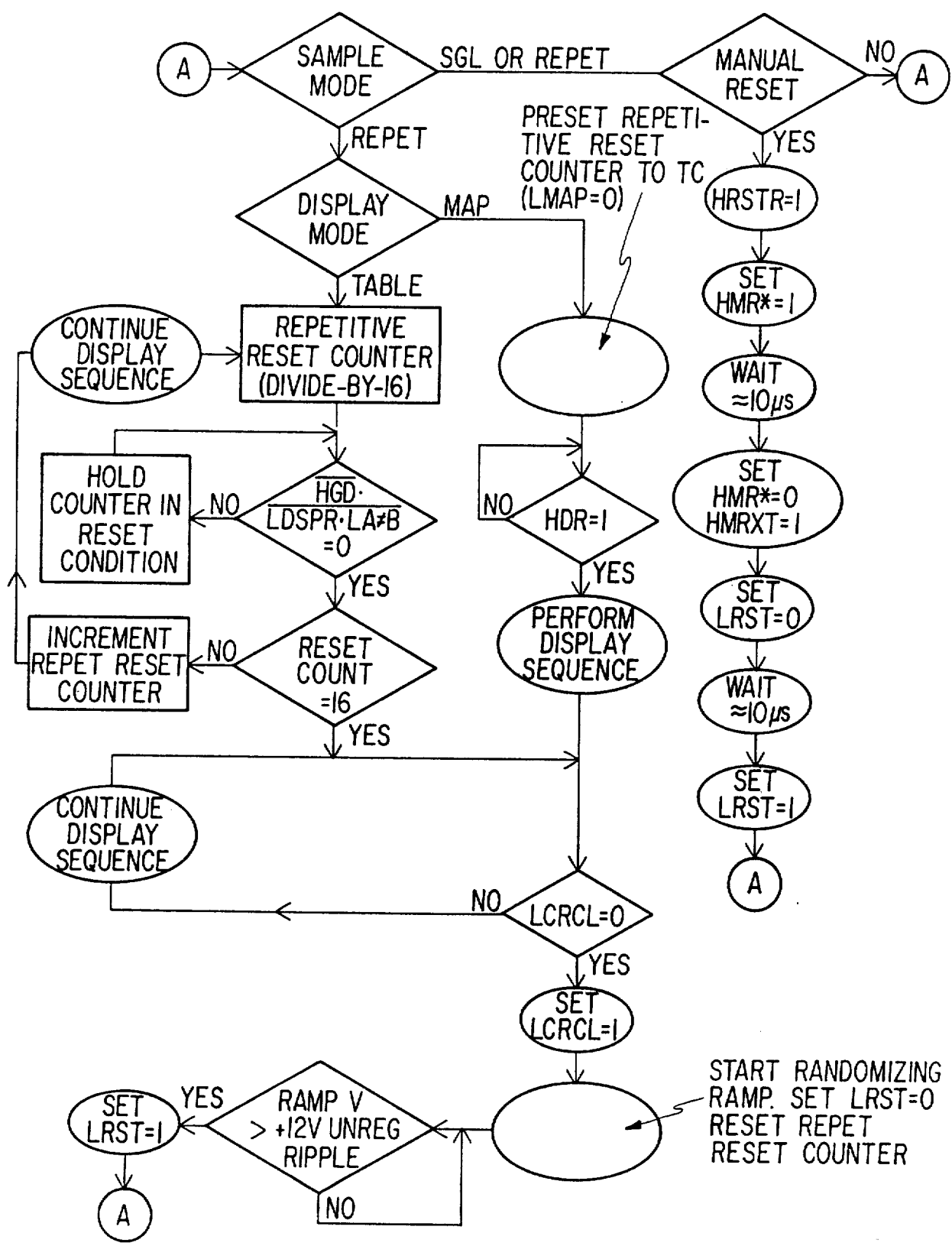
FIG. 18 shows the functional sequence of events during the data acquisition mode.
Figure 19:
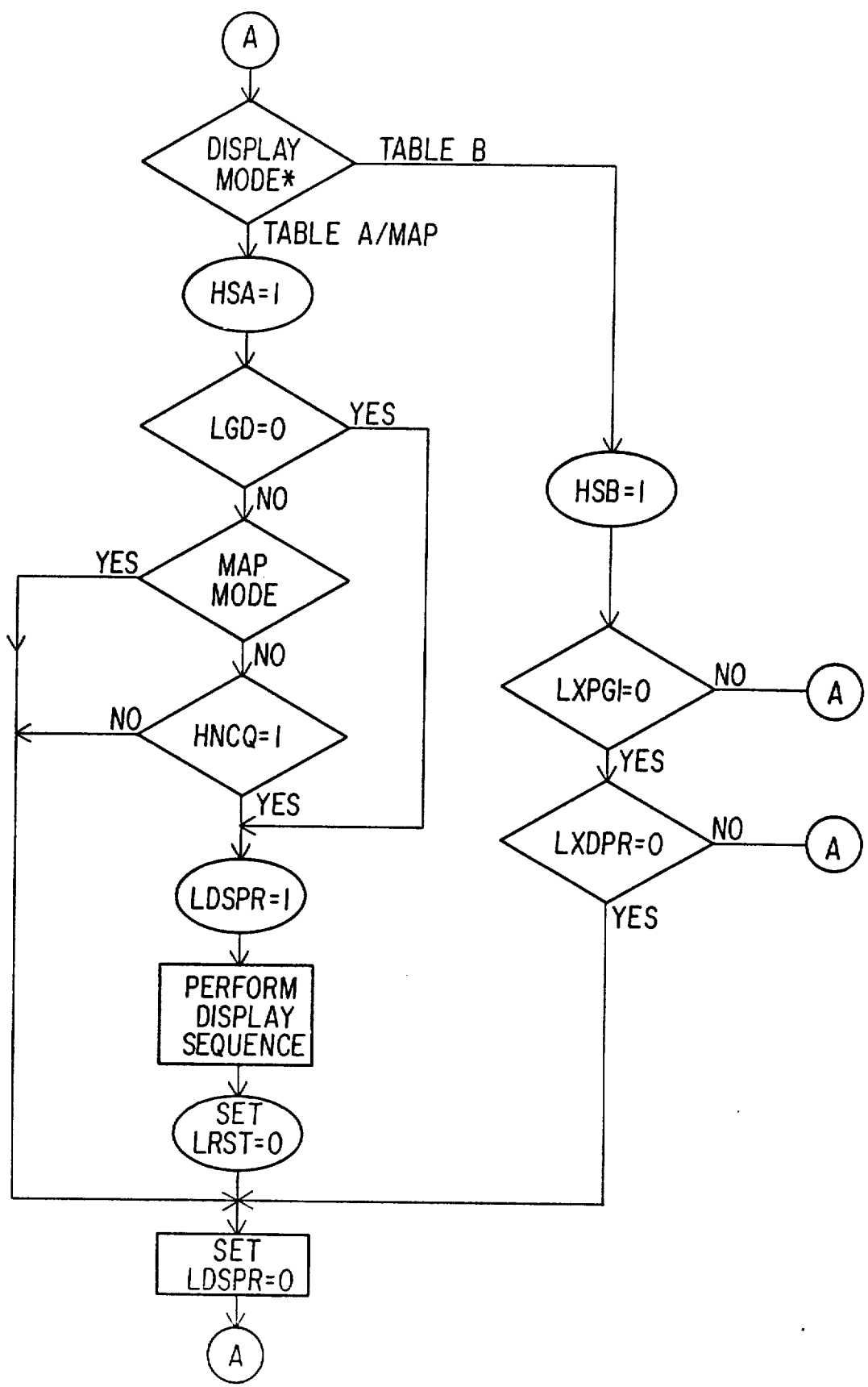
FIG. 19 shows the functional sequence of events performed by the circuitry of the preferred embodiment to reset the display.

FIGS. 23, 24 and 25 are functional block diagrams of the display circuitry of the preferred embodiment. These circuits perform the functional sequence of events shown in FIG. 16 when in the tabular display mode and perform the functional sequence of events shown in FIG. 17 when in the map display mode. In addition, the data acquisition circuitry shown in FIG. 11A is reset by signals from reset circuitry 1118. Reset circuitry 1118 performs the functional sequence of events shown in FIG. 18. Display reset circuitry 1119 performs the functional sequence of events shown in FIG. 19 and controls the resetting of the display device and its related circuitry. Further details of this circuitry will be discussed below.

DESCRIPTION OF DATA INPUT, TEMPORARY STORAGE AND PATTERN RECOGNITION BLOCK DIAGRAM

Referring now to the block diagram of FIG. 20, there is shown the logical elements of the data input, temporary storage and pattern recognition circuitry of the preferred embodiment. Data is received on data input lines 2010, and compared with the voltage level of a threshold signal on line 1153. Clock input signals are received on a line 2011 and are also compared with the voltage level of the threshold signal on line 1153. Slope select circuitry 2013 determines which transition of the input clock signal on line 2011 will be used to transfer data into the temporary data storage register 2016 and provides two buffered clock signals, i.e., signal PCLK on a line 1156 and signal NCLK on a line 1155. When an appropriate clock signal is received, representations of the data input signal on line 2014 will be clocked into the temporary storage register 2016. The temporary storage register 2016 provides electrical representations of the data word on lines 2020 and also provides electrical representations of the complement of the data word on lines 2022. The pattern recognition gates 2030 compare the trigger word and qualifier switch settings with the input data and qualifier signals on lines 2020 and 2022. When a match occurs, a signal HBTRG on a line 1171 and a signal HLTRG on a line 1173 are produced after the occurrence of a signal LΔT on a line 1161. The trigger bus signal on a line 1164 is wire-OR'ed with signal HBTRG on line 1171. Detailed schematic diagrams of these circuits are shown in FIGS. 30, 31 and 32. Note in FIG. 32A that a signal HDQ is produced on a line 2120 when the display qualifier mode is selected and the display qualifier conditions are met. This occurs when the qualifier signals on lines 3205 match the settings of the qualifier switches as indicated by the signals on lines 3203. When the qualifier status and switch settings agree, signal HDQ on line 2120 changes to a high level and remains high until either the status lines change or the qualification conditions as indicated by the qualifier switches are changed.

DESCRIPTION OF THE DIGITAL DELAY AND TRIGGER GENERATOR BLOCK DIAGRAM

Referring now to the block diagram of FIG. 21, there is shown the digital delay and trigger generator circuitry of the preferred embodiment. As shown in FIG. 11A and FIG. 34, the signal PCLK on line 1155 causes timing generator circuitry 1109 to produce various timing signals.

Figure 13:
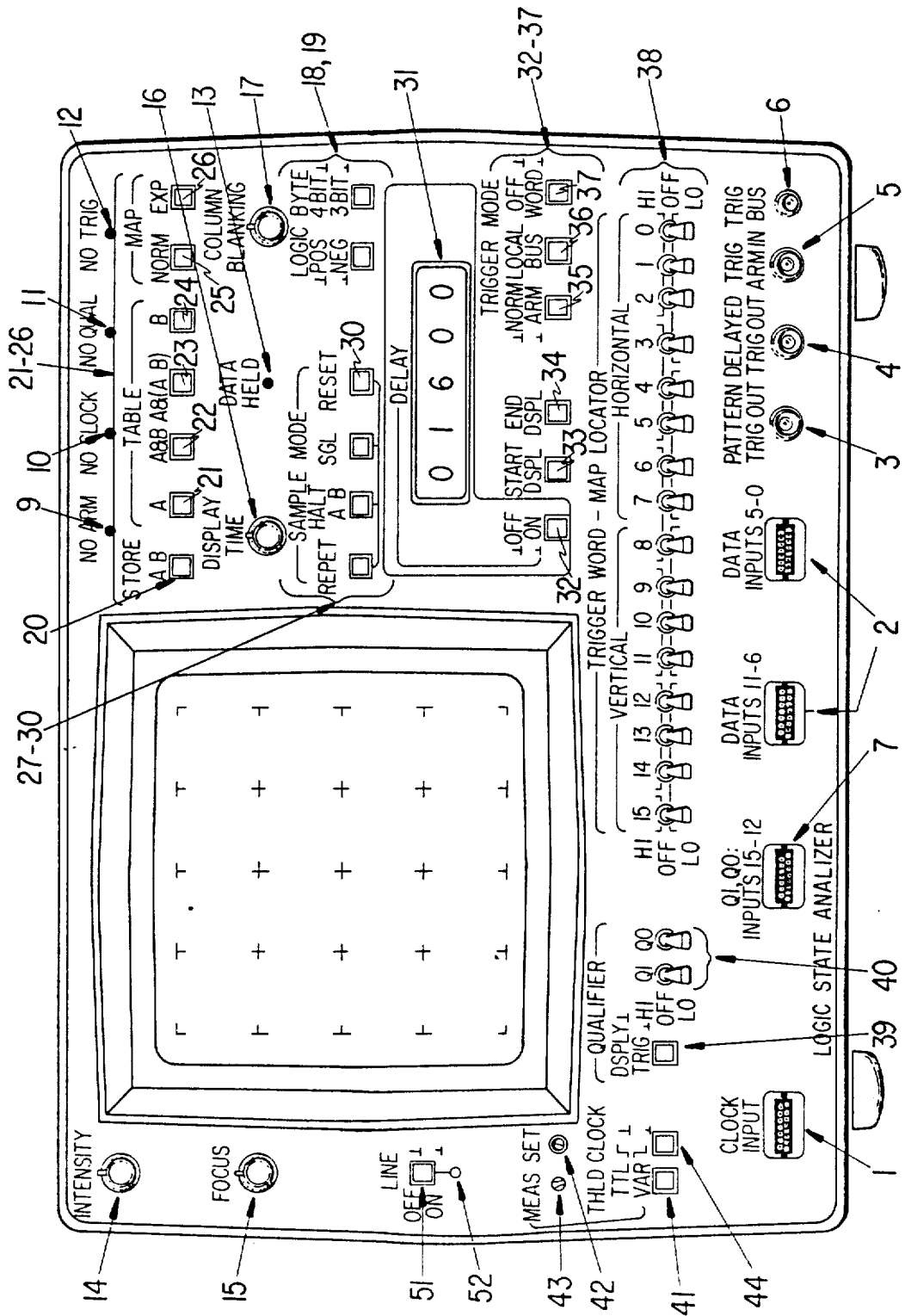
FIG. 13 shows the operator controls of a logic state analyzer in accordance with the preferred embodiment.

The circuitry receives signal HBTRG on line 1173, signal HDL on line 2110, signal HDQ on line 2120, and signal HLTRG on line 1173. An arming input signal is received on a line 2130 from the trigger arming input connector 5 shown in FIG. 13. This signal may be required for the setting of a bus flip-flop 2135 and a local flip-flop 2140, if the arm control switch 35 has been activated as described above. If trigger bus synchronization via trigger bus connector 6 has been selected by switch 36, as shown in FIG. 13, bus flip-flop 2135 must be enabled before subsequent operations will take place. Once pattern recognition occurs, signal HLTRG on line 1173 will be clocked into local flip-flop 2140. If the bus trigger mode is selected, the rising edge of signal HBTRG on line 1171 will set bus flip-flop 2135. When both flip-flops 2135 and 2140 are set, signal HB on a line 2145 and signal HL on a line 2150 will be generated.

These signals enable delay generator 2160 and produce a signal PT on a line 2170. If the delay generator 2160 is set to zero, the signal PT on line 2170 and a signal DT on a line 2165 are generated when local flip-flop 2140 and bus flip-flop 2135 are set. For delays other than zero, the signal PT on line 2170 will go high when the bus and local flip-flops are set, and will remain high while the delay generator is running. When the delay has timed out, a signal HDC on a line 2175 will be generated. The amount of delay produced by delay generator 2160 is controlled by the signals on line 2159 from the delay switches 31. These timing signals are utilized by the memory and data index control circuitry, a block diagram of which is shown in FIG. 22.

TRIGGER GENERATOR AND DELAY GENERATOR CIRCUITRY

The schematic diagram of delay generator 2160 and related circuitry is shown in FIGS. 33A and 33B. The delay generator consists of two sections: a unit decade counter 3310 and four upper decade counters 3311, 3312, 3313 and 3314, as shown in FIG. 33B. When the local flip-flop 2140 and bus flip-flops 2135, shown in FIG. 33A are enabled, the signals HB and HL will be true and counter 3310 will be enabled. The clock signal for counter 3310 is a signal on a line 2320. This signal is produced in response to the signals HDQ on line 1171 and the signal HDL on a line 2330. When counter 3310 reaches a count of 8, a signal is produced on a line 3340. This signal is coupled to gate 3345 to produce the clock for the upper decade counters 3311, 3312, 3313 and 3314. When the upper decade counters have reached terminal count, a signal is produced on line 3315 which causes flip-flop 3355 to be set. Flip-flop 3354 is then set on the next clock cycle after counter 3310 reaches state 8 and the signal HDC on a line 2175 is generated.

The decade counters shown in FIG. 33B are controlled in such a way that they begin counting for the next delay period as soon as the preceding delay period has ended. When the signal on line 3315 is produced, decade counter 3311 counts eight more cycles, setting its Q3 output high. This causes gate 3360 to generate an enable signal on line 3361 to enable the upper decade counters 3311, 3312, 3313 and 3314. When the terminal count is again reached by counter 3310 and the terminal count signal is produced on a line 3309, flip-flop 3355 will be enabled to change states in response to the signal from gate 3352. The setting of flip-flop 3355 indicates that the upper decade counters have reached terminal count. When the Q3 output of counter 3310 goes low, the upper decade counters 3311, 3312, 3313, 3314 of the delay generator will be preset to the nines complement of the delay switch settings on lines 2159.

Functionally, flip-flops 3354 and 3355 can be viewed as state nine of the tens decade counters, and the units decade counter, respectively. Assume the delay switches 31 are set to 90, the upper decade counters count 80 clock cycles and then are preset in response to the signal on line 3361. Flip-flop 3355 is latched, retaining the fact that the upper decade has reached terminal count. Units counter 3310 counts to eight and is then preset by the signal on line 3353. While counter 3310 is being preset, flip-flop 3354 performs the last count for the units decade. Therefore, the delay generator is ready to count again on the next clock pulse.

When the upper decade of the delay switches 31 are set to zero, a gate 3378 sets the mark $\overline{Q}$ output of flip-flop 3355 high. Thus, signal HDC on line 2175 is produced as soon as the units decade completes its count.

When all delay switches 31 are set to zero, gate 3380 produces a signal on line 3381 which causes gate 3354 to hold the signal HDC on line 2175 high. When the delay on off switch 32 is set to off, the signal LNDLY on a line 3383 will cause the signal HDC on line 2175 to be held high.

The trigger generator circuitry shown in FIGS. 33A consists of trigger arm flip-flop 3390, bus flip-flop 2135, local flip-flop 2140, and related logic circuitry. When normal/arm switch 35 is set to the normal position, a signal LARM on a line 3391 is held in the low state and a signal HARM on a line 3392 is held in the high state. When switch 35 is set to the arm position, the receipt of an external arm pulse via connector 5 will clock arm flip-flop 3390, thereby generating the signals on lines 3391 and 3392. When these signals are true, local flip-flop 2140 and bus flip-flop 2135 are enabled to operate until a trigger word is detected, i.e., when signals HB and HL on lines 2145 and 2150 are in the high state and the delay time selected has been completed, as indicated by signal HDC on line 2175 going high.

Signals HB and HL on lines 2145 and 2150 cause gate 3395 and gate 3396 to generate the signal PT on line 2170 and to generate the signal DT on line 2165. The presence of both signal HB on line 2145 and signal HL on line 2150 presets flip-flop 3397 and causes the generation of a signal HPTS on a line 3398. The signal HPTS is used to indicate the presence of a trigger condition, and is used to control trigger indicator 12. Flip-flop 3397 is cleared whenever signal HB or signal HL is in the low state.

At the completion of the digital delay selected by delay switches 31, a gate 2146 causes the generation of the signal DT on line 2165. The signal DT remains high for about 25 nanoseconds, as determined by capacitor 2147. The trailing edge of the signal DT terminates the PT signal on line 2170. Flip-flops 2135 and 2140 are reset by the generation of signal DT.

In FIG. 33A there is also shown the circuitry used to synchronize the data acquisition operations. One-shots 3320, 3324 and 3328 generate a timing sequence which permits digital delay and trigger generator circuitry 1108 to a state of readiness for a trigger to occur. These one-shots also force the delay switch settings on switch 31 to be loaded into decade counters 3310, 3311, 3312, 3313 and 3314. On the leading edge of signal LRST, one-shot 3320 provides a pulse of approximately one microsecond in width. This disables the clock signal on line 2320, produces a signal HRES on a line 3325 that resets local flip-flop 2140, bus flip-flop 2135, trigger arm flip-flop 3390, terminal counter flip-flops 3354 and 3355, and also enables parallel input to the decade counters 3310, 3311, 3312, 3313 and 3314.

During the time signal HRES on line 3325 is high, signal HRECL on a line 3329 clocks the delay generator circuitry through a gate 3330 and a gate 3345. Also, at this time the nines complement of the delay switches 31 is loaded into the decade counters 3310, 3311, 3312, 3313 and 3314.

When a map display mode is selected, the signal HMAP on a line 3331 is provided by display to the data acquisition synchronizer circuitry. This prevents signal LRST on line 2210 from resetting the delay and trigger generator circuitry. Also, in map display modes, the delay and trigger generators function independently from the display section, as described later.

TIMING GENERATOR CIRCUITRY

In FIG. 34, there is shown the timing generator circuitry of the preferred embodiment. The timing generator circuitry provides four timing signals used in the data acquisition section. Note that these timing signals are all generated in response to signal PCLK on line 1155. As described above, this signal is generated from signals received via the clock probes 1151. The signal HΔT on a line 3410 is used in the reset circuitry for the local flip-flop 2150, as shown in FIG. 33A. The signal LΔT on line 3420 is a clock signal for the pattern recognition circuitry shown in FIG. 32, and for the memory index and control circuitry shown in FIG. 35. Signal HCL on a line 3440 is a clock signal used in the memory index and control circuitry shown in FIG. 35. Signal HDL on line 3430 is the clock for the delay generator circuitry shown in FIG. 33. The negative going edge of signal LΔT remains low for an interval of time determined by transistor array 3419, and a variable resistor 3418, a fixed resistor 3417, and a variable capacitor 3416. Shortly before the positive going transition of signal LΔT on line 3420, the output of transistor array 3419 clocks a flip-flop 3439 and a flip-flop 3409 to the reset state. The $\overline{Q}$ output of flip-flop 3439 goes high, generating signal HCL on line 3440. Signal HCL remains high for 25 nanoseconds. Shortly after the leading edge of signal HCL, signal HDL on line 3430 will also go high. The negative going transition of signal HDL occurs 5 nanoseconds before the negative going transition of signal HCL. The widths of these timing signals and their time relationships are determined by variable capacitor 3416 and variable resistor 3418 for signal HΔT on line 3410, a variable capacitor 3426 for signal HDL on line 3430, and a variable capacitor 3436 for signal HCL on line 3440.

All circuits in the timing generator operate in the following manner. When the input to their respective transistor array 3419, 3429 and 3439 goes low, the emitter voltage ramps downward at a rate determined by the RC network coupled to the common emitter node of the transistor arrays. The ramp continues to drop in voltage until it reaches the threshold voltage minus the $V_{BE}$ value of the second transistor in the pair. In the preferred embodiment, the threshold voltage is 0.5 volts, and is supplied by circuitry associated with a transistor 3450. When the emitters reach threshold voltage minus $V_{BE}$, the undriven transistor turns on. The collector of the undriven transistor then goes low and presets its respective flip-flop. Flip-flop 3409 is an RS flip-flop and is coupled to transistor array 3419. Flip-flops 3428 and 3439 are JK flip-flops and are coupled to transistor arrays 3429 and 3439, respectively.

As soon as the input flip-flop is preset by the transistor array, the input signal to the transistor array goes high, pulling the common emitter modes to a high voltage. When this happens, the undriven transistor turns off and the timing generator waits until another PCLK signal on line 1155 is received. The above sequency is then repeated for each PCLK signal received on line 1155.

THE A MEMORY AND DATA INDEX AND CONTROL CIRCUITRY

In FIG. 22 there is shown a block diagram of the A memory, and the data index and control circuitry 1110. As described above, the display circuitry will generate signal LRST on line 2210 any time the data acquisition operation should be initiated. The signal LRST presets a data index counter 2214, a start flip-flop 2211, and an end flip-flop 2212. When a qualified clock is detected, as indicated by the signal HDQ on line 1171, the memory address lines 2230 are switched via address switch 2235 to write address counter 2237. Each time signal LWE in line 2217 is true, one word is written into memory 2250. At the trailing edge of signal LWE, right address counter 2237, and data index counter 2214 are incremented and memory address lines 2230 are switched back to the display or computed address on lines 2241.

In the start of the display mode, the data index counter 2214 is incremented by signal LWE only after the start flip-flop 2211 is set. The start flip-flop 2211 is set when a trigger word is detected and any selected digital delay has been completed by digital delay and trigger generator circuitry 1108, as described above in FIG. 33. When data index counter 2214 reaches terminal count, end flip-flop 2212 will be set and cause HDR flip-flop 3620 to generate the signal HDR on line 3621. This signal indicates that memory data is completed and will initiate a display cycle.

When the end display mode is selected by operator switch 34, start flip-flop 2211 is preset and enables data index counter 2214 to increment prior to trigger word recognition. When data index counter 2214 reaches terminal count, end flip-flop 2212 is enabled to receive a trigger. After terminal count is reached, the occurrence of a trigger condition generates the signal HDR on line 3621 and a display cycle is begun.

Data index counter 2214 keeps track of the number of valid words written into the memory. The write address counter 2237 points to the next address in memory to be written into. The difference between the contents of these two counters is computed by circuit 2240 to determine where the first word in memory is located. This computed first word address is added to the vertical state count on lines 2239 to determine the address of words to be read from memory during the display cycle.

When the display qualified clock rate, as indicated by signal HDQ on line 1171, drops below 30 Hz during the data acquisition cycle, the partial display mode is enabled. A vertical state count on lines 2239 reads partial memory data from the A memory 2250 through circuits 2240 and 2242. When the vertical state count on lines 2239 exceeds the data index count in data index counter 2214, i.e., it addresses invalid data, comparator circuit 2242 provides a signal HVGT on a line 2243 to the display circuits. Signal HVGT blanks the CRT display so that only valid data is displayed.

In FIG. 35 there is shown the schematic diagram of the A memory circuitry. The A memory consists of four random access memory modules, 3528, 3530, 3532 and 3534. Data is received from the temporary storage flip-flops on lines 2020. Write address counter 2237 addresses the memory modules during a write operation. The computed address on line 2241 addresses the memory circuits during a read operation. Gates 3554, 3555, 3556 and 3557 comprise memory address switch 2235 and supply either the computed address on lines 2241 or the write address from write address counter 2237.

Memory address switch 2235 is controlled by several signals. When a signal LDR on a line 3510 is low and a signal HDR on a line 3520 is high, indicating the preferred embodiment is in a display cycle, memory address switch 2235 gates the computed address to the memories 3528, 3530, 3532 and 3534. When the preferred embodiment is in a data acquisition cycle, address selection is a function of the clock rate and the display qualifiers. If signal HDQ on line 1171 or a signal HSWA on a line 3562 is low, memory address switch 2235 will gate the computed address on line 2241 to the memory modules. If signal HDQ and signal HSWA are both high, memory address switch 2235 will gate the write address on lines 2238 to the memory circuits.

The signal HSWA is generated by flip-flop 3563. This flip-flop is controlled by a signal LWE1 on a line 3566 and signal L$\Delta$T on line 1161. Signal L$\Delta$T presets flip-flop 3563, thereby generating the signals HSWA and a signal LSWA on a line 3561. The signal LWE1 goes low shortly after the positive going edge of signal L$\Delta$T. On the positive going edge of signal LWE1, flip-flop 3563 is clocked, forcing signals HSWA and LSWA to the low state. Data stored in the temporary storage flip-flops is received on lines 2020 and written into the memory circuits during the time interval that the signals LWE1 is low and HSWA are high. The pulse width of the signal HSWA is approximately 60 nanoseconds.

The memory operation described above can occur only at clock rates less than 15 MHz. When the display qualified clock rate exceeds 15 MHz, the pulse width of signal L$\Delta$T overlaps pulses of signal LWE1 and flip-flop 3563 is never cleared. In that case, the signals HSWA and LSWA would remain in the true state, i.e., signal HSWA would remain high and signal LSWA would remain low.

In FIG. 36 there is shown the data index and control circuitry for the A memory circuits shown in FIG. 35. At the end of the display cycle, signal LRST on line 2210 resets the data index and control circuits and initializes a data acquisition cycle in the following manner. The trailing edge of signal LRST clocks flip-flop 3630 and causes the generation of signal LRHS on a line 3632. Signal LRHS resets start flip-flop 2211 and presents a low signal to the J input of flip-flop 3638. The signal HR1 on line 3631 presents a high to the J input of flip-flop 3635 and the K input of flip-flop 3638. The signal HR1 is also routed to the display section where it performs several functions, as described later.

The first occurrence of the signal L$\Delta$T on line 1161 after the occurrence of the signal LRST on line 2210 sets JK flip-flop 3635. The $\overline{Q}$ output of flip-flop 3635 resets end flip-flop 2212. The negative going transition of the first occurrence of the signal LWE after the signal LRST clocks the Q output of flip-flop 3638 to the low state. The Q output of flip-flop 3638 then resets the data index counter 2214 and stops the clock to the terminal counter flip-flop 3670. The signal LWE2 presets flip-flop 3630 and clears flip-flop 3611. At the trailing edge of the occurrence of signal LWE2, the signal HWE on a line 3619 clears flip-flop 3620 which generates the signal HDR on line 3621 to the low state. This causes the K input of flip-flop 3630 to go low and prohibit any additional occurrences of the signal LRST from being processed.

On the next occurrence of signal L$\Delta$T on line 1161, flip-flop 3635 is cleared on the negative going transition. Thereafter, on the negative going transition of signal LWE2, flip-flop 3638 is cleared. This releases the data index counter master reset signal on a line 3639. Signal LWE2 also enables gate 3606, allowing the signal HDL to be passed therethrough.

DISPLAY MODE OPERATION

In the start of a display mode, signal HSTR on a line 3617 enables start flip-flop 2211. When the signal LRHS on a line 3632 is high and a trigger word is detected, indicated by the simultaneous presence of the signals HB, HL and HDC, flip-flop 2211 is set. The signals LTRG on line 3614 and signal HTRG on line 3615 are in the active state. The signal HTRG enables data index counter 2214 to start counting qualified clock signals. When data index counter 2214 reaches a count of 14, it is detected by AND gate 3634, which applies a high level to the input of JK flip-flop 3670. On the next clock received after a count of 14 is reached by the counter, flip-flop 3670 counts the fifteenth state.

The $\overline{Q}$ output of flip-flop 3670 supplies the parallel enable signal to data index counter 2214, thereby locking it in the terminal count state. Thus, the data index terminal count is generated by flip-flop 3670 and, at the same time, the data index counter is enabled for data entry in the parallel mode.

The signal HTC on a line 3671 is generated by flip-flop 3670. Signal HTC sets the end flip-flop 2212. The setting of end flip-flop 2212 generates signal LDR on line 3616 which prevents the further generation of signal LWE so that data can no longer be written into memory. The signal LDR indicates to display circuitry that memory is loaded with good data by presetting flip-flop 3620. The setting of flip-flop 3620 generates the signal HDR on line 3621 and causes a display cycle to begin.

In the end of a display mode, signal HSTR is low, which holds the start flip-flop 2211 set. This holds signal LTRG low and signal HTRG high; thus, the first occurrence of signal LWE2 after the occurrence of signal LRST will increment data index counter 2214. When the data index counter 2214 reaches terminal count, i.e., signal HTC is true, end flip-flop 2212 waits for the simultaneous occurrence of signal HB, signal HL, and signal HDC. When a trigger word is detected and the digital delay is complete, the simultaneous occurrence of signals HDC, HB, HL and HTC sets end flip-flop 2212, causing the generation of signal LDR on line 3616.

During the display cycle, the memory data read to the display section is addressed by the computed address on lines 2241. The computed address is derived by four-bit adders 3641 and 3681. The computed address is derived by subtracting the data index count in index counter 2214, and received via gates 3842, 3843, 3844 and 3845, from the write address count on lines 2238. The resulting difference appears on the four summation output lines of counter 3641. This difference is the address of the memory location containing the first word acquired during the data acquisition cycle. This first word address is added to the vertical state count on lines 2239 by adder 3681. The output of adder 3681 is the computed address on lines 2241, which is the sum of the first word address and the vertical state count.

During a partial display mode operation, the data index counter 2214 and write address counter 2237, shown in FIG. 35, are incremented, but the first word address will not change as long as there are fewer than sixteen words in memory. As soon as sixteen words are written into memory in the end display mode, as selected by control switch 34, shown in FIG. 13, the data index counter 2214 value becomes a fixed constant. However, the write address counter 2237 will continue to be incremented. Thus, the first word address changes. The instrument then operates in the following manner. As words are added at the bottom of the display, words are removed from the top of the display. This results in a rolling of the display on the CRT screen. As soon as the trigger word is detected, the signal LWE2 on line 3566 is removed and write address counter 2237 stops counting, as shown in FIG. 35. Thus, the output of adder 3641 becomes constant. The output of adder 3681 now changes as a function of the vertical state count on lines 2239.

Comparator 3685 compares the data index count from index counter 2214 to the vertical state count on lines 2239. Whenever the vertical state count exceeds the data index count, the signal HVGT on line 2243 is generated in the high state. Signal HVGT indicates to the display section that the data stored in the memory location currently being addressed has not been updated during the present data acquisition cycle. Therefore, the address data is invalid. The CRT is then blanked whenever the signal HVGT is true, thus preventing the display of invalid data.

Whenever a manual reset is selected by reset control switch 30, signal HMR on a line 3605 sets end flip-flop 2212, forcing the signal LDR on line 3616 to the low state. Signal HMR on line 3605 also causes flip-flop 3611 to toggle and generate the signal HRBL on line 3612. The signal HRBL forces signal HVGT to the high state. Signal HVGT will then cause the CRT screen to be blanked. The occurrence of signal HMR is followed by the generation of signal LRST on line 2210 which resets the data index and control circuitry.

Figure 37B:
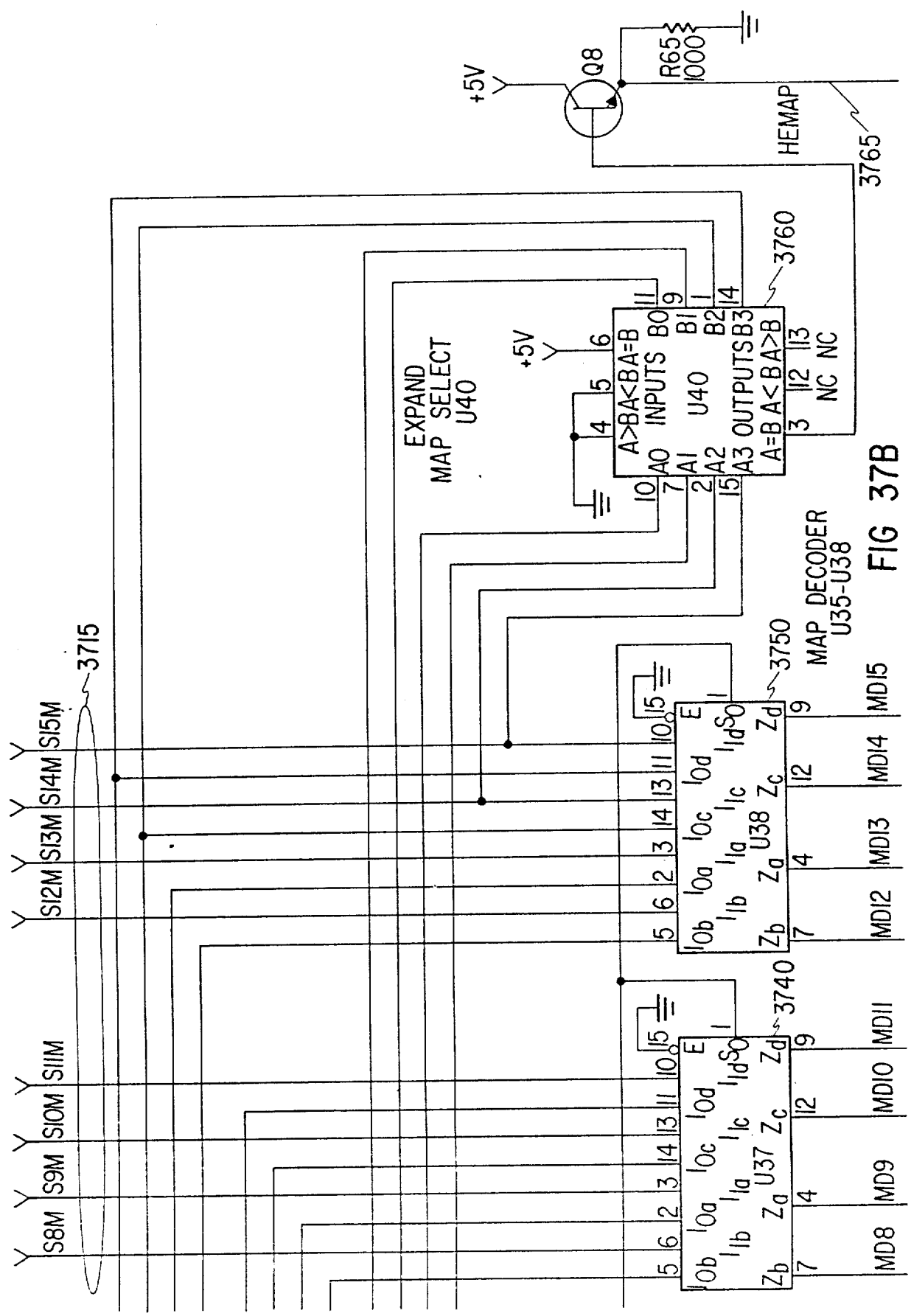

In FIGS. 37A and 37B there is shown the display data switch circuitry of the preferred embodiment. The circuitry consists of a one of sixteen data multiplexer 3710, one of two data selectors 3720, 3730, 3740 and 3750, and expand map select circuit 3760. Data multiplexer 3710 serializes the sixteen-bit word from A memory on lines 3705 for display in Table A on the CRT screen. Data multiplexer 3710 is a one of sixteen multiplexer whose four select lines are controlled by the four-bit horizontal state count on lines 3703. The horizontal state count sequences through the sixteen parallel bits on the multiplexer input and provides a serial representation of the sixteen bits at the multiplexer output on line 3711. Bit 0 is provided first, with the other bits following in numerical order.

Map data selectors 3720, 3730, 3740 and 3750 select either the data from A memory on lines 3705 or the trigger word/map locator settings as selected by trigger word switches 38 and received on lines 3715. During the first operation of a map display cycle, a signal HCRCL on a line 3701 is low. During this time map data selectors 3720, 3730, 3740 and 3750 are selecting the A memory output signals on lines 3705; and the sixteen data words thus received are written on the CRT screen. When all sixteen data words are displayed, signal HCRCL is set to the high state. Map data selectors 3720, 3730, 3740 and 3750 then point to the trigger word map locator switch values received on line 3715, enabling the preferred embodiment to write the map locator, i.e., the cursor, on the CRT screen.

Expand map comparator 3760 compares the signals on lines 3705, which represent the two most significant vertical data bits, signals AM 15 and AM 14, and the two most significant horizontal data bits, AM 7 and AM 6, of A memory data with the settings of their representative trigger word/map locator switches 38. When the data bits match the switch settings, the signal HEMAP on a line 3765 is set to the high state. Signal HEMAP controls the blanking circuit in the expand map mode. When the expand map mode is selected by control switch 26, HEMAP unblanks the CRT whenever the input data is located in the sector selected for expansion.

WORD INTENSIFYING CIRCUITRY

In FIG. 39, there is shown the word intensify circuitry of the preferred embodiment. The word intensify circuitry determines when the vertical state count on line 2239 is addressing the location in memory containing the trigger word. When the vertical state count addresses the trigger word, the word intensify circuitry provides signal HE on a line 3950 to the data routing and multiplexing circuitry, as shown in FIG. 40. The brighten control located in the data routing and multiplexing circuitry then accesses the current contrast word to be intensified whenever signal HE is high and Table A is being displayed.

Again referring to FIG. 39, there is shown a multiplexer 3940 and a four-bit adder 3930. Multiplexer 3940 and four-bit adder 3930 perform a code conversion on the signals received on lines 3905 from the delay switch 31.

Adder 3930 performs the following addition of the delay switch outputs on lines 3905:

$$\text{Carry (C4)} \pm \frac{\begin{array}{cccc} & 2D3 & 1D3 & 1D2 & 1D1 \\ & 2D0 & 2D0 & 1 & 2D0 \end{array}}{\Sigma 3 \quad \Sigma 2 \quad \Sigma 1}$$

where 1D1-1D3 are units-decade switch output bits 1-3, and 2D0, 2D3 are tens-decade switch output bits 0 and 3.

The outputs of adder 3930 are applied to one set of inputs of multiplexer 3940 and signal HSTR on line 3903 is coupled to the other set of inputs of multiplexer 3940. Selection of either the data from adder 3930 or signal HSTR as the output of multiplexer 3940 is determined by the output of gate 3939. Data from adder 3930 is selected when the output of gate 3939 is low. Signal HSTR on line 3903 is selected when the output of gate 3939 is high.

Gate 3939 produces a low output signal only when signal LNDLY is high and the delay selected by delay switches 31 is a count of 15 or less. When the end display mode is selected, with a selected delay of 15 or less, the vertical state count is compared with the output code from adder 3930. When they match, signal HE of comparator 3950 goes high. When the delay is greater than 15, the $A_4$ input of comparator 3950 is low, forcing signal HE to the low state. When the start display mode is selected, comparator 3950 is enabled only when the delay selected is zero. For all other delays the $A_4$ and $B_4$ inputs of the comparator are held at different levels, thereby holding the signal HE in the low state.

When signal LNDLY is low, the select input of the multiplexer is held high. Therefore, the multiplexer always selects the input having the signal HSTR coupled thereto. When signal HSTR is high, the input signal to multiplexer 3940 is low because of an AND gate 3904. This causes the first word on the display to be intensified. When the signal HSTR is low, the output of gate 3904 is high, causing the last word on the display to be intensified.

DATA ROUTING AND MULTIPLEXING CIRCUITRY

In FIG. 40, there is shown the data routing and multiplexing circuitry of the preferred embodiment. The data routing and multiplexing circuitry performs several functions. The circuit provides a display format in either 4-bit or 3-bit bytes by providing the appropriate control signal to the horizontal ROM. It also determines what data will be displayed in Table B. The data for display may be selected data from B memory, data from an external device, or the exclusive OR of A memory data with B memory data, or external data. This circuitry also determines whether a character is to be displayed as a one or a zero, and determines whether or not the character should be intensified.

The byte format control signal HOCT is provided by gate 4050. When no external device is connected, byte format for both Tables A and B is controlled by a signal HBCD on a line 4010 from byte control switch 19. Data words are displayed in four-bit bytes when signal HBCD is high, and in three-bit bytes when signal HBCD is low. An external device may be coupled to the preferred embodiment to provide the signal LXPG1 on a line 4002. When LXPG1 is in the low state, Table B format will be determined by the signal HBCDX on a line 4011 from the external device. The output of gate 4050 is routed to the horizontal ROM to control horizontal decoding. A more complete description of the logical operation of gate 4050 is shown in the truth table below.

| INPUTS | | | | | OUPUT |
|---|---|---|---|---|---|
| LXPGI | HBCD | HBCDX | HTAD | HTBD | HOCT |
| 1 | 1 | X | X | X | 0 |
| 1 | 0 | X | X | X | 1 |
| 0 | 1 | X | 1 | 0 | 0 |
| 0 | 0 | X | 1 | 0 | 1 |
| 0 | X | 1 | 0 | 1 | 0 |
| 0 | X | 0 | 0 | 1 | 1 |

X = Don't Care

Multiplexer 4070 provides signal LHZ on a line 4072 and signal LVZ on a line 4071 to the analog output circuitry to control the one-zero switches which are shown in FIG. 46A and described in more detail later. Multiplexer 4070 also provides signal HBR on a line 4073 to indicate whether or not a character should be intensified. In addition, multiplexer 4070 provides a signal on a line 4074 to input circuitry of the D-to-A converters. In map display modes, the signal on line 4074 controls whether the all-zero state is displayed in the upper left-hand corner of the CRT screen or in the lower right-hand corner of the CRT screen.

The select line for multiplexer 4070 is a signal LMAP on a line 4009. When a table display mode is selected, i.e., signal LMAP = 1, the B inputs of multiplexer 4070 are selected. Also, signal LVZ is held in the true state and signal LHZ is controlled by gate 4040. Signal LHZ is true whenever the data bit to be displayed is a zero.

When Table A is being displayed, gate 4040 provides the data received from the A memory on line 3711. When Table B is being displayed, gate 4040 provides the data received from gate 4038. In the Tables A and B and the Table B display modes, gate 4038 selects the signal XDSPD or B data on a line 4007. In Tables A and A exclusive OR B display modes, indicated by signal LEXOR being low, gate 4038 selects the exclusive OR of the signals on lines 3711 and 4007.

In table display modes, signal HBR on line 4073 is controlled by the output of gate 4042. During the time Table A is being displayed, gate 4042 outputs the signal received from NOR gate 4035. Thus, in the start display mode, signal HBR is true only when the signal HE is true. In the end display mode, signal HBR is true any time signal HE and signal HDR or signal HE and signal HSSS are true.

During the time Table B is being displayed, signal HTAD is low, gate 4042 outputs the signal received from gate 4032. Thus, in Table B or Tables A and B display modes, when an external device is connected, the signal HBR is true whenever the signal HBRXT on line 4001 is true. In the Table A and Table A exclusive OR B display mode, signal HBR is high whenever a one is being displayed in Table B.

In the map display modes, the A inputs of multiplexer 4070 are selected. Signals LHZ and LVZ are then controlled by signal LCRCL on a line 4060. Signal LCRCL is low during that operation of the display cycle when the cursor is written on the CRT screen. When LCRCL is high, it holds signals LHZ and LVZ low. Note that signal HBR is tied low when a map display mode is selected.

Figure 41B:
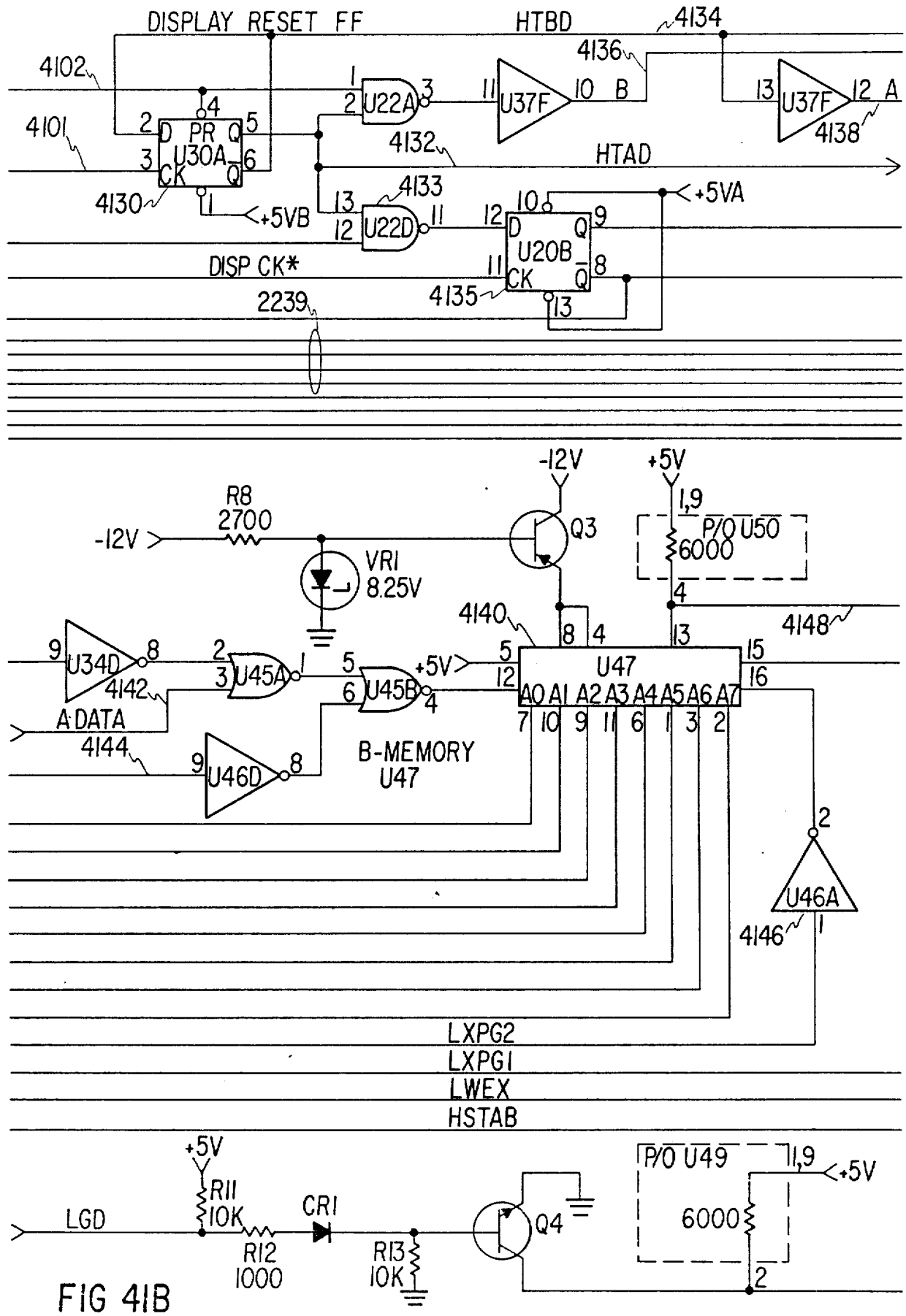
Figure 41C:
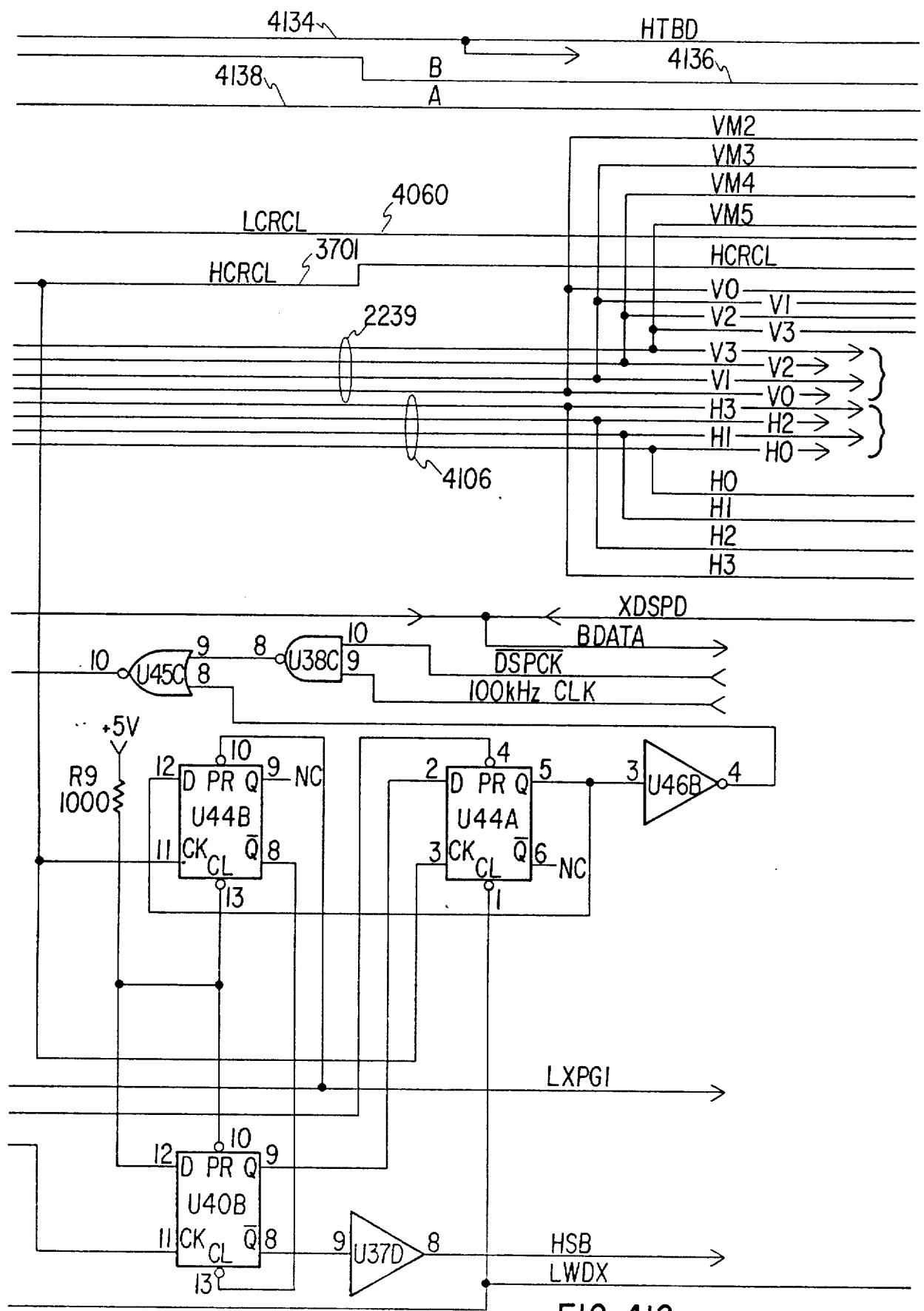

In FIGS. 41A, 41B and 41C, there is shown the display counter and the B memory circuitry. The display state counters are 16-state binary counters that provide basic control for the display cycle and memory addressing of the B memory. The vertical state count on lines 2239 control addressing of the A memory read cycles and control the the vertical deflection of the CRT beam in the table display modes. In addition, the vertical state counter 2238 is used in blanking control and, with some additional logic, to control the horizontal offset between Table A and Table B.

The horizontal state count on lines 4106 is used to serialize the parallel data received from A memory, and controls the horizontal deflection of the CRT beam during table display modes. The horizontal state count on lines 4106 is used by the column-blanking circuit to determine which columns are to be blanked, and is used with the vertical state count on lines 2239 to form the 8-bit address that is used to address the B memory and any external device that may be connected to the preferred embodiment.

Horizontal state counter 4105 is clocked by a signal DSPCK* on a line 4101 which is generated by the display clock generator circuit which is described later in conjunction with the description of FIG. 44. When the horizontal state counter 4105 reaches terminal count, indicating that a data word is completely displayed, the counter TC output enables vertical state counter 2238, thereby permitting signal DSPCK* to increment the vertical state mounter to the next word location. The above operation is repeated until all sixteen words of the table have been displayed.

When word 16 is displayed, TC output of counter 2238 goes high. This output signal is inverted by a gate 4109 which produces a signal LVTC on a line 4110 which is routed to the display reset flip-flop 4130.

The trailing edge of signal LVTC clocks D flip-flop 4130. Flip-flop 4130 generates four signals: signal HTAD on a line 4132, signal HTBD on a line 4134, signal B on a line 4136, and a signal A on a line 4138. Signals HTAD and HTBD are control signals for the data routing and multiplexing circuitry shown in FIG.

40 and for the blanking circuitry shown in FIG. 42 and described later. Signals A and B control the horizontal offset for Tables A and B. Table A is displayed when signals A and B are both low. Table B is displayed when signals A and B are both high. In map display modes, signal A is low and signal B is high, resulting in no offset. When both Table A and Table B are displayed, Table B is displayed first, followed by the display of Table A.

In addition to providing signal LVTC, the TC output signal from vertical state counter 2238 is gated with the Q output of flip-flop 4130 by an AND gate 4133. The output signal from AND gate 4133 is applied to flip-flop 4135 at the completion of the display of Table A. This results in signal DSPCK* clocking the Q and $\overline{Q}$ outputs of flip-flop 4135 low and high, respectively, thereby generating signals LCRCL on line 4160 and signal HCRCL on line 3701.

In the map display modes, signal LMAP on line 4009 clocks the horizontal state counter 4105 in the terminal count state. Therefore, the vertical state counter 2238 counts every occurrence of signal DSPCK* on line 4101 and reads the sixteen data words in A memory to the horizontal and vertical decoders. Signal LMAP also presets flip-flop 4130, causing signal LCRCL and HCRCL to occur every time the vertical state counter 2238 reaches terminal count.

B memory 4140 is a 256 × 1 random access memory. B memory 4140 stores sixteen 16-bit data words in serial format for display on Table B. Serial data is received on a line 4142 from the data acquisition circuitry when no external device is connected. B memory may accept data from an external device on a line 4144 when the appropriate control signals are provided.

B memory operation is controlled by a signal LXPG1 on a line 4111, a signal LXPG2 on a line 4112, and a signal LXPG3 on a line 4114. All three signals are high when no external device is connected. This enables store A to B switch 20 to control memory write operations and enables the horizontal state count on lines 4106 and the vertical state count on lines 2239 to address B memory.

When signal LXPG1 is low, a signal HSTAB on a line 4108 is disabled and the memory read-write select line is controlled by a signal LWEX on a line 4109 from an external device. Signal LXPG2 is tied to the enable pin of B memory 4140 through inverter 4146. When LXPG2 is low, it disables the memory, i.e., places its outputs in the high impedance state and external data signal XCSPD on line 4148 is displayed on Table B.

Signal LXPG3 controls addressing and selects either A memory data signal ADATA on line 4142 or the external data signal EDTBS on line 4144. When signal LXPG3 is high, signal ADATA is routed to B memory and addressing is accomplished by horizontal and vertical state counters 4105 and 2238. When signal LXPG3 is low, external data is written into memory with addressing performed by the external device, as supplied on line 4150.

Data from an external device is displayed instead of B memory by supplying the data on lines 4150 and providing signals LXPG1 and LXPG2 in the low state and signal LXPG3 in the high state to disable the B memory circuitry.

DISPLAY BLANKING CIRCUITRY

Figure 42A:
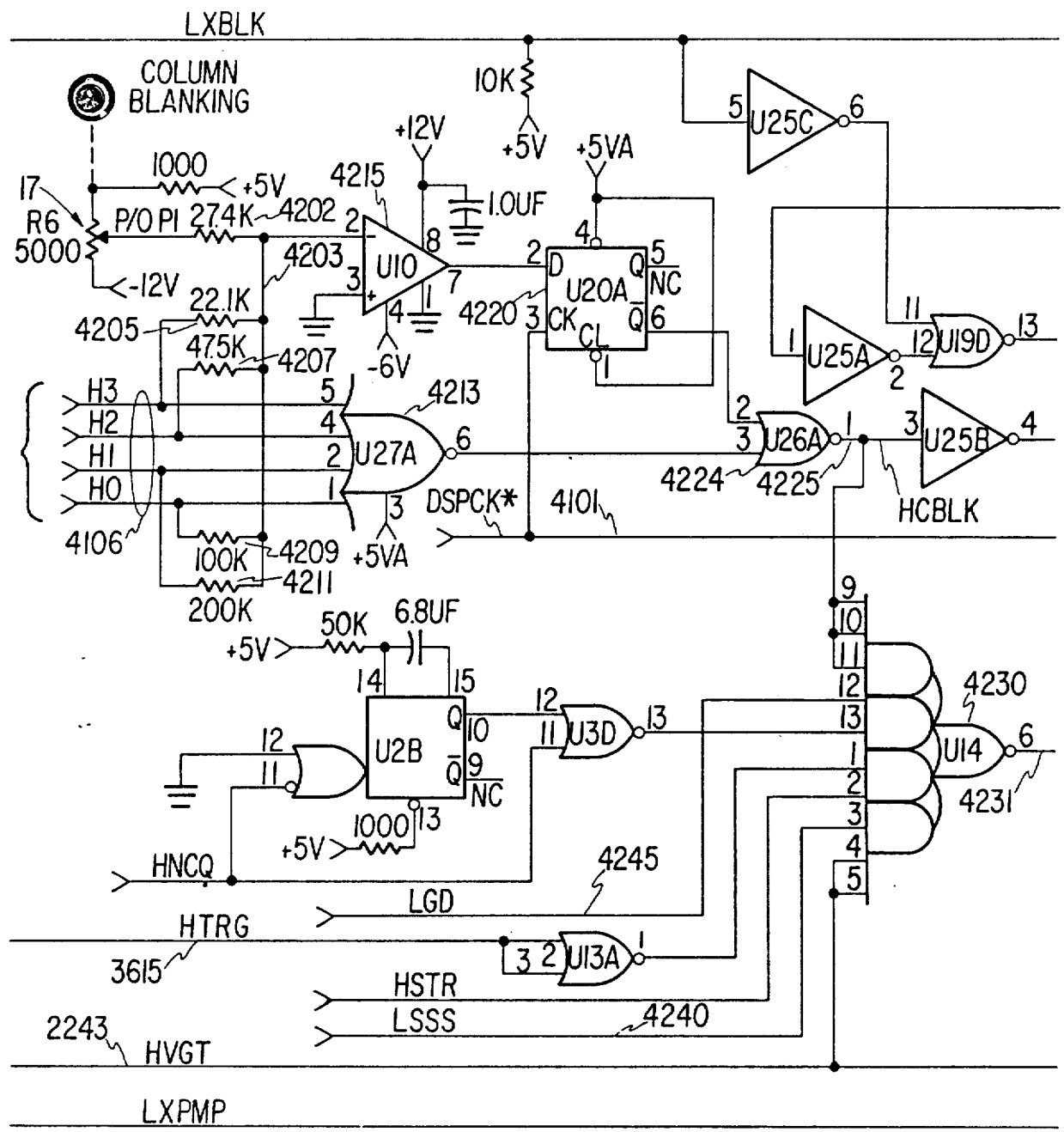
FIGS. 42A and 42B taken together are a schematic diagram of the blanking control circuitry of the preferred embodiment.
Figure 42B:
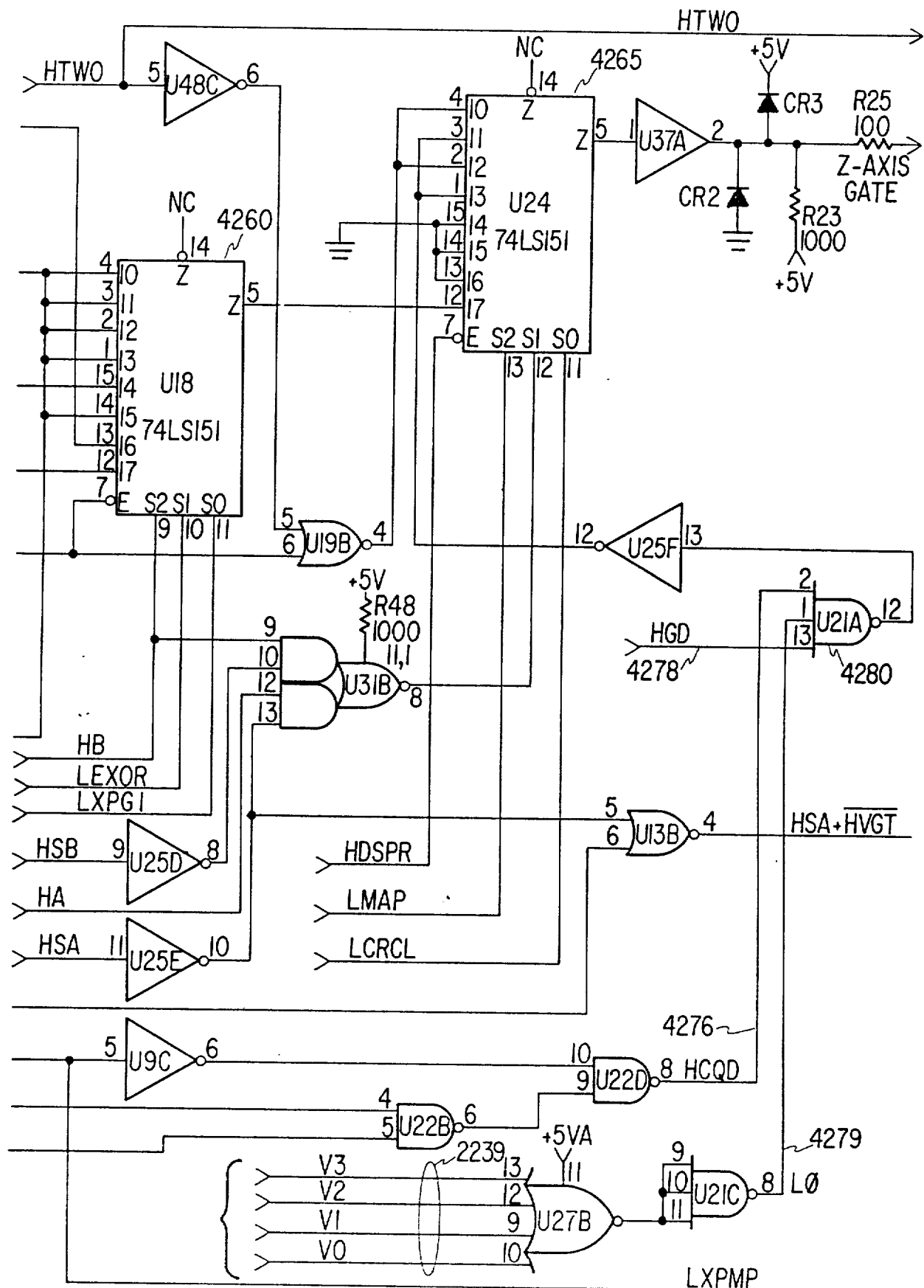

The blanking circuitry of the preferred embodiment is shown in FIGS. 42A and 42B. Blanking is the most complex function in the display section. The blanking logic is controlled by 23 variables.

Column blanking is accomplished by a discrete D to A converter consisting of resistors 4205, 4207, 4209 and 4211, and coupled to the horizontal state count on line 4106. The analog output signal from these resistors on line 4203 is compared to the voltage signal supplied from column-blanking control 17 by comparator 4215. When the D-to-A converter output voltage exceeds the column-blanking voltage, the output of comparator 4215 goes high, thereby forcing the $\overline{Q}$ output of D flip-flop 4220 low. This causes the generation of a signal HCBLK on a line 4225 to the high state. Note that when the horizontal state count on lines 4106 is in the all-zero state, gate 4213 causes gate 4224 to hold signal HCBLK low. This prevents the least significant column from being blanked. Flip-flop 4220 is clocked by signal DSPCK* on line 4101 to ensure that only full columns of bits are displayed.

In the partial display mode, a gate 4230 generates a blanking signal whenever signal HVGT on line 2243 is high, except in the single sample start mode which is selected by switches 29 and 33 and indicated by a signal LSSS on a line 4240 being in the low state. Gate 4230 also generates a blanking signal whenever a signal LGD on a line 4245 is high, indicating that the A memory does not contain sixteen words of valid data and the partial display mode has not been entered.

A gate 4280, shown in FIG. 42B, generates the blanking signal for the expand map mode when that mode is selected by control switch 26. When the data acquisition cycle is complete, indicated by a signal HGD on a line 4278 being in a high state, and the data addressed in the A memory lies in the expanded map sector indicated by signal HCQD on a line 4276 being in a high state, gate 4280 unblanks the CRT. If the vertical state count on lines 2239 is in the all-zero state, a signal L$\phi$, i.e., "Low Zero Count" on a line 4279 causes the CRT display to be blanked. This prevents extraneous vectors from being displayed on the CRT.

Selection of the proper function to control the Z-axis gate signal is made by multiplexers 4260 and 4265. Multiplexer operation is according to the truth table shown in Table II below.

TABLE II

| A8U18 SELECT LINES | | | A8U24 SELECT LINES | | | MULTIPLEXOR 4260 ENABLE (DSPCK*) | MULTIPLEXOR 4265 ENABLE (HDSPR) | MULTIPLEXOR (MUX) 4265 Y OUTPUT (Blanking signal TRUE in 0 state) |
|---|---|---|---|---|---|---|---|---|
| HTBD | LEXOR | LXPG1 | LMAP | $\overline{HSA \cdot HTAD}$ + $\overline{HSB \cdot HTBD}$ | LCRCL | | | |
| X | X | X | X | X | X | X | 1 | 0 |
| X | X | X | 0 | 0 | 0 | X | 0 | HTWO + $\overline{DSPCK^*}$ |
| X | X | X | 0 | 0 | 1 | X | 0 | HGD . HCQD . L$\phi$ |
| X | X | X | 0 | 1 | 0 | X | 0 | HTWO + $\overline{DSPCK^*}$ |
| X | X | X | 0 | 1 | 1 | X | 0 | HGD . HCQD . L$\phi$ |
| X | X | X | 1 | 0 | 0 | X | 0 | 0 |
| X | X | X | 1 | 0 | 1 | X | 0 | 0 |
| X | X | X | 1 | 1 | 0 | X | 0 | 0 |

TABLE II-continued

| A8U18 SELECT LINES | | | A8U24 SELECT LINES | | | MULTIPLEXOR 4260 ENABLE (DSPCK*) | MULTIPLEXOR 4265 ENABLE (HDSPR) | MULTIPLEXOR (MUX) 4265 Y OUTPUT (Blanking signal TRUE in 0 state) |
|---|---|---|---|---|---|---|---|---|
| HTBD | LEXOR | LXPG1 | LMAP | $\overline{HSA} \cdot \overline{HTAD}$ + $\overline{HSB} \cdot \overline{HTBD}$ | LCRCL | | | |
| X | X | X | 1 | 1 | 1 | 1 | 0 | 0 |
| 0 | 0 | 0 | 1 | 1 | 1 | 0 | 0 | MUX 4260, PIN 6 |
| 0 | 0 | 1 | 1 | 1 | 1 | 0 | 0 | MUX 4260, PIN 6 |
| 0 | 1 | 0 | 1 | 1 | 1 | 0 | 0 | MUX 4260, PIN 6 |
| 0 | 1 | 1 | 1 | 1 | 1 | 0 | 0 | MUX 4260, PIN 6 |
| 1 | 0 | 0 | 1 | 1 | 1 | 0 | 0 | LXBLK + MUX 4260, PIN 6 |
| 1 | 0 | 1 | 1 | 1 | 1 | 0 | 0 | A8U14, PIN 6 |
| 1 | 1 | 0 | 1 | 1 | 1 | 0 | 0 | $\overline{LXBLK}$ |
| 1 | 1 | 1 | 1 | 1 | 1 | 0 | 0 | $\overline{HCBLK}$ |

1. X = Don't Care
2. MUX 4260, PIN 6 = 0 when
   a. HCBLK = 1
   b. HUGT.LSSS = 1
   c. HSTR . $\overline{HTRG}$ = 1
   d. LGD = 1 and the qualified clock rate is greater than ≈ 30 Hz.

In table display modes, the CRT is blanked during the first part of signal DSPCK*, i.e., when DSPCK* is in the high state.

DATA ACQUISITION CIRCUITRY

Referring to FIG. 43, there is shown the data acquisition circuitry of the preferred embodiment. The data acquisition reset circuitry generates the reset signal LRST on line 2210 which, as described above, generates other reset signals for the display section and is itself used as a reset signal in the data acquisition section.

When a repetitive sample is selected by control switch 27, reset is controlled by the display time control 16. Display time control 17 determines the output frequency of timer 4307. The output of timer 4307 is divided down by 16 by counter 4310. When divider 4310 reaches terminal count, a high level is applied to the D input of flip-flop 4360, shown in FIG. 43B. The terminal count output of divider 4310 is also inverted by NOR gate 4315 and applied to the CEP input of divider 4310. This locks the counter in the terminal count state, holding a high level at the D input of the flip-flop. When the display of the next Table A is completed, signal LCRCL on line 4060 clocks flip-flop 4360, causing it to set and its Q output to go to a high state. When the Q output of flip-flop 4360 goes high, the output of gate 4375 goes low. Simultaneously, capacitor 4365 is ungrounded by emitter follower circuit 4363. Thus, capacitor 4365 begins to charge with a time constant determined by resistors 4364 and 4366.

The resulting ramp voltage is applied to the noninverting input of a comparator 4370. The inverting input of the comparator is an amplified version of the +12 volt unregulated ripple, offset from ground such that the minimum voltage is 1.5 volts. As soon as the ramp voltage exceeds the unregulated ripple, the comparator output goes high. This signal clears the D flip-flop 4360 which provides the signal LRST.

The leading edge of signal LRST blanks the CRT display and initiates the display reset operations. The trailing edge of LRST resets circuitry of the data acquisition section. In map display modes, signal LMAP on line 4009 presets counter 4310 to the terminal count state so that a reset occurs for every occurrence of the signal LCRCL on line 4060.

The operation described in the preceding paragraphs provides a reset pulse of randomly varying width. This randomization ensures that the preferred embodiment will not lock on a subharmonic of the input clock frequency for data rates greater than 100 KHz. Thus, in map display modes every logic state in the machine under test is displayed by overlaying randomly acquired blocks of sixteen words.

The repetitive reset can be disabled by several conditions in the table display modes. When an external device is coupled to the preferred embodiment, repetitive reset is disabled whenever a signal HGDX on a line 4305 is low. When Table A is selected for display, as indicated by a signal HSA on a line 4303 being in the high state, repetitive resets are disabled whenever a signal LGD on a line 4304 is low. In the halt if A ≠ B sample mode selected by control switch 28, repetitive resets are disabled when a signal LA ≠ B on a line 4313 is true. When the preferred embodiment is operated by itself, with no external devices connected, a repetitive resets are disabled whenever a signal LDSPR is in the low state. Single sample mode is selected by control switch 29, i.e., a signal LSS on a line 4312 is low.

Pressing reset switch 30 in any sample mode will initiate a reset. When reset control switch 30 is pressed, a signal HRSTR on a line 4318 triggers a monostable 4372. The output of monostable 4372 triggers monostable 4374 and causes the generation of signal LRST on line 2210. In addition, the Q output of monostable 4374 is routed to any external devices being used where it is used as a reset signal HMRXT on a line 4376 for the external devices.

DISPLAY GENERATOR CIRCUITRY

The display clock generator circuitry of the preferred embodiment is shown in FIG. 44. The display clock signals are derived from the 100 KHz square wave output signal received on line 4410 and produced by the circuitry described later with respect to FIG. 46. Flip-flops 4412, 4414 and gate 4416 divide the 100 KHz signal on line 4410 down to either a 25 KHz or 50 KHz signal on line 4101. When a map display mode is selected, signal HMAP is high and the output signal DSPCK* of gate 4416 is a 25 KHz clock signal. When a table display mode is selected, signal HMAP presets flip-flop 4414, resulting in a 50 KHz signal on line 4101.

When signal HBR on a line 4450 is low, gate 4454 passes every occurrence of signal DSPCK*. The output of gate 4454 clocks the horizontal and vertical state counters and the blanking circuits described above and shown in FIG. 41A. When signal HBR is high, gates 4148 and 4149 inhibit gate 4454 for three clock cycles. This stops the horizontal state counter for three clock intervals and results in the current display character being written on the CRT display five times. In this manner, selected characters are intensified on the display.

Display reset signals HDSPR and LDSPR are generated by gate 4459. In display modes where Table A is selected, internal resets from gate 4456 are enabled. In display modes where Table B is displayed, an external signal LXDPR can generate display resets. An internal display reset is described by the Boolean equation:

$$LDSPR = HSA \cdot [LRST + HMAP \cdot (\overline{HDR} + HR \cdot 1) \cdot HSSS + \overline{HNCQ} \cdot HR1 \cdot HSSS]$$

An external display reset is described by the Boolean equation:

$$LDSPR = HSB \cdot LXPG1 \cdot LXDPR$$

D flip-flop 4430 controls reset in the halt A ≠ B sample mode. When a difference between Table A data and Table B data is detected, NOR gate 4428 applies a high level to the D input of flip-flop 4430. The next occurrence of signal DSPCK* clocks the Q output of flip-flop 4430 low, causing the signal LA ≠ B to be generated in the low state also. The signal LA ≠ B then inhibits repetitive resets. The current data is displayed until reset control switch 30 is activated. When reset switch 30 is activated, signal HDR goes low and clears flip-flop 4430. The signal LA ≠ B then goes high and repetitive resets are again enabled until the next difference between data in the two tables is detected.

DISPLAY OUTPUT CIRCUITRY

Referring now to FIG. 45, there is shown the horizontal and vertical decoders and D-to-A converters of the preferred embodiment. Vertical decoders 4510, 4520 and 4530 and horizontal decoders 4540, 4550 and 4560 select either the parallel data from the display data switch circuitry shown in FIG. 37 or select the decoded horizontal and vertical state counts on lines 4106 and 2239, respectively. These selected signals are applied to D-to-A converters 4515 and 4555 which then output signals to control the horizontal and vertical deflection circuits controlling the CRT beam.

The horizontal and vertical decoders are controlled by signals LMAP and LXPMP. In table display modes, both signals are high and the decoders point to decoded horizontal state counts signals on lines 4565 and to vertical state counts signals on lines 2239. In the normal map mode, selected by control switch 25, signal LMAP is low and signal LXPMP is high. This causes the horizontal and vertical decoders to point to the six most significant vertical bits on lines 4512 and the six most significant horizontal bits on lines 4562, which are received from the display data switch circuitry of FIG. 37. In the expand map mode, selected by control switch 26, signals LMAP and LXPMP are in the low state. The horizontal and vertical decoders then point to the six least significant vertical bits on lines 4513 and to the six least significant horizontal bits on lines 4563.

The outputs of decoders 4510, 4520, 4530, 4540, 4550 and 4560 are gated to D-to-A converters 4515 and 4555 by exclusive OR gates 4514 and 4555. In the map display modes these exclusive OR gates complement the decoders' outputs when logic positive-negative switch 180 is set to negative. This results in the all-zero state being displayed in the lower right-hand corner of the map display. The D-to-A converters convert the digital signals to logic signals which are applied to the analog output circuits discussed below.

The logical operation of some of the circuit elements in FIGS. 45A and 45B is described below in Tables III, IV and V. Table III is a truth table of the operation of multiplexer 4508. Table IV is a truth table of the operation of horizontal decoders 4540, 4550 and 4560 and vertical decoders 4510, 4520 and 4530. Table V is a truth table for the horizontal ROM 4585.

TABLE III

| INPUT | | OUTPUT | |
|---|---|---|---|
| VM3 | VM2 | VM1 | VM0 |
| 0 | 0 | 1 | 1 |
| 0 | 1 | 1 | 0 |
| 1 | 0 | 1 | 0 |
| 1 | 1 | 0 | 1 |

Table IV

| LMAP | LXPMP | HORIZONTAL/ VERTICAL DECODER OUTPUTS |
|---|---|---|
| 0 | 0 | MD0-5, MD8-13 |
| 0 | 1 | MD2-7, MD10-15 |
| 1 | 1 | HM1-5, VM0-5 |

Table V

| INPUTS | | | | | | OUTPUTS* | | | | INPUTS | | | | | | OUTPUTS* | | | |
|---|---|---|---|---|---|---|---|---|---|---|---|---|---|---|---|---|---|---|---|
| HTBD | HOCT | H3 | H2 | H1 | H0 | HM4 | HM3 | HM2 | HM1 | HBTD | HOCT | H3 | H2 | H1 | H0 | HM4 | HM3 | HM2 | HM1 |
| 0 | 0 | 0 | 0 | 0 | 0 | 1 | 1 | 1 | 0 | 1 | 0 | 0 | 0 | 0 | 0 | 1 | 1 | 0 | 1 |
| 0 | 0 | 0 | 0 | 0 | 1 | 1 | 1 | 0 | 1 | 1 | 0 | 0 | 0 | 0 | 1 | 1 | 1 | 0 | 0 |
| 0 | 0 | 0 | 0 | 1 | 0 | 1 | 1 | 0 | 0 | 1 | 0 | 0 | 0 | 1 | 0 | 1 | 0 | 1 | 1 |
| 0 | 0 | 0 | 0 | 1 | 1 | 1 | 0 | 1 | 1 | 1 | 0 | 0 | 0 | 1 | 1 | 1 | 0 | 1 | 0 |
| 0 | 0 | 0 | 1 | 0 | 0 | 1 | 0 | 0 | 1 | 1 | 0 | 0 | 1 | 0 | 0 | 1 | 0 | 0 | 0 |
| 0 | 0 | 0 | 1 | 0 | 1 | 1 | 0 | 0 | 0 | 1 | 0 | 0 | 1 | 0 | 1 | 0 | 1 | 1 | 1 |
| 0 | 0 | 0 | 1 | 1 | 0 | 0 | 1 | 1 | 1 | 1 | 0 | 0 | 1 | 1 | 0 | 0 | 1 | 1 | 0 |
| 0 | 0 | 0 | 1 | 1 | 1 | 0 | 1 | 1 | 0 | 1 | 0 | 0 | 1 | 1 | 1 | 0 | 1 | 0 | 1 |
| 0 | 0 | 1 | 0 | 0 | 0 | 0 | 1 | 0 | 0 | 1 | 0 | 1 | 0 | 0 | 0 | 0 | 0 | 1 | 1 |
| 0 | 0 | 1 | 0 | 0 | 1 | 0 | 0 | 0 | 1 | 1 | 0 | 1 | 0 | 0 | 1 | 0 | 0 | 1 | 0 |
| 0 | 0 | 1 | 0 | 1 | 0 | 0 | 0 | 1 | 0 | 1 | 0 | 1 | 0 | 1 | 0 | 0 | 0 | 0 | 1 |
| 0 | 0 | 1 | 0 | 1 | 1 | 0 | 0 | 0 | 1 | 1 | 0 | 1 | 0 | 1 | 1 | 0 | 0 | 0 | 0 |
| 0 | 0 | 1 | 1 | 0 | 0 | 1 | 1 | 1 | 1 | 1 | 0 | 1 | 1 | 0 | 0 | 1 | 1 | 1 | 0 |
| 0 | 0 | 1 | 1 | 0 | 1 | 1 | 1 | 1 | 0 | 1 | 0 | 1 | 1 | 0 | 1 | 1 | 1 | 0 | 1 |
| 0 | 0 | 1 | 1 | 1 | 0 | 1 | 1 | 0 | 1 | 1 | 0 | 1 | 1 | 1 | 0 | 1 | 1 | 0 | 0 |
| 0 | 0 | 1 | 1 | 1 | 1 | 1 | 1 | 0 | 0 | 1 | 0 | 1 | 1 | 1 | 1 | 1 | 0 | 1 | 1 |
| 0 | 1 | 0 | 0 | 0 | 0 | 1 | 1 | 1 | 0 | 1 | 1 | 0 | 0 | 0 | 0 | 1 | 1 | 1 | 1 |
| 0 | 1 | 0 | 0 | 0 | 1 | 1 | 1 | 0 | 1 | 1 | 1 | 0 | 0 | 0 | 1 | 1 | 1 | 1 | 0 |
| 0 | 1 | 0 | 0 | 1 | 0 | 1 | 1 | 0 | 0 | 1 | 1 | 0 | 0 | 1 | 0 | 1 | 1 | 0 | 1 |
| 0 | 1 | 0 | 0 | 1 | 1 | 1 | 0 | 1 | 0 | 1 | 1 | 0 | 0 | 1 | 1 | 1 | 0 | 1 | 1 |
| 0 | 1 | 0 | 1 | 0 | 0 | 1 | 0 | 0 | 1 | 1 | 1 | 0 | 1 | 0 | 0 | 1 | 0 | 1 | 0 |
| 0 | 1 | 0 | 1 | 0 | 1 | 1 | 0 | 0 | 0 | 1 | 1 | 0 | 1 | 0 | 1 | 1 | 0 | 0 | 1 |
| 0 | 1 | 0 | 1 | 1 | 0 | 0 | 1 | 1 | 1 | 1 | 1 | 0 | 1 | 1 | 0 | 0 | 1 | 1 | 1 |
| 0 | 1 | 0 | 1 | 1 | 1 | 0 | 1 | 0 | 1 | 1 | 1 | 0 | 1 | 1 | 1 | 0 | 1 | 1 | 0 |
| 0 | 1 | 1 | 0 | 0 | 0 | 0 | 1 | 0 | 0 | 1 | 1 | 1 | 0 | 0 | 0 | 0 | 1 | 0 | 1 |

Table V-continued

| INPUTS | | | | | | OUTPUTS* | | | | INPUTS | | | | | | OUTPUTS* | | | |
|---|---|---|---|---|---|---|---|---|---|---|---|---|---|---|---|---|---|---|---|
| HTBD | HOCT | H3 | H2 | H1 | H0 | HM4 | HM3 | HM2 | HM1 | HBTD | HOCT | H3 | H2 | H1 | H0 | HM4 | HM3 | HM2 | HM1 |
| 0 | 1 | 1 | 0 | 0 | 1 | 0 | 0 | 1 | 0 | 1 | 1 | 1 | 0 | 0 | 1 | 0 | 0 | 1 | 1 |
| 0 | 1 | 1 | 0 | 1 | 0 | 0 | 0 | 0 | 1 | 1 | 1 | 1 | 0 | 1 | 0 | 0 | 0 | 1 | 0 |
| 0 | 1 | 1 | 0 | 1 | 1 | 0 | 0 | 0 | 0 | 1 | 1 | 1 | 0 | 1 | 1 | 0 | 0 | 0 | 1 |
| 0 | 1 | 1 | 1 | 0 | 0 | 1 | 1 | 1 | 0 | 1 | 1 | 1 | 1 | 0 | 0 | 1 | 1 | 1 | 1 |
| 0 | 1 | 1 | 1 | 0 | 1 | 1 | 1 | 0 | 1 | 1 | 1 | 1 | 1 | 0 | 1 | 1 | 1 | 1 | 0 |
| 0 | 1 | 1 | 1 | 1 | 0 | 1 | 1 | 0 | 0 | 1 | 1 | 1 | 1 | 1 | 0 | 1 | 1 | 0 | 1 |
| 0 | 1 | 1 | 1 | 1 | 1 | 1 | 0 | 1 | 0 | 1 | 1 | 1 | 1 | 1 | 1 | 1 | 0 | 1 | 1 |

*HM5 IS GENERATED BY COMPARATOR 4586
HM5 = 1 IF HORIZCOUNT < $1011_2$
HM5 = 0 IF HORIZCOUNT > $1011_2$

In FIG. 46 there is shown the analog output amplifier circuitry of the preferred embodiment. This circuitry generates the horizontal drive signals on lines 4680 and the vertical drive signals on line 4690. These signals control the operation of the CRT shown in FIG. 47B. Output signals from the D-to-A converters shown in FIG. 45 are received on lines 4557 and 4517, and inputs to preamplifiers 4650 and 4660, respectively.

The input to horizontal preamplifier 4650 is the sum of the output of transistors 4620 and 4621, the output of one/zero switch 4622, and the D-to-A converter output received on 4557. Transistors 4620 and 4621 operate as current switches and are controlled by signal A on line 4138 and signal B on line 4136. The horizontal offset for the display of Tables A and B is provided by these two transistors.

One/zero switch 4622 is controlled by the signal LHZ on line 4072. When LHZ is low, the one/zero switch is turned on. This applies the 100 KHz sine wave to the horizontal drive signal, causing a zero (Lissijous Figure) to be written on the CRT screen.

The inputs to vertical preamplifier 4660 are the signals on line 4517 from the vertical D-to-A converter shown in FIG. 45 and the output signal of one/zero switch 4624. One/zero switch 4624 is controlled by signal LVZ on line 4071.

The gains of horizontal preamplifier 4650 and vertical preamplifier 4660 are controlled by variable resistance 4649 and 4659, respectively. The outputs of the preamplifiers are coupled to map cursor switches 4651 and 4661. respectively. These switches apply time constants to the preamplification outputs during the map display modes. The time constants cause the preamplifier outputs to slew less rapidly as the map vector approaches the go to state. This results in the vector being intensified at the destination state. A variable resistance 4662 allows the vertical and horizontal time constants presented by map cursor switches 4651 and 4661 to be balanced for optimum display characteristics.

The preamplifier outputs are then coupled to the horizontal and vertical output amplifiers.

Figure 46B:
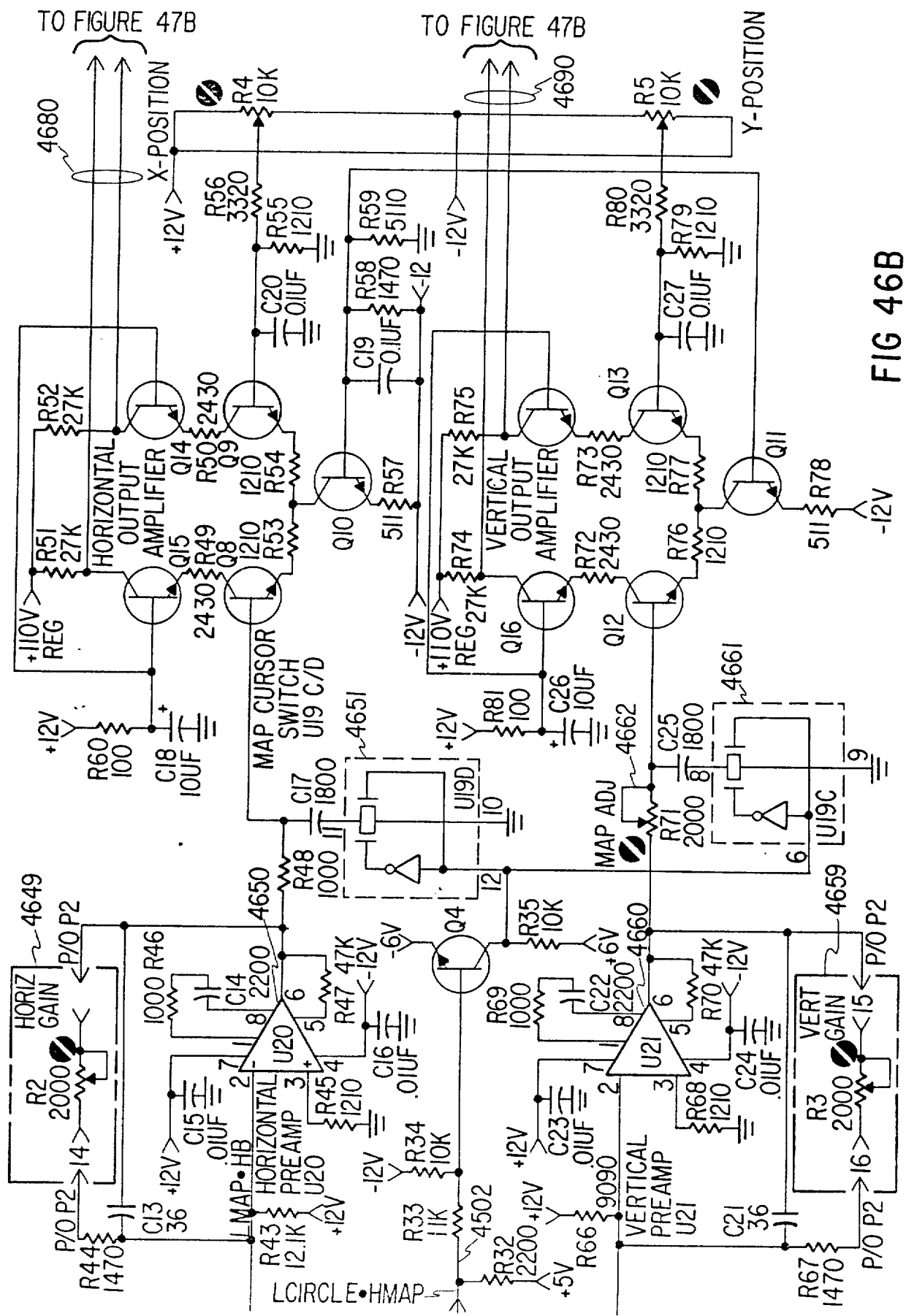

In the map display modes, both one/zero switches 4622 and 4624 are turned off during the operation of the display cycle that data is being displayed. The signals on lines 4557 and 4517 provide an analog representation of the input data. Thus, each dot on the CRT screen represents a unique data word. When sixteen words are displayed on the CRT, a signal LCRCL on line 4060 goes low and, as shown in FIG. 45A, generates the signal on line 4502. The signal on line 4502 is coupled to map cursor switches 4651 and 6661, shown in FIG. 46B. This signal turns one/zero switches 4622 and 3624 on, turns map cursor switches 4651 and 4661 off, and switches the display data switch circuitry of FIG. 37 from selecting the input data to selecting the data received from trigger word map locator switches 38. At the location or state selected by trigger word map locator switches 38, the preferred embodiment writes a zero. This is the map locator or "cursor" position. The preferred embodiment then goes into the data-acquisition cycle and repeats the operation described above.

During the tabular display modes, the map cursor switches are turned off. The vertical one/zero switch 4624 is turned on, and the horizontal one/zero switch 4622 is controlled by the input data. The horizontal one/zero switch is turned on when the data bit received is a zero, and turned off when the data bit received is a one (using positive logic). The D-to-A converters 4517 and 4557, shown in FIG. 45, are coupled to the vertical state count on lines 2239, and the horizontal state count on lines 4106, respectively. The output produced from the D-to-A converters is a 16-position staircase voltage ramp. During the display cycle, Table B is written first, starting with the least significant bit of word zero. When all sixteen words of Table B are displayed, the horizontal offset moves the CRT beam to the left half of the CRT screen and Table A is written. At the end of Table A, the leading edge of signal LCRCL on line 4060 blanks the CRT screen, i.e., it prevents further information from being written on the CRT screen. The trailing edge of signal LCRCL initiates a reset operation if a repetitive reset is called for, and the above process is repeated.

During the above-described operations, indicator lights are operated to provide the operator with feedback regarding the status of the internal circuitry of the preferred embodiment. The indicator light control logic shown in FIGS. 29 and 38 provides a hierarchy that determines the sequence in which the indicator lights are enabled. When the no-clock indicator 10 is on, the no-qualifier indicator 11 and the no-trigger indicator 12 are disabled. When a clock is present and the no-qualifier light 11 is on, the no-trigger indicator 12 is disabled. Further, the no-arm indicator 9 also disables the no-trigger indicator 12.

Using this system, the operator can tell exactly what display condition has not occurred without deciphering an entire group of indicators, i.e., there is no confusion introduced by illuminating the indicators for the subsequent conditions. The indicator light logic also provides signal HNCQ on line 3820 to the display section. This signal places the display section in the partial display mode whenever the display qualifier rate is less than 30 Hz.

APPENDIX A

| TERM | FUNCTION |
|---|---|
| A | Switching signal for table A CRT offset. When A is LO, data is displayed on left-half of CRT screen |
| ADATA | Complement of $\overline{DATA}$ A-memory data to be stored in B-memory when STORE A-B is pressed. ADATA is displayed on the left-half of the CRT screen. |
| AM0-AM15 | Memory output data. Data stored in memory for display. |
| ARM | Arming input signal from TRIG ARM IN connector. |
| B | Switching signal for table B CRT offset. When B is LO, data is displayed on left-half of CRT screen. |
| BDATA | Serialized data output from B-memory. |
| CA0-CA3 | Computed Address. Memory address used to read memory during display cycle. Computed address = vertical state count + (Write Address Count - Data Index Count). |
| $\overline{DATA}$ | Serialized data output from memory used to derive LHZ and ADATA. |
| DT | Delayed Trigger. Trigger generator output signal applied to DELAYED TRIG OUT connector. |
| D0-D15 | Input data bits 0 through 15 from Data Probes. |
| DSPCK* | Display Clock. Clocking signal for display section. DSPCK* is 50-kHz clock in table display modes, 25-kHz clock in map display modes. |
| $\overline{DSPCK^*}$ | Complement of DSPCK*. |
| EDTBS | External Data To Be Stored. Serial data from an external device on the I/O bus to be stored in B-memory. |
| HARM | HI, Armed. Complement of LARM |
| HARME | HI, Arm Enable. Data acquisition control signal (dc level). HARM = HI when NORM/ARM is set to ARM position (in). When HI, the Model 1600A must be armed before it will recognize a trigger. |
| HB | HI, Bus. Data acquisition control signal. HB = HI when bus flip-flop is reset. |
| HBCD | HI,BCD. Display control signal (dc level) for Horizontal Code Converter. When HI, displayed word format is four 4-bit bytes. When LO, displayed word format is five 3-bit bytes with MSB left over. HBCD generates HOCT when table A is displayed and when table B is displayed with no external device connected to the I/O PORT. HOCT = $\overline{HBCD}$ |
| HBCDX | HI, BCD External. Table B format control signal from Model 1607A in I/O Bus operation. When HI, table B word format is four 4-bit bytes. When LO, word format is five 3-bit bytes with MSB left over. HBCDX generates HOCT when table B is displayed and an external device is connected to the I/O PORT. HOCT = $\overline{HBCDX}$ |
| HBR | HI, Brighten. Control signal for character intensification. HBR = 1 momentarily halts DSPCK* to horizontal counter. This causes the current addressed bit to be written 5 times, resulting in intensification. |
| HBRXT | HI, Brighten External. Character Intensification control signal from Model 1607A. HBRXT = HI causes current displayed character in table B to be intensified. |
| HBTRG | HI, Bus Trigger. Trigger signal (HI state) indicating both Model 1607A and Model 1600A Trigger words have occurred simultaneously in the trigger bus mode. |
| HCBLK | HI, Column Blank. Blanking control signal. When HI, Data column currently being addressed is blanked. |
| HCL | HI, Clock. Clocking signal from timing generator used to clock data index and control. HCL is derived from PCLK. |
| HCQD | HI, Correct Quadrant. Blanking control signal in EXP map mode. HCQD unblanks CRT when input data word lies in map sector selected in EXP map. HCQD = HEMAB . LXPMP. |
| HCRCL | HI, Circle. Mode control signal HCRCL goes HI for one display clock each time display has been completed. In map, HCRCL causes the cursor to be displayed. In table, the cursor is blanked. |
| HDC | HI, Delay Complete. Data acquisition control signal. HDC = HI when delay generator has counted out the delay set on DELAY thumbwheels or LNDLY = LO. |
| HDL | HI, Delay Clock. Clocking signal from timing generator used to clock delay generator. HDL is derived from PCLK. |
| HDQ | HI, Display Qualifier. DSPLY qualification signal. HDQ is HI when DSPLY qualifier requirements are met. |
| HDR | HI, Data Ready. HI state occurs at the end of a data acquisition cycle indicating 16 valid data words have been acquired. |
| HDR* | HI, Data Ready*. Memory Address control signal indicating trigger word has been found and A-memory is loaded with valid data. When HI, HDR* enables reading of memory by display section. |
| HDSPR | HI, Display Reset. Reset signal for display functions. |
| H$\Delta$T | HI, Delta T. Clocking signal for local flip-flop reset gate. H$\Delta$T is derived from PCLK. |
| HE | HI, Equal. Control signal for word intensify circuit. HI when trigger word is being addressed by display section. |
| HEMAP | HI, Equal Map. Blanking control signal in EXP map mode. HEMAP is HI when bits 15, 14, 7, and 6 of the input data word matches the setting on TRIGGER WORD switches. |
| HGD | HI, Good Data. Complement of LGD. Control signal for blanking circuitry. HGD = HDR . $\overline{HRT}$ |
| HGDX | HI, Good Data External. Control signal from Model 1607A. |

-continued

APPENDIX A

| TERM | FUNCTION |
|---|---|
| | HGDX holds off Model 1600A repetitive reset until table B is displayed. |
| HL | HI, Local. Data acquisition control signal. HI = HI when local flip-flop is set. |
| HLTRG | HI, Local Trigger. Trigger Signal (HI state) indicating Model 1600A has met local triggering requirements. |
| HM1-5 | Horizontal Multiplexer 1-5. Output from ROM that sets decoding of horizontal state counter which locates bits on screen for 4-bit/3-bit spacing. |
| HMAP | HI, Map. Complement of LMAP. Control signal for Delay generator, data index and control, reset circuitry, and display multiplexors. HMAP = HI when map display mode is selected. |
| HMR* | HI, Manual Reset*. Manual reset signal for data index and control circuit |
| HMRXT | HI, Manual Reset External. External manual reset pulse to Model 1607A. |
| HNCQ | HI, No Clock or No Qualifier. Partial display mode control. HNCQ = HI when no display qualified clock has occurred for more than approximately 20 ms. |
| HNQL | HI, No Qualifier. NO QUAL indicator light control signal. HNQL = HI when no display qualifier has occurred for more than approximately 100 ms. |
| HNTRG | HI, Ne Trigger, NO TRIG indicator light control signal. HNTRG = HI when no trigger has occurred for more than approximately 100 ms. |
| HOCT | HI, Octal. Table display format control signal (dc level). When HOCT = HI, table is five 3-bit bytes with MSB left over. When HOCT = LO, table format is four 4-bit bytes. HOCT = $\overline{HBCD}$ + $\overline{HBCDX}$ |
| HPOS | HI, Positive. Display control signal (dc level). When HPOS = HI, most-positive logic state is displayed as a "1". When HPOS = LO, most-positive logic state is displayed as a "0". |
| HPTS | HI, Pattern Trigger Stored. Control signal for indicator light logic. When HPTS is HI, NO TRIG light is held off. |
| HRBL | HI, Reset Button Latched. Data index control signal. When HRBL goes HI, HVGT is forced HI. |
| HRECL | HI, Reset Clock. Clocking signal for digital delay and trigger generator during reset function (LRST = LO). |
| HRES | HI, Reset. Reset pulse used in digital delay and trigger generator circuit. HRES is derived from LRST. |
| HR1 | HI, Reset 1. When HI, HR1 indicates that a reset has been requested and will happen on next input clock. |
| HRSTR | HI, Reset Start. Reset control signal. When RESET pushbutton is depressed, HRSTR initiates manual reset. |
| HSA | HI, Select A. Display control signal (dc level). HSA = HI when table A is selected for display. |
| HSB | HI, Select B. Display control signal (dc level). HSB = HI when table B is selected for display. |
| HSSS | HI, Single Sample Start. Complement of LSSS. In table displays, HSSS disables HVGT at instrument turn-on ensuring display on CRT in SINGLE mode. HSSS = HI at instrument turn-on. Once LRST occurs, HSSS remains LO. |
| HSTAB | HI, Store A in B. B-memory control signal. When STORE A-B pushbutton is pressed, contents of A-memory are written into B-memory during display cycle. |
| HSTR | HI, Start. Data acquisition/display control signal (dc level). HSTR = HI when START DSPL is selected or map mode is selected. |
| HSWA | HI, Select Write Address. Address control signal. When HSWA is HI, memory is addressed by write address counter. |
| HTAD | HI, Table A Displayed. Display control signal indicating table A is currently being displayed. |
| HTB | HI, Trigger Bus. Data acquisition control signal (dc level). HTB = HI when SRC LOCAL/BUS switch is set to BUS. When HI, Model 1600A will trigger only when its trigger word and the Model 1607A trigger word are true simultaneously in the trigger bus mode. |
| HTBD | HI, Table B Displayed. Display control signal indicating table B is currently being displayed. |
| HTC | HI, Terminal Count. Data index control signal. HTC = HI when data index counter is at terminal count. |
| HTRG | HI, Trigger. HTRG goes HI when trigger word is found and remains HI until data acquisition section is reset. |
| HTWO | HI, Trigger Word ON. Data acquisition control signal (dc level). HTWO enables TRIGGER WORD switches. HTWO = HI when OFF/WORD switch is set to WORD (in position). |
| HVGT | HI, Vertical Greater Than. Display control signal to blank CRT when display section addresses invalid data in memory. HVGT = HI when vertical state count is greater than data index count. |
| HWE | HI, Write Enable. Data index control signal. HWE = HDQ . HCL . LDR. |
| HXRPR | HI, External Repetitive Reset. External repetitive reset signal to Model 1607A. |
| H0-H3 | Horizontal State Count. Each four-bit word indicates address of a specific bit of current displayed word. |
| LARM | LO, Armed. Control signal trigger generator circuit and indicator and control logic. |

-continued
APPENDIX A

| TERM | FUNCTION |
|---|---|
| | LARM = LO when ARM and HARME are both HI, or when HARME = LO. |
| LA≠B | LO, A not equal to B. Reset control signal in HALT A≠B sample mode. When A-memory contents differ from B-memory contents; LA≠B disables the repetitive reset circuit, locking the Model 1600A in the single sample mode. |
| LCRCL | LO, Circle. Complement of HCRCL. |
| LDQ | LO, Display Qualified. Complement of HDQ. |
| LDR | LO, Data Ready. Control signal used to initiate display cycle. LDR goes LO when data acquisition is complete |
| LDSPR | LO, Display Reset. Display reset signal. |
| LΔT | LO, Delta T. Clocking signal for pattern recognition, data index and control, and memory. LΔT is derived from PCLK. |
| LECMP | LO, Enable Compare. Enable signal for trigger word intensify comparator U86. |
| LEXOR | LO, Exclusive OR. Control signal (dc level). When LEXOR = LO, A memory data is compared with B memory data and bit differences are displayed as intensified one's. |
| LGD | LO, Good Data. Complement of HGD. |
| LHAB | LO, Halt A not equal B. Reset control signal (dc level). LHAB is used to derive LA≠B. |
| LHZ | LO, Horizontal Zero. One/Zero Switch A7U19A control signal. When LHZ = LO; horizontal one/zero switch is turned on, applying 100 kHz sine wave to CRT X-axis. |
| LMAP | LO, Map. Display Control signal (dc level). LMAP = LO when a map display mode is selected. |
| LNARM | LO, No Arm. NO ARM indicator light control signal. LNARM = LO when no arming signal has occurred for more than approximately 100 ms. |
| LNCK | LO, No Clock. NO CLOCK indicator light control signal. LNCK = LO when no clock signal has occurred for more than approximately 100 ms. |
| LNDLY | LO, No Delay. Data acquisition control signal (dc level). LNDLY = LO when DELAY OFF/ON switch is set to OFF. |
| LRHS | LO, Reset HI Start. Start flip-flop reset signal. |
| LRST | LO, Reset. Reset signal for data acquisition section. LRST occurs at end of display cycle. |
| LR2 | LO, Reset 2. Data index and control reset signal. |
| LSS | LO, Single Sample. Reset control signal (dc level). LSS = LO when SGL sample mode is selected. |
| LSSS | LO, Single Sample Start. LSSS disables blanking and display reset at instrument turn-on ensuring display on CRT in single sample mode. LSSS = LO at instrument turn-on. First LRST sets LSSS = HI. |
| LSWA | LO, Select Write Address. Complement of HSWA. |
| LTRG | LO, Trigger. LTRG is inverted and routed to display section to control blanking. |
| LTRQ | LO, Trigger Qualified. Qualifier control signal. When LTRQ = LO, HDQ is held HI. |
| LVTC | LO, Vertical Terminal Count. Display control signal. LVTC indicates vertical state counter is at terminal count. |
| LVZ | LO, Vertical Zero. One/Zero Switch U19B control signal. When LVZ = 0; vertical one/zero switch is turned on, applying 100 kHz sine wave to CRT Y-axis. |
| LWDX | LO, Write Disable External. B-memory control signal from external device n I/O bus. LWDX = LO disables B-memory write function. |
| LWE1 | LO, Write Enable 1. Memory address control signal. LEW1 = LO enables HSWA and LSWA. |
| LWE2 | LO, Write Enable 2. Clock signal for write address counter. |
| LXBNK | LO, External Blanking. Blanking control signal from Model 1607A. LXBNK blanks table B character currently addressed. |
| LXMR | LO, External Manual Reset. External manual reset signal to Model 1607A for data index and control circuitry. |
| LXPG1 | LO, External Plugged 1. External Display control signal from Model 1607A. LXPG1 allows Model 1607A to control reset, table B blanking, and table B format. |
| LXPG2 | LO, External Plugged 2. External B-memory control signal. LXPG2 enables an external device to override B-memory. |
| LXPG3 | LO, External Plugged 3. External B-memory control signal. LXPG3 enables data from an external device to be written into B-memory. |
| LXPMP | LO, Expand Map. Display control signal (dc level). LXPMP = LO when EXP map mode is selected. |
| L1600 | LO, 1600. Control signal to Model 1607A enabling the Model 1600A to exercise control of the Model 1607A display section. |
| L0 | LO, Zero. Blanking control signal indicating vertical state count = 0. LO blanks word 0 in map to prevent false vectors from being displayed. |
| MD0-15 | Map Data Bits 0-15. 16-bit parallel data from A-memory applied to horizontal and vertical decoders. MD0-15 drive the D/A converters in map display modes. |
| NCLK | Negative (Transition) Clock. A buffered TTL reproduction of the clocking signal from the system under test, the complement of PCLK. |
| PCLK | Positive (Transition) Clock. A buffered TTL reproduction of the clocking signal from the system under test. |
| Q0, Q1 | Qualifiers 0 and 1. Input qualifier bits 0 and 1 from data |

-continued

APPENDIX A

| TERM | FUNCTION |
|---|---|
| | probes. |
| SL | Slope Invert. Clock slope command signal to the Clock Probe. The complement of SS. SI = HI when CLOCK is ⎍ (out) and LO when CLOCK is ⎏ (in). |
| SQ0H,SQ1H | Buffered QUALIFIER Q0/Q1 switch outputs for HI position. TERM = +5 V when applicable switch is set to HI and =0 V when set to OFF or LO. |
| SQ0L, SQ1L | Buffered QUALIFIER Q0/Q1 switch outputs for LO position. TERM = +5 V when applicable switch is set to LO and =0 V when set to OFF or HI. |
| SS | Slope Switch. Clock slope command signal to Clock Probe. SS and SI control PCLK and NCLK leading edge transitions in reference to clocking signal from system under test. SS = LO when CLOCK is ⎍ (out) and HI when CLOCK is ⎏ (in). |
| S0H-S15H | Buffered TRIGGER WORD switch outputs for HI position. TERM = +5 V when applicable switch is set to HI and =0 V when set to OFF or LO. |
| S0L-S15L | Buffered TRIGGER WORD switch outputs for LO position. TERM = +5 V when applicable switch is set to LO and =0 V when set to OFF or HI. |
| THRESHOLD | a dc level applied to the Clock and Data Probes which matches probe comparator switching threshold to the switching threshold of the system under test. |
| TQ0, TQ1 $\overline{TQ0}, \overline{TQ1}$ | Temporary storage flip-flop qualifier output bits 0 and 1. Complemented temporary storage flip-flop qualifier output bits 0 and 1. |
| T0-T15 $\overline{T0\text{-}T15}$ | Temporary storage flip-flop output bits 0 through 15. Complemented temporary storage flip-flop output bits 0 through 15. |
| V0-V3 | Vertical State Count. Four-bit address of word currently being displayed. |
| VM0-5 | Vertical Multiplexer 0–5. 6-bit coded data that selects location where words are written on the CRT. This code separates the words into groups of 2 and 4. |
| WA0-WA3 | Write Address Count. WA0-WA3 address memory during write function. |
| XDSPD | External Display Data. Data bit from Model 1607A currently being addressed by XV0-XV3 and XH0-XH3. Signal is routed to Model 1600A via I/O Bus for display on table B. |
| XH0-XH3 | External Horizontal State Count. Bit address from Model 1600A display section routed to Model 1607A. |
| XV0-XV3 | External Vertical State Count. Word address from Model 1600A display section routed to Model 1607A. |
| 1D0-3,2D0 2D3,3D0, 3D3,4D0, 4D3,5D0, 5D3 | Outputs from DELAY switch used to derive HE. Term is XDY where X = decade and Y = bit of 4-bit code. |

We claim:

1. An apparatus for use in the analysis of a digital device, by displaying visual representations of monitored device signals in response to the occurrence of preselected conditions, said apparatus comprising:

threshold circuitry for providing a threshold signal;

input means coupled to said threshold circuitry for monitoring a plurality of device signals within said digital device and for providing a plurality of buffered device signals in response to said device signals and said threshold signal;

timing generator means coupled to the input means for providing at least one timing signal in response to at least one of said buffered device signals;

first storage means coupled to said input means and said timing generator means for storing electrical representations of said buffered device signals in response to at least one of said timing signals;

trigger word means having a plurality of switchable elements for producing a plurality of trigger word signals in response to the setting of said switchable elements;

pattern recognition means coupled to the first storage means, the trigger word means and the timing generator means for producing a first plurality of control signals in response to the electrical representations of said buffered device signals, said plurality of trigger word signals and one or more of said timing signals;

trigger generator means having settable delay means and coupled to the pattern recognition means for providing a trigger signal in response to the setting of the settable delay means and said first plurality of control signals;

memory control means coupled to the timing means and said trigger generator means for providing a memory input control signal in response to said timing signals and said trigger signal;

first memory means coupled to the first storage means and to the trigger generator means for storing electrical representations of said buffered device signals in response to said memory input control signal and for providing a memory output signal in response to said stored electrical representations of said buffered device signals and an output control signal; and display means coupled to said first memory means and having control means for providing said output control signal and having means for providing an X position signal and a Y position signal in response to first and second predetermined portions, respectively, of said memory output signal, said display means causing visual indications to be displayed in positions within an X-Y coordinate display format in response to said X position signal and said Y position signal.

2. Apparatus as in claim 1 wherein said display means further comprises means for providing a cursor at the location of a first display position in response to operator manifestations indicating the X and Y coordinates of said first display position.

3. Apparatus as in claim 2 wherein said visual indications comprise dot-like indications.

4. Apparatus as in claim 2 wherein said display means includes means for causing a pathlike indication to be displayed between said visual indications.

5. Apparatus as in claim 4 wherein said pathlike indication is a bowed line.

6. Apparatus as in claim 4 wherein said pathlike indication is a bowed line having first and second end portions, said first end portion being narrower than said second end portion, thereby indicating the direction of travel between said visual indications.

7. Apparatus as in claim 2 and further comprising means for causing a portion of said visual indications to be displayed on an expanded scale in response to operator manifestations indicating which portion is to be displayed on said expanded scale.

* * * * *

UNITED STATES PATENT AND TRADEMARK OFFICE
CERTIFICATE OF CORRECTION

PATENT NO. : 4,139,903
DATED : February 13, 1979
INVENTOR(S) : Justin S. Morrill Jr., et al It is certified that error appears in the above—identified patent and that said Letters Patent is hereby corrected as shown below:

Column 11, line 68, "For" should read -- Per --.
Column 16, line 44, "permits" should read -- presets --.
Column 17, line 56, "modes" should read -- nodes --.
Column 29, line 22, "Q" should read -- $\bar{Q}$ --.
Column 31, line 51 "go" should read -- go-to --.
Column 32, line 24, "data-acquis-tion" should read -- data-acquisition --.

Column 37, under the term LWDX, "device n" should read -- device on --.

Signed and Sealed this

Eighth Day of January 1980

[SEAL]

Attest:

SIDNEY A. DIAMOND

Attesting Officer    Commissioner of Patents and Trademarks